United States Patent
Jintyou et al.

(10) Patent No.: US 9,876,099 B2
(45) Date of Patent: Jan. 23, 2018

(54) SEMICONDUCTOR DEVICE, DISPLAY DEVICE, INPUT/OUTPUT DEVICE, AND ELECTRONIC DEVICE

(71) Applicant: Semiconductor Energy Laboratory Co., Ltd., Atsugi-shi, Kanagawa-ken (JP)

(72) Inventors: Masami Jintyou, Tochigi (JP);
Toshimitsu Obonai, Tochigi (JP);
Junichi Koezuka, Tochigi (JP);
Suzunosuke Hiraishi, Tochigi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/493,215

(22) Filed: Apr. 21, 2017

(65) Prior Publication Data

US 2017/0222028 A1 Aug. 3, 2017

Related U.S. Application Data

(62) Division of application No. 14/741,840, filed on Jun. 17, 2015, now Pat. No. 9,634,031.

(30) Foreign Application Priority Data

Jun. 20, 2014 (JP) ................. 2014-127430
Apr. 16, 2015 (JP) ................. 2015-084409

(51) Int. Cl.
*H01L 21/00* (2006.01)
*H01L 29/66* (2006.01)
(Continued)

(52) U.S. Cl.
CPC ...... *H01L 29/66969* (2013.01); *H01L 21/385* (2013.01); *H01L 21/441* (2013.01);
(Continued)

(58) Field of Classification Search
CPC ......... H01L 27/12; H01L 51/56; H01L 27/32; H01L 29/66; H01L 29/423; H01L 29/786
(Continued)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Caleb Henry
(74) *Attorney, Agent, or Firm* — Fish & Richardson P.C.

(57) ABSTRACT

To suppress change in electric characteristics and improve reliability of a semiconductor device including a transistor formed using an oxide semiconductor. A semiconductor device includes a transistor including a gate electrode, a first insulating film, an oxide semiconductor film, a second insulating film, and a pair of electrodes. The gate electrode and the oxide semiconductor film overlap with each other. The oxide semiconductor film is located between the first insulating film and the second insulating film and in contact with the pair of electrodes. The first insulating film is located between the gate electrode and the oxide semiconductor film. An etching rate of a region of at least one of the first insulating film and the second insulating film is higher than (Continued)

8 nm/min when etching is performed using a hydrofluoric acid.

16 Claims, 31 Drawing Sheets

(51) Int. Cl.
    *H01L 29/786*     (2006.01)
    *H01L 21/441*     (2006.01)
    *H01L 21/4757*     (2006.01)
    *H01L 21/385*     (2006.01)

(52) U.S. Cl.
    CPC .... *H01L 21/47573* (2013.01); *H01L 29/7869* (2013.01); *H01L 29/78606* (2013.01)

(58) Field of Classification Search
    USPC .......................... 257/40, 43; 438/30, 46, 104
    See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Lwasakit |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,530,289 B2 | 9/2013 | Yamazaki |
| 8,828,811 B2 | 9/2014 | Yamazaki |
| 8,865,534 B2 | 10/2014 | Yamazaki |
| 8,901,556 B2 | 12/2014 | Okazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0013280 A1 | 1/2003 | Yamanaka |
| 2003/0089991 A1 | 5/2003 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0241924 A1 | 12/2004 | Chen et al. |
| 2004/0256980 A1 | 12/2004 | Tsuchiya |
| 2005/0017302 A1 | 1/2005 | Hoffman |
| 2005/0199959 A1 | 9/2005 | Chiang et al. |
| 2005/0202601 A1 | 9/2005 | Koide |
| 2005/0263767 A1 | 12/2005 | Yamazaki et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0163678 A1 | 7/2006 | Anezaki |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0290393 A1 | 11/2008 | Kakehata et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0184326 A1 | 7/2009 | Lee et al. |
| 2009/0278122 A1 | 11/2009 | Hosono et al. |
| 2009/0280600 A1 | 11/2009 | Hosono et al. |
| 2010/0062578 A1 | 3/2010 | Vvilhelmd |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0003418 A1* | 1/2011 | Sakata ............... H01L 21/02554 438/34 |
| 2011/0037068 A1* | 2/2011 | Yamazaki ........... H01L 27/1225 257/43 |
| 2011/0057186 A1* | 3/2011 | Yamazaki ........... H01L 27/1225 257/43 |
| 2011/0114942 A1 | 5/2011 | Akimoto et al. |
| 2011/0180802 A1 | 7/2011 | Morosawa et al. |
| 2011/0193846 A1 | 8/2011 | Kimura et al. |
| 2011/0227060 A1* | 9/2011 | Miyanaga ........... H01L 29/7869 257/43 |
| 2011/0227139 A1 | 9/2011 | Kakehata et al. |
| 2011/0260171 A1 | 10/2011 | Yamazaki |
| 2011/0263082 A1 | 10/2011 | Yamazaki |
| 2011/0263084 A1 | 10/2011 | Yamazaki |
| 2011/0269266 A1 | 11/2011 | Yamazaki |
| 2011/0303913 A1 | 12/2011 | Yamazaki et al. |
| 2011/0309456 A1 | 12/2011 | Yamazaki |
| 2012/0061663 A1 | 3/2012 | Yamazaki et al. |
| 2012/0223306 A1 | 9/2012 | Saito et al. |
| 2013/0037799 A1* | 2/2013 | Sakata ............... H01L 21/02554 257/43 |

(56) References Cited

U.S. PATENT DOCUMENTS

| | | | |
|---|---|---|---|
| 2013/0082252 A1* | 4/2013 | Yamazaki | H01L 29/66969 257/43 |
| 2013/0264563 A1 | 10/2013 | Okazaki et al. | |
| 2013/0270549 A1 | 10/2013 | Okazaki et al. | |
| 2015/0072535 A1 | 3/2015 | Okazaki et al. | |
| 2015/0249157 A1 | 9/2015 | Yamazaki et al. | |
| 2015/0249160 A1 | 9/2015 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., 21.2:Al and Sn-Doped Zinc Indium Oxide Thin Film Transistors for AMOLED Back-Plane, SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch Mga Amoled Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IgZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a $Zn4s$ conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191- 194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GiZo ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IgZo Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

※Total amount of $O_2, N_2, NO, N_2O$, and $O_2$
Horizontal axis represents amount of released gas of sample A1~A8,
and the vertical axis represents amount of released O2 of sample B1~B8

Sample E1

Sample E2

Sample E3

SEMICONDUCTOR DEVICE, DISPLAY DEVICE, INPUT/OUTPUT DEVICE, AND ELECTRONIC DEVICE

CROSS-REFERENCE TO RELATED APPLICATIONS

This application is a divisional of U.S. application Ser. No. 14/741,840, filed Jun. 17, 2015, now allowed, which claims the benefit of foreign priority applications filed in Japan as Serial No. 2014-127430 on Jun. 20, 2014, and Serial No. 2015-084409 on Apr. 16, 2015, all of which are incorporated by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, an imaging device, a memory device, a driving method thereof, or a manufacturing method thereof. Furthermore, in particular, one embodiment of the present invention relates to a semiconductor device including a field-effect transistor.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a technique is disclosed in which a transistor is manufactured using zinc oxide or an In—Ga—Zn oxide as an oxide semiconductor and the transistor is used as a switching element or the like of a pixel of a display device (see Patent Documents 1 and 2).

REFERENCES

Patent Documents

[Patent Document 1] Japanese Published Patent Application No. 2007-123861
[Patent Document 2] Japanese Published Patent Application No. 2007-096055

SUMMARY OF THE INVENTION

In a transistor using an oxide semiconductor film, oxygen vacancies in the oxide semiconductor film cause defects of electrical characteristics of the transistor. For example, in a transistor formed using an oxide semiconductor film including oxygen vacancies, the threshold voltage easily shifts in the negative direction, and such a transistor tends to be normally-on. This is because electric charges are generated owing to oxygen vacancies in the oxide semiconductor film, and the resistance is reduced.

Further, when an oxide semiconductor film includes oxygen vacancies, there is a problem in that the amount of change in electrical characteristics, typically change of the threshold voltage of the transistor is increased due to change over time or a bias-temperature stress test (hereinafter also referred to as a BT stress test).

An object of one embodiment of the present invention is to suppress a change in electrical characteristics and to improve reliability in a semiconductor device using a transistor including an oxide semiconductor. Another object of one embodiment of the present invention is to provide a semiconductor device with low power consumption. Another object of one embodiment of the present invention is to provide a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a transistor. The transistor includes a gate electrode, a first insulating film, an oxide semiconductor film, a second insulating film, and a pair of electrodes. The gate electrode and the oxide semiconductor film overlap with each other. The oxide semiconductor film is located between the first insulating film and the second insulating film. The oxide semiconductor film is in contact with the pair of electrodes. The first insulating film is located between the gate electrode and the oxide semiconductor film. Silicon and oxygen are contained in at least one of the first insulating film and the second insulating film. An etching rate of a region of at least one of the first insulating film and the second insulating film is higher than 8 nm/min when etching is performed using a hydrofluoric acid. Note that the temperature and the concentration of the hydrofluoric acid may be 24° C. and 0.5 wt/vol %, respectively☐

Note that the transistor has a bottom-gate structure and the gate electrode is located between an insulating surface and the oxide semiconductor film. The transistor may include a first film located between the first insulating film and the oxide semiconductor film.

Furthermore, the transistor has a bottom-gate structure and the second insulating film may be in contact with a second film and located between the oxide semiconductor film and the second film.

Alternatively, the transistor has a top-gate structure, and the oxide semiconductor film is located between an insulating surface and the gate electrode. The transistor may include a third film located between the first insulating film and the gate electrode.

Furthermore, the transistor has a top-gate structure, and the oxide semiconductor film is located between an insulating surface and the gate electrode. The second insulating film may be in contact with a fourth film located between the second insulating film and the oxide semiconductor film.

The first to fourth films may include oxygen and at least one of indium, zinc, titanium, aluminum, tungsten, tantalum, and molybdenum.

One embodiment of the present invention is a semiconductor device including a transistor. The transistor includes a first gate electrode, a first insulating film, an oxide semiconductor film, a second insulating film, a second gate electrode, and a pair of electrodes. The first gate electrode and the oxide semiconductor film overlap with each other. The second gate electrode and the oxide semiconductor film overlap with each other. The first insulating film is located between the first gate electrode and the oxide semiconductor film. The second insulating film is located between the second gate electrode and the oxide semiconductor film. The oxide semiconductor film is in contact with the pair of electrodes. Silicon and oxygen are contained in at least one of the first insulating film and the second insulating film. An etching rate of a region of at least one of the first insulating film and the second insulating film is higher than 8 nm/min when etching is performed using a hydrofluoric acid. Note that the temperature and the concentration of the hydrofluoric acid may be 24° C. and 0.5 wt/vol %, respectively☐

Note that a fifth film may be located between the first insulating film and the oxide semiconductor film. A sixth film may be located between the second insulating film and the second gate electrode.

The fifth film and the sixth film may include oxygen and at least one of indium, zinc, titanium, aluminum, tungsten, tantalum, and molybdenum.

With one embodiment of the present invention, a change in electrical characteristics of a transistor including an oxide semiconductor film is suppressed and reliability can be improved. Alternatively, in accordance with one embodiment of the present invention, a highly reliable semiconductor device can be provided. Further, in accordance with one embodiment of the present invention, a novel semiconductor device or the like can be provided. Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
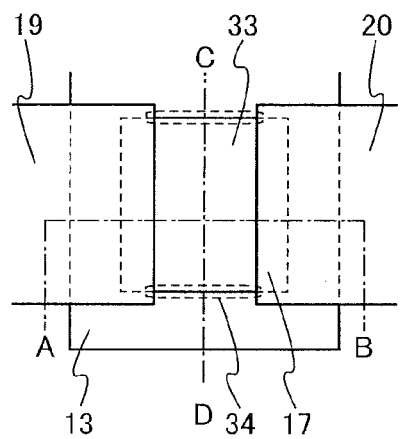
FIGS. 1A to 1F are a top view and cross-sectional views illustrating one embodiment of a transistor.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof is not repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Note that a transistor including an oxide semiconductor film is an n-channel transistor; therefore, in this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics.

Note that the channel length refers to, for example, a distance between a source (source region or source electrode) and a drain (drain region or drain electrode) in a region where an oxide semiconductor film (or a portion where a current flows in an oxide semiconductor film when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where an oxide semiconductor film (or a portion where a current flows in an oxide semiconductor film when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of an oxide semiconductor film is higher than the proportion of a channel region formed in a top surface of the oxide semiconductor film in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of an oxide semiconductor film is known. Therefore, in the case where the shape of an oxide semiconductor film is not known accurately, it is difficult to measure an effective channel width accurately.

Therefore, in this specification, in a top view of a transistor, an apparent channel width that is a length of a portion where a source and a drain face each other in a region where an oxide semiconductor film and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Embodiment 1

In this embodiment, a semiconductor device of one embodiment of the present invention and a method for manufacturing the semiconductor device will be described with reference to drawings. Transistors described in this embodiment have a bottom-gate structure.

<1. Structure of Transistor>

Figure 1B:
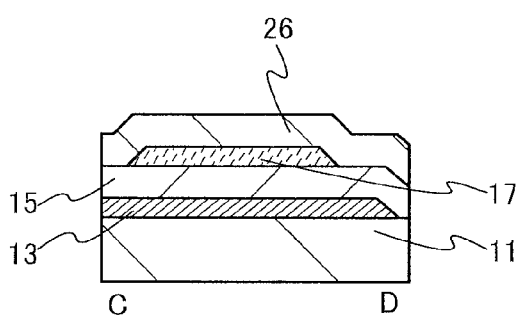
Figure 1C:
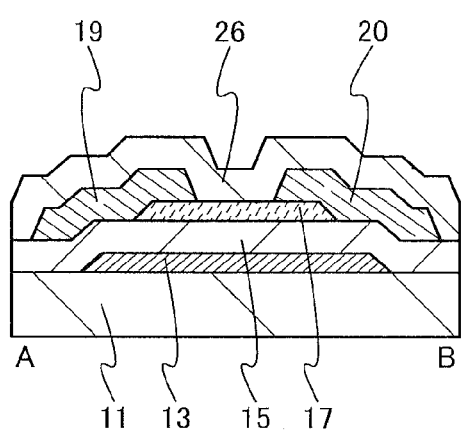
Figure 1D:
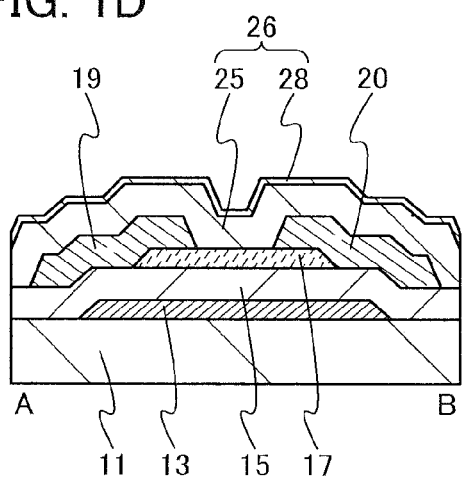
Figure 1E:
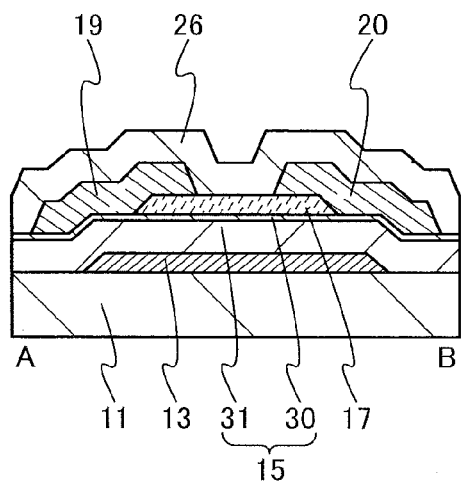
Figure 1F:
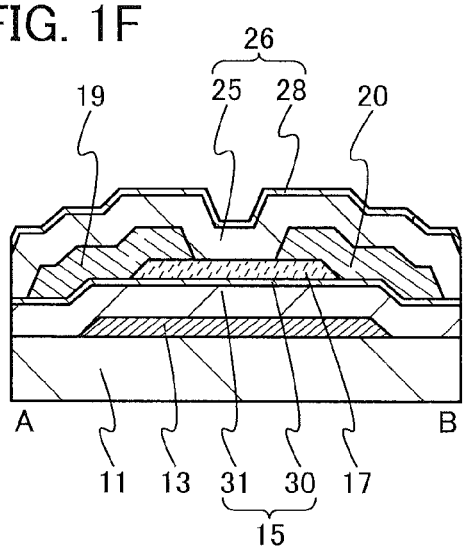

FIGS. 1A to 1F are a top view and cross-sectional views of transistors included in semiconductor devices. FIG. 1A is a top view of a transistor, FIG. 1B is a cross-sectional view taken along dashed-dotted line C-D in FIG. 1A, and FIG. 1C is a cross-sectional view taken along dashed-dotted line A-B in FIG. 1A. FIGS. 1D to 1F are modification examples of FIG. 1C. Note that in this specification, a substrate, an insulating film, a protective film, and the like are omitted in top views for simplicity.

The transistor illustrated in FIGS. 1A to 1C is a channel-etched transistor. The transistor includes a gate electrode 13 over a substrate 11, a gate insulating film 15 over the substrate 11 and the gate electrode 13, an oxide semiconductor film 17 overlapping with the gate electrode 13 with the gate insulating film 15 provided therebetween, and a pair of electrodes 19 and 20 in contact with the oxide semiconductor film 17. A protective film 26 is formed over the gate insulating film 15, the oxide semiconductor film 17, and the pair of electrodes 19 and 20.

The protective film 26 is in contact with a surface of the oxide semiconductor film 17 that is an opposite side of a surface in contact with the gate insulating film 15. In other words, the protective film 26 has a function of protecting a region (hereinafter referred to as a back channel region) of the oxide semiconductor film 17 that is on the opposite side of a region where a channel is formed.

In this embodiment, the film in contact with the oxide semiconductor film 17, typically at least one of the gate insulating film 15 and the protective film 26, includes an oxide insulating film. The etching rate of the oxide insulating film is higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. In other words, at least one of the gate insulating film 15 and the protective film 26 includes an oxide insulating film to which oxygen is added. In other words, at least one of the gate insulating film 15 and the protective film 26 includes an oxide insulating film containing more oxygen than that in the stoichiometric composition. In other words, at least one of the gate insulating film 15 and the protective film 26 is an oxide insulating film which releases oxygen by heat treatment. It is desirable that the amount of oxygen released from the oxide insulating film by heat treatment be greater than $1\times10^{15}$ molecules/cm$^2$, preferably greater than $4\times10^{16}$ molecules/cm$^2$, preferably greater than $5\times10^{16}$ molecules/cm$^2$, preferably greater than or equal to $6\times10^{16}$ molecules/cm$^2$ in thermal desorption spectroscopy (TDS) analysis. Note that the temperature of the film surface in the TDS analysis is preferably higher than or equal to 50° C. and lower than or equal to 700° C., or higher than or equal to 50° C. and lower than or equal to 500° C.

Note that although the concentration of the hydrofluoric acid used for the etching is 0.5 wt/vol %□□ one embodiment of the present invention is not limited thereto.□□ For example, the concentration of the hydrofluoric acid may be higher than or equal to 0.4 wt/vol % and lower than or equal to 0.6 wt/vol %, preferably higher than or equal to 0.45 wt/vol % and lower than or equal to 0.55 wt/vol %□□□ Furthermore, the etching rate of the oxide insulating film is preferably an etching rate when heat treatment is performed on the oxide insulating film at 350° C. or lower or when heat treatment is not performed.

The hollower the oxide insulating film is, the more easily oxygen is added to the oxide insulating film. The oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. is hollower than a film which is etched at an etching rate lower than the etching rate. Therefore, oxygen is easily added to the oxide insulating film. Oxygen added to the film is easily released by heating because a bond between the oxygen and another atom in the film is weak. In view of this, the oxide insulating film to which oxygen is easily added, i.e., the oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. is used as at least one of the gate insulating film 15 and the protective film 26 of the transistor, and heat treatment is performed, whereby oxygen contained in the oxide insulating film can be transferred to the oxide semiconductor film. Furthermore, the amount of oxygen vacancies in the oxide semiconductor film can be reduced. As a result, the transistor including the oxide semiconductor film can have highly reliable electrical characteristics.

As a method for adding oxygen to the oxide insulating film, a method in which oxygen is directly added to the oxide insulating film or a method in which oxygen is added to the oxide insulating film through a film (e.g., a film containing a metal element) formed over the oxide insulating film is employed.

When oxygen is added to the oxide insulating film through the film (e.g., the film containing a metal element), oxygen is also added to the film (e.g., the film containing a metal element), whereby a metal oxide film is formed. The metal oxide film may be removed. Alternatively, the metal oxide film may be left in the case where the metal oxide film is an insulating film. FIGS. 1D to 1F are cross-sectional views of transistors each including the metal oxide film.

In the transistor shown in FIG. 1D, the protective film 26 is provided over the oxide semiconductor film 17 and the pair of electrodes 19 and 20. The protective film 26 includes an oxide insulating film 25 and a metal oxide film 28. The oxide insulating film 25 and the metal oxide film 28 are stacked in this order. Note that the oxide insulating film 25 is formed using the oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. In other words, the oxide insulating film 25 is an oxide insulating film to which oxygen is added. In other words, the oxide insulating film 25 is an oxide insulating film which contains more oxygen than that in the stoichiometric composition. In other words, the oxide insulating film 25 is an oxide insulating film which releases oxygen by heat treatment.

In the transistor shown in FIG. 1E, the gate insulating film 15 includes an oxide insulating film 31 and a metal oxide film 30. The oxide insulating film 31 and the metal oxide film 30 are stacked in this order. The oxide insulating film 31 is an oxide insulating film similar to the oxide insulating film 25.

In the transistor shown in FIG. 1F, the gate insulating film 15 includes the oxide insulating film 31 and the metal oxide film 30. The oxide insulating film 31 and the metal oxide film 30 are stacked in this order. The protective film 26 includes the oxide insulating film 25 and the metal oxide film 28. The oxide insulating film 25 and the metal oxide film 28 are stacked in this order.

The metal oxide films 28 and 30 include oxygen and at least one of indium, zinc, titanium, aluminum, tungsten, tantalum, and molybdenum. The metal oxide films 28 and 30 can be formed using, for example, a tantalum oxide film, a titanium oxide film, an indium tin oxide (hereinafter referred to as ITO) film, an aluminum oxide film, or an oxide semiconductor film such as an In—Ga—Zn oxide film (hereinafter also referred to as an IGZO film) having an atomic ratio of, for example, In:Ga:Zn=1:4:5.

The metal oxide films 28 and 30 have a function of suppressing the release of oxygen from the oxide insulating films 25 and 31. Therefore, a larger amount of oxygen can be added to the oxide insulating films 25 and 31 and the oxide semiconductor film 17.

Other details of the transistor are described below.

There is no particular limitation on the property of a material and the like of the substrate 11 as long as the material has heat resistance enough to withstand at least later heat treatment. A variety of substrates can be used as the substrate 11 to form a transistor, for example. The type of the substrate is not limited to a certain type. As the substrate, a semiconductor substrate (e.g., a single crystal substrate or a silicon substrate), an SOI (Silicon on Insulator) substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, paper, and the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

A flexible substrate may be used as the substrate 11, and the transistor may be provided directly on the flexible substrate. Alternatively, a separation layer may be provided between the substrate 11 and the transistor. The separation layer can be used when part or the whole of a semiconductor device formed over the separation layer is separated from the substrate 11 and transferred onto another substrate. In such a case, the transistor can be transferred to a substrate having low heat resistance or a flexible substrate as well. For the above separation layer, a stack including inorganic films such as a tungsten film and a silicon oxide film, or an organic resin film of polyimide or the like formed over a substrate can be used, for example.

Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability, high heat resistance can be provided, or reduction in weight or thickness can be achieved.

A base insulating film may be provided between the substrate 11 and the gate electrode 13. As the base insulating film, a silicon oxide film, a silicon oxynitride film, a silicon nitride film, a silicon nitride oxide film, a gallium oxide film, a hafnium oxide film, an yttrium oxide film, an aluminum oxide film, an aluminum oxynitride film, and the like can be given as examples. Note that when a silicon nitride film, a gallium oxide film, a hafnium oxide film, an yttrium oxide film, an aluminum oxide film, or the like is used as the base insulating film, it is possible to suppress diffusion of impurities such as alkali metal, water, and hydrogen from the substrate 11 into the oxide semiconductor film 17. Note that a "silicon oxynitride film" or an "aluminum oxynitride film" refers to a film that contains more oxygen than nitrogen, and a "silicon nitride oxide film" or an "aluminum nitride oxide film" refers to a film that contains more nitrogen than oxygen.

The gate electrode 13 can be formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Further, one or more metal elements selected from manganese and zirconium may be used. The gate electrode 13 may have a single-layer structure or a layered structure of two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

The gate electrode 13 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a layered structure formed using the above light-transmitting conductive material and the above metal element.

In the case where the protective film 26 is formed using an oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C., the gate insulating film 15 is formed with a single-layer structure or a stacked-layer structure using, for example, silicon oxide, silicon oxynitride, silicon nitride oxide, silicon nitride, aluminum oxide, hafnium oxide, gallium oxide, a Ga—Zn oxide, or the like. Note that the oxide insulating film is preferably used for at least a region of the gate insulating film 15 which is in contact with the oxide semiconductor film 17 in order to improve characteristics of the interface with the oxide semiconductor film 17.

Furthermore, it is possible to prevent outward diffusion of oxygen from the oxide semiconductor film 17 and entry of hydrogen, water, or the like into the oxide semiconductor film 17 from the outside by providing an insulating film having an effect of blocking oxygen, hydrogen, water, and the like as the gate insulating film 15. The insulating film having an effect of blocking oxygen, hydrogen, water, and the like is formed using aluminum oxide, aluminum oxynitride, gallium oxide, gallium oxynitride, yttrium oxide, yttrium oxynitride, hafnium oxide, hafnium oxynitride, or the like.

The gate insulating film 15 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 15 is greater than or equal to 5 nm and less than or equal to 400 nm, more preferably greater than or equal to 10 nm and less than or equal to 300 nm, more preferably greater than or equal to 50 nm and less than or equal to 250 nm.

The oxide semiconductor film 17 is formed using a metal oxide film containing at least In or Zn; as a typical example, an In—Ga oxide film, an In—Zn oxide film, or an In-M-Zn oxide film (M is Al, Ga, Y, Zr, La, Ce, or Nd) can be given.

Note that in the case where the oxide semiconductor film 17 is an In-M-Zn oxide film, the proportions of In and M when the summation of In and M is assumed to be 100 atomic % are preferably as follows: the proportion of In is greater than or equal to 25 atomic % and the proportion of M is less than 75 atomic %, or further preferably, the proportion of In is greater than or equal to 34 atomic % and the proportion of M is less than 66 atomic %.

The energy gap of the oxide semiconductor film 17 is 2 eV or more, preferably 2.5 eV or more, further preferably 3 eV or more. The use of such an oxide semiconductor having a wide energy gap reduces the off-state current of the transistor.

The thickness of the oxide semiconductor film 17 is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 17 is the In-M-Zn oxide film (M represents Al, Ga, Y, Zr, La, Ce, or Nd), it is preferable that the atomic ratio of metal elements included in a sputtering target used for forming the In-M-Zn oxide film satisfy In≥M and Zn≥M. As the atomic ratio of metal elements of such a sputtering target, In:M:Zn=1:1:1, In:M:Zn=1:1:1.2, In:M:Zn=3:1:2, and In:M:Zn=4:2:4.1 are preferable. Note that the atomic ratios of metal elements in the formed oxide semiconductor film 17 vary from the above atomic ratio of metal elements of the sputtering target within a range of ±40% as an error.

Hydrogen contained in the oxide semiconductor film reacts with oxygen bonded to a metal atom to be water, and also causes oxygen vacancies in a lattice from which oxygen is released (or a portion from which oxygen is released). Due to entry of hydrogen into the oxygen vacancy, an electron serving as a carrier is generated. Further, in some cases, bonding of part of hydrogen to oxygen bonded to a metal element causes generation of an electron serving as a carrier. Thus, a transistor including an oxide semiconductor film which contains hydrogen is likely to be normally on.

Accordingly, it is preferable that hydrogen be reduced as much as possible as well as the oxygen vacancies in the oxide semiconductor film 17. Specifically, in the oxide semiconductor film 17, the concentration of hydrogen which is measured by secondary ion mass spectrometry (SIMS) is set to lower than or equal to $5\times10^{19}$ atoms/cm$^3$, preferably lower than or equal to $1\times10^{19}$ atoms/cm$^3$, preferably lower than or equal to $5\times10^{18}$ atoms/cm$^3$, preferably lower than or equal to $1\times10^{18}$ atoms/cm$^3$, more preferably lower than or equal to $5\times10^{17}$ atoms/cm$^3$, still more preferably lower than or equal to $1\times10^{16}$ atoms/cm$^3$. As a result, the transistor has positive threshold voltage (normally-off characteristics).

When silicon or carbon that is one of elements belonging to Group 14 is contained in the oxide semiconductor film 17, oxygen vacancies are increased in the oxide semiconductor film 17, and the oxide semiconductor film 17 becomes an n-type film. Thus, the concentration of silicon or carbon (the concentration is measured by SIMS) of the oxide semiconductor film 17 is lower than or equal to $2\times10^{18}$ atoms/cm$^3$, preferably lower than or equal to $2\times10^{17}$ atoms/cm$^3$. As a result, the transistor has positive threshold voltage (normally-off characteristics).

Further, the concentration of alkali metal or alkaline earth metal of the oxide semiconductor film 17, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film 17. As a result, the transistor has positive threshold voltage (normally-off characteristics).

Furthermore, when containing nitrogen, the oxide semiconductor film 17 easily becomes an n-type film by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

When impurities in the oxide semiconductor film 17 are reduced, the carrier density of the oxide semiconductor film 17 can be lowered. The oxide semiconductor film 17 preferably has a carrier density of $1\times10^{17}$/cm$^3$ or less, more preferably $1\times10^{15}$/cm$^3$ or less, still more preferably $1\times10^{13}$/cm$^3$ or less, yet more preferably $1\times10^{11}$/cm$^3$ or less.

Note that it is preferable to use, as the oxide semiconductor film 17, an oxide semiconductor film in which the impurity concentration is low and density of defect states is low, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has few carrier traps in some cases. Further, the transistor in which the channel region is formed in a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small change in electrical characteristics and high reliability in some cases.

The oxide semiconductor film 17 may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

Note that the oxide semiconductor film 17 may be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure in which, for example, two or more of a region having an amorphous structure, a region having a microcrystalline structure, a region having a polycrystalline structure, a CAAC-OS region, and a region having a single-crystal structure are stacked in some cases.

The pair of electrodes 19 and 20 is formed to have a single-layer structure or a stacked-layer structure using any of metals such as aluminum, titanium, chromium, nickel, copper, yttrium, zirconium, molybdenum, iron, cobalt, silver, tantalum, and tungsten and an alloy containing any of these metals as a main component. For example, a single-layer structure of an aluminum film containing silicon; a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a two-layer structure in which a copper film is stacked over a copper film containing manganese; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a copper film containing manganese, a copper film, and a copper film containing manganese are stacked in this order; and the like can be given. Note that a transparent conductive material containing indium oxide, tin oxide, or zinc oxide may be used.

Note that although the pair of electrodes 19 and 20 is provided between the oxide semiconductor film 17 and the protective film 26 in this embodiment, the pair of electrodes 19 and 20 may be provided between the gate insulating film 15 and the oxide semiconductor film 17.

In the case where the gate insulating film 15 is formed using the oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C., the protective film 26 can be formed using silicon oxide, silicon oxynitride, a Ga—Zn oxide, or the like.

Further, it is possible to prevent outward diffusion of oxygen from the oxide semiconductor film 17 and entry of hydrogen, water, or the like into the oxide semiconductor film 17 from the outside by providing an insulating film having an effect of blocking oxygen, hydrogen, water, and the like as the protective film 26. As the insulating film having an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The protective film 26 includes a region with a thickness greater than or equal to 50 nm and less than or equal to 1000 nm, preferably greater than or equal to 150 nm and less than or equal to 400 nm.

<2. Method for Manufacturing Transistor>

Next, a method for manufacturing the transistor in FIGS. 1A to 1F is described with reference to FIGS. 2A to 2E. A cross-section in the channel length direction along dot-dashed line A-B in FIG. 1A and a cross-section in the channel width direction along dot-dashed line C-D in FIG. 1A are used in FIGS. 2A to 2E to describe the method for manufacturing the transistor.

The films included in the transistor (i.e., the insulating film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust a thickness and thus is suitable for manufacturing a minute FET.

Figure 2A:
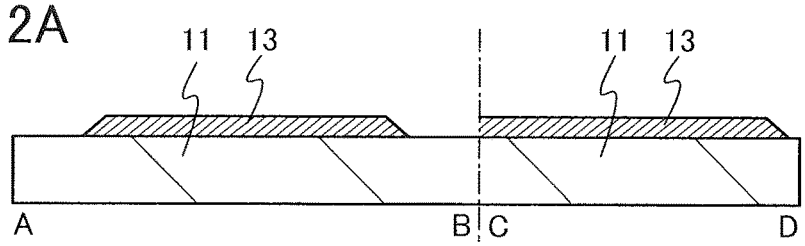
FIGS. 2A to 2E are cross-sectional views illustrating one embodiment of a method for manufacturing a transistor.

As illustrated in FIG. 2A, the gate electrode 13 is formed over the substrate 11.

A formation method of the gate electrode 13 is described below. First, a conductive film is formed by a sputtering method, a vacuum evaporation method, a pulsed laser deposition (PLD) method, a thermal CVD method, or the like and then a mask is formed over the conductive film by a photolithography process. Next, the conductive film is partly etched using the mask to form the gate electrode 13. After that, the mask is removed.

Note that the gate electrode 13 may be formed by an electrolytic plating method, a printing method, an ink-jet method, or the like instead of the above formation method.

Alternatively, a tungsten film can be formed as the conductive film with a deposition apparatus employing ALD. In that case, a $WF_6$ gas and a $B_2H_6$ gas are sequentially introduced more than once to form an initial tungsten film, and then a $WF_6$ gas and an $H_2$ gas are sequentially introduced, so that a tungsten film is formed. Note that a $SiH_4$ gas may be used instead of a $B_2H_6$ gas.

Here, a 100-nm-thick tungsten film is formed by a sputtering method. Next, a mask is formed by a photolithography process, and the tungsten film is subjected to dry etching with the use of the mask to form the gate electrode 13.

Then, the gate insulating film 15 is formed over the substrate 11 and the gate electrode 13, and the oxide semiconductor film 17 is formed in a region that is over the gate insulating film 15 and overlaps with the gate electrode 13.

The gate insulating film 15 is formed by a sputtering method, a CVD method, a vacuum evaporation method, a pulsed laser deposition (PLD) method, a thermal CVD method, or the like.

In the case of forming a silicon oxide film or a silicon oxynitride film as the gate insulating film 15, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case where a gallium oxide film is formed as the gate insulating film 15, an MOCVD method can be used.

In the case where a hafnium oxide film is formed as the gate insulating film 15 by a thermal CVD method such as an MOCVD method or an ALD method, two kinds of gases are used: ozone ($O_3$) as an oxidizer and a source gas which is obtained by vaporizing a liquid containing a solvent and a hafnium precursor compound (a hafnium alkoxide solution or a hafnium amide such as tetrakis(dimethylamide)hafnium (TDMAH)). Note that the chemical formula of tetrakis (dimethylamide)hafnium is $Hf[N(CH_3)_2]_4$. Examples of another material liquid include tetrakis(ethylmethylamide) hafnium.

In the case where an aluminum oxide film is formed as the gate insulating film 15 by a thermal CVD method such as an MOCVD method or an ALD method, two kinds of gases, i.e., $H_2O$ as an oxidizer and a source material gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

Furthermore, in the case where a silicon oxide film is formed as the gate insulating film 15 by a thermal CVD method such as an MOCVD method or an ALD method, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

Here, a silicon oxynitride film is formed as the gate insulating film 15 by a plasma CVD method.

Figure 2B:
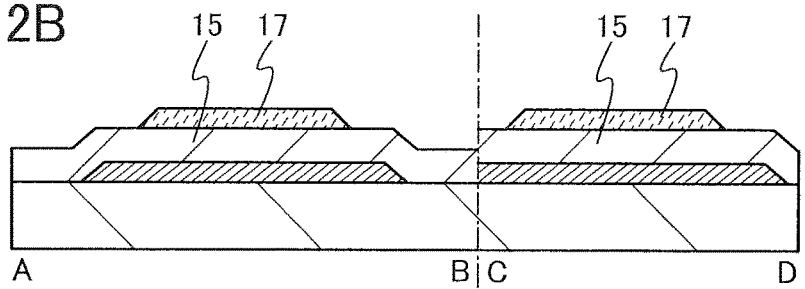

A formation method of the oxide semiconductor film 17 is described below. An oxide semiconductor film is formed over the gate insulating film 15 by a sputtering method, a coating method, a pulsed laser deposition method, a laser ablation method, a thermal CVD method, or the like. Then, after a mask is formed over the oxide semiconductor film by a photolithography process, the oxide semiconductor film is partly etched using the mask. Accordingly, the oxide semiconductor film 17 that is over the gate insulating film 15 and subjected to element isolation so as to partly overlap with the gate electrode 13 is formed as illustrated in FIG. 2B. After that, the mask is removed.

Alternatively, by using a printing method for forming the oxide semiconductor film 17, the oxide semiconductor film 17 subjected to element isolation can be formed directly.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon), an oxygen gas, or a mixed gas of a rare gas and an oxygen gas is used as appropriate. In the case of the mixed gas of a rare gas and an oxygen gas, the proportion of oxygen to a rare gas is preferably increased.

Further, a target may be appropriately selected in accordance with the composition of the oxide semiconductor film to be formed. Note that a CAAC-OS film and a microcrystalline oxide semiconductor film can be formed using a target including an In—Ga—Zn oxide, preferably a polycrystalline target including an In—Ga—Zn oxide.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 350° C., a CAAC-OS film can be formed.

For the deposition of the CAAC-OS film, the following conditions are preferably used.

By suppressing entry of impurities into the CAAC-OS film during the deposition, the crystal state can be prevented from being broken by the impurities. For example, the concentration of impurities (the concentration of hydrogen, water, carbon dioxide, nitrogen, or the like) that exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is possible and preferable to reduce plasma damage at the deposition by increasing the proportion of oxygen in the deposition gas and optimizing the power. The proportion of oxygen in the deposition gas is higher than or equal to 30 vol %, preferably 100 vol %.

After the oxide semiconductor film is formed, dehydrogenation or dehydration may be performed by heat treatment. The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration in the oxide semiconductor film can be $5 \times 10^{19}$ atoms/cm$^3$ or lower, preferably $1 \times 10^{19}$ atoms/cm$^3$ or lower, preferably lower than $5 \times 10^{18}$ atoms/cm$^3$, preferably $1 \times 10^{18}$ atoms/cm$^3$ or lower, more preferably $5 \times 10^{17}$ atoms/cm$^3$ or lower, still more preferably $1 \times 10^{16}$ atoms/cm$^3$ or lower.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced two or more times to form an InO$_2$ layer, a Ga(CH$_3$)$_3$ gas and an O$_3$ gas are sequentially introduced two or more times to form a GaO layer, and then a Zn(CH$_3$)$_2$ gas and an O$_3$ gas are sequentially introduced two or more times to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ may be used. Instead of a Ga(CH$_3$)$_3$ gas, a Ga(C$_2$H$_5$)$_3$ gas may be used. Furthermore, a Zn(CH$_3$)$_2$ gas may be used.

Here, a 35-nm-thick oxide semiconductor film is formed by a sputtering method, a mask is formed over the oxide semiconductor film, and then part of the oxide semiconductor film is selectively etched. Then, after the mask is removed, heat treatment is performed in a mixed atmosphere containing nitrogen and oxygen, whereby the oxide semiconductor film 17 is formed.

When the heat treatment is performed at a temperature higher than 350° C. and lower than or equal to 650° C., preferably higher than or equal to 450° C. and lower than or equal to 600° C., it is possible to obtain an oxide semiconductor film whose proportion of CAAC, which is described later, is greater than or equal to 70% and less than 100%, preferably greater than or equal to 80% and less than 100%, preferably greater than or equal to 90% and less than 100%, more preferably greater than or equal to 95% and less than or equal to 98%. Furthermore, it is possible to obtain an oxide semiconductor film having a low content of hydrogen, water, and the like. This means that an oxide semiconductor film with a low impurity concentration and a low density of defect states can be formed. Note that the proportion of a region where a diffraction pattern of a CAAC-OS film is observed in a predetermined area when a transmission electron diffraction pattern is measured using a transmission electron diffraction measurement apparatus is referred to as the proportion of CAAC.

Figure 2C:
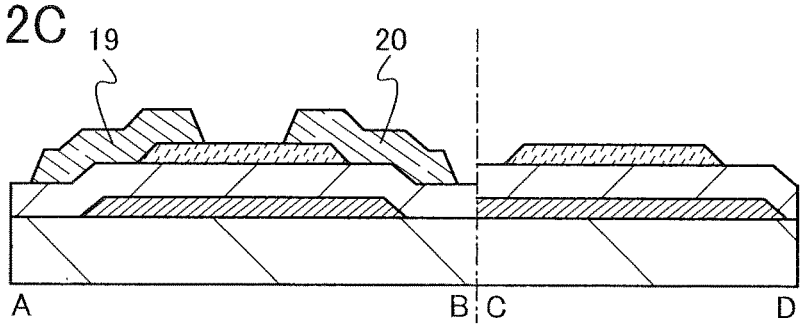

Next, as illustrated in FIG. 2C, the pair of electrodes 19 and 20 are formed.

A method for forming the pair of electrodes 19 and 20 is described below. First, a conductive film is formed by a sputtering method, a vacuum evaporation method, a pulsed laser deposition (PLD) method, a thermal CVD method, or the like. Then, a mask is formed over the conductive film by a photolithography process. After that, the conductive film is etched using the mask to form the pair of electrodes 19 and 20. After that, the mask is removed.

Here, a 50-nm-thick tungsten film, a 400-nm-thick aluminum film, and a 100-nm-thick titanium film are sequentially stacked by a sputtering method. Next, a mask is formed over the titanium film by a photolithography process and the tungsten film, the aluminum film, and the titanium film are dry-etched with use of the mask to form the pair of electrodes 19 and 20.

Note that heat treatment may be performed after the pair of electrodes 19 and 20 are formed. For example, this heat treatment can be performed in a manner similar to that of the heat treatment performed after the oxide semiconductor film 17 is formed.

After the pair of electrodes 19 and 20 are formed, cleaning treatment is preferably performed to remove an etching residue. A short circuit of the pair of electrodes 19 and 20 can be suppressed by this cleaning treatment. The cleaning treatment can be performed using an alkaline solution such as a tetramethylammonium hydroxide (TMAH) solution; an acidic solution such as a hydrofluoric acid, an oxalic acid solution, or a phosphoric acid solution; or water.

Next, an oxide insulating film 21 is formed over the oxide semiconductor film 17 and the pair of electrodes 19 and 20. The oxide insulating film 21 is formed under conditions which allow oxygen to be easily added in a later step. The oxide insulating film 21 can be formed by a sputtering method, a CVD method, an evaporation method, or the like. Note that when a deposition temperature is set to 350° C. or lower, preferably 300° C. or lower, more preferably 250° C. or lower in a CVD method, an oxide insulating film to which oxygen is easily added can be formed. Furthermore, when pressure in a treatment chamber is set to 40 Pa or higher, preferably 100 Pa or higher, more preferably 200 Pa or higher, an oxide insulating film to which oxygen is easily added can be formed.

Here, a silicon oxynitride film is formed by a plasma CVD method under the conditions where the substrate 11 is held at a temperature of 220° C., silane at a flow rate of 160 sccm and dinitrogen monoxide at a flow rate of 4000 sccm are used as a source gas, the pressure in the treatment chamber is set to 200 Pa, and a high-frequency power of 1500 W at 13.56 MHz ($8 \times 10^{-1}$ W/cm$^2$ as the power density) is supplied to parallel-plate electrodes.

Next, heat treatment may be performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C. By the heat treatment, water, hydrogen, and the like contained in the oxide insulating film 21 can be released.

Here, heat treatment is performed at 350° C. in a mixed atmosphere containing nitrogen and oxygen for one hour.

Next, a film 22 is formed over the oxide insulating film 21. Then, oxygen 24 is added to the oxide insulating film 21 through the film 22. Furthermore, the oxygen 24 can be added to the oxide semiconductor film 17. Note that oxygen is also added to the film 22 in this step.

The film 22 includes at least one of indium, zinc, titanium, aluminum, tungsten, tantalum, and molybdenum. For example, the film 22 can be formed using a conductive material such as an alloy including any of the metal elements, an alloy including any of the metal elements in combination, a metal oxide including any of the metal elements, a metal nitride including any of the metal elements, or a metal nitride oxide including any of the metal elements, in which case a larger amount of oxygen can be added to the oxide insulating film 21.

The film 22 can be formed using, for example, a tantalum nitride film, a titanium film, an indium tin oxide film, an aluminum film, or an oxide semiconductor film (e.g., an IGZO film having an atomic ratio of In:Ga:Zn=1:4:5). The film 22 can be formed by a sputtering method. The thickness of the film 22 is preferably greater than or equal to 1 nm and less than or equal to 20 nm, or greater than or equal to 2 nm and less than or equal to 10 nm. In this embodiment, a 5-nm-thick indium tin oxide doped with silicon oxide (also referred to as ITSO) is used as the film 22.

As a method for adding the oxygen 24, an ion doping method, an ion implantation method, plasma treatment, or the like is given. By the bias application to the substrate 11 side when the oxygen 24 is added, the oxygen 24 can be effectively added to the oxide insulating film 21. Furthermore, the oxygen 24 can be added to the oxide semiconductor film 17. As the bias, for example, power density can be greater than or equal to 1 W/cm$^2$ and less than or equal to 5 W/cm$^2$. When the oxygen 24 is added to the film 22, the film 22 functions as a protective film which suppresses the release of oxygen from the oxide insulating film 21. Thus, a larger amount of oxygen can be added to the oxide insulating film 21 and the oxide semiconductor film 17. In the case where heat treatment is performed after the oxide insulating film 21 is formed, oxygen is released from the oxide insulating film 21. If oxygen contained in the oxide insulating film 21 is insufficient to reduce oxygen vacancies in the oxide semiconductor film 17, oxygen vacancies are left in the oxide semiconductor film 17 even when heat treatment is performed after the oxide insulating film 21 is formed. In order to prevent this, oxygen is added to the oxide insulating film 21 through the film 22, whereby a larger amount of oxygen can be added to the oxide insulating film 21. As a result, the amount of oxygen vacancies in the oxide semiconductor film 17 can be reduced.

In the case where oxygen is added to the oxide insulating film 21 by plasma treatment, by making oxygen excited by a microwave to generate high-density oxygen plasma, the amount of oxygen added to the oxide insulating film 21 can be increased.

Figure 2D:
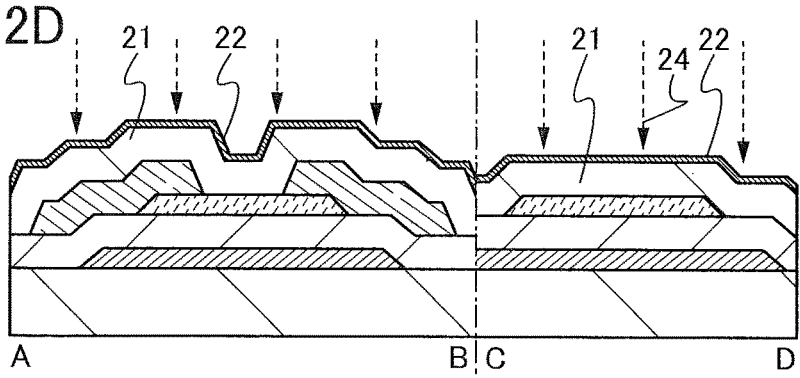
Figure 2E:
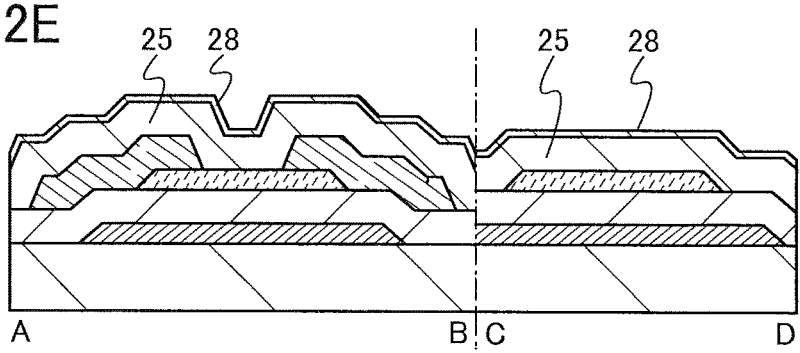

Through the above-described steps, the oxide insulating film 25 which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. and the metal oxide film 28 can be formed as shown in FIG. 2E.

The metal oxide film 28 includes oxygen and at least one of indium, zinc, titanium, aluminum, tungsten, tantalum, and molybdenum. The metal oxide film 28 can be formed using, for example, a tantalum oxide film, a titanium oxide film, an indium tin oxide film, an aluminum oxide film, or an oxide semiconductor film (e.g., an IGZO film having an atomic ratio of In:Ga:Zn=1:4:5).

Next, heat treatment may be performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

In the heat treatment, oxygen contained in the oxide insulating film 25 can be transferred to the oxide semiconductor film 17, so that the amount of oxygen vacancies in the oxide semiconductor film 17 can be reduced. Note that the metal oxide film 28 functions as a barrier film against oxygen; therefore, oxygen in the oxide insulating film 25 is hardly released to the outside in the heat treatment. Thus, oxygen in the oxide insulating film 25 can be efficiently transferred to the oxide semiconductor film 17. Through the above-described steps, the transistor illustrated in FIG. 1D can be manufactured.

After that, the metal oxide film 28 may be removed. As a method for removing the metal oxide film 28, for example, a dry etching method, a wet etching method, or a combination of a dry etching method and a wet etching method is employed.

Through the above-described steps, the transistor illustrated in FIG. 1C can be manufactured.

By this embodiment, a transistor in which a shift in the threshold voltage is reduced can be manufactured. Further, a transistor in which a change in electrical characteristics is reduced can be manufactured.

In Embodiment 1, one embodiment of the present invention has been described. Other embodiments of the present invention are described in Embodiments 2 to 6. Note that one embodiment of the present invention is not limited to the above examples. For example, although an example in which oxygen is added to the oxide insulating film, the oxide semiconductor film, or the like is shown as one embodiment of the present invention, one embodiment of the present invention is not limited thereto. Depending on the case or situation, an element other than oxygen may be added in one embodiment of the present invention. Alternatively, depending on the case or situation, oxygen is not necessarily added in one embodiment of the present invention. Further alternatively, depending on the case or situation, oxygen or an element other than oxygen may be added to a film other than the oxide insulating film or a film other than the oxide semiconductor film in one embodiment of the present invention.

MODIFICATION EXAMPLE 1

A modification example of the transistor described in this embodiment is described with reference to FIGS. 3A to 3F.

In a transistor described in this modification example, a gate insulating film or a protective film is different from that in each of the transistors described in FIGS. 1A to 1F.

Figure 3A:
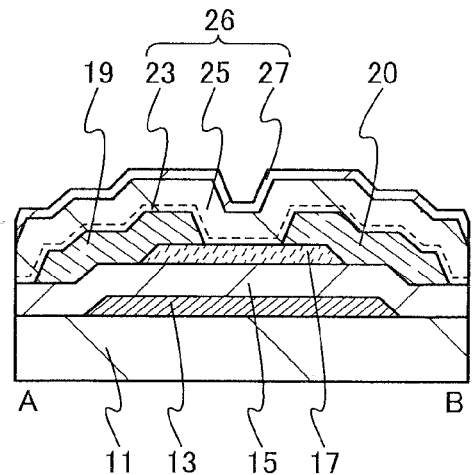
FIGS. 3A to 3F are each a cross-sectional view illustrating one embodiment of a transistor.

In a transistor illustrated in FIG. 3A, the protective film 26 has a stacked-layer structure. Specifically, the protective film 26 includes an oxide insulating film 23, the oxide insulating film 25, and a nitride insulating film 27 that are formed in this order. The oxide insulating film 23 in contact with the oxide semiconductor film 17 can be formed using an oxide insulating film with a low content of nitrogen oxide and a low density of defect states. The oxide insulating film 25 can be formed using an oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C.

Figure 3B:
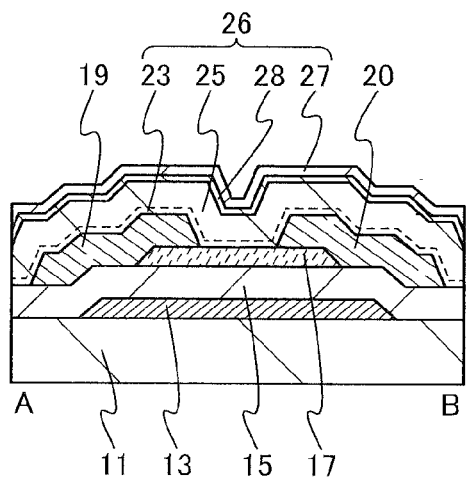

As shown in FIG. 3B, the protective film 26 may include the oxide insulating film 23, the oxide insulating film 25, the metal oxide film 28, and the nitride insulating film 27 that are formed in this order.

The oxide insulating film with a low content of nitrogen oxide and a low density of defect states is, specifically, an oxide insulating film in which the density of defect states located 4.6 eV or more and 8 eV or less lower than a vacuum level is low, that is, an oxide insulating film in which the density of defect states attributed to nitrogen oxide is low. As the oxide insulating film with a low content of nitrogen oxide and a low density of defect states, a silicon oxynitride film that releases little nitrogen oxide, a silicon oxide film that releases little nitrogen oxide, an aluminum oxynitride film that releases little nitrogen oxide, an aluminum oxide film that releases little nitrogen oxide, or the like can be used. Note that the average thickness of the oxide insulating film 23 is greater than or equal to 0.1 nm and less than or equal to 50 nm, or greater than or equal to 0.5 nm and less than or equal to 10 nm.

Note that a silicon oxynitride film that releases little nitrogen oxide is a film whose amount of released ammonia is larger than the amount of released nitrogen oxide in TDS analysis; the amount of released ammonia is typically greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes a temperature higher than or equal to 50° C. and lower than or equal to 650° C., or preferably higher than or equal to 50° C. and lower than or equal to 550° C.

Note that the average thicknesses of the oxide insulating film 25 is greater than or equal to 5 nm and less than or equal to 1000 nm, or greater than or equal to 10 nm and less than or equal to 500 nm.

Nitrogen oxide (NO$_x$; x is greater than or equal to 0 and less than or equal to 2, or preferably greater than or equal to 1 and less than or equal to 2), typically NO$_2$ or NO, forms levels in the oxide insulating film 23, for example. The level is positioned in the energy gap of the oxide semiconductor film 17. Therefore, when nitrogen oxide is diffused into the interface between the oxide insulating film 23 and the oxide semiconductor film 17, an electron is in some cases trapped by the level on the oxide insulating film 23 side of the oxide semiconductor film 17. As a result, the trapped electron remains in the vicinity of the interface between the insulating film 23 and the oxide semiconductor film 17; thus, the threshold voltage of the transistor is shifted in the positive direction.

Note that in an ESR spectrum at 100 K or lower of the oxide insulating film 23, by heat treatment of a manufacturing process of the transistor, typically heat treatment at a temperature higher than or equal to 300° C. and lower than the strain point of the substrate, a first signal that appears at a g-factor greater than or equal to 2.037 and less than or equal to 2.039, a second signal that appears at a g-factor greater than or equal to 2.001 and less than or equal to 2.003, and a third signal that appears at a g-factor greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

After heat treatment in the manufacturing process of the transistor, typically heat treatment at a temperature higher than or equal to 300° C. and lower than the strain point of the substrate, the oxide insulating film with a low content of nitrogen oxide and a low density of defect states has a nitrogen concentration measured by SIMS of less than or equal to $6 \times 10^{20}$ atoms/cm$^3$.

Note that when an oxide insulating film where the amount of ammonia released by heat treatment is greater than the amount of nitrogen oxide released by heat treatment (such an oxide insulating film is typified by an oxide insulating film where the amount of released gas having a mass-to-charge ratio m/z of 17 is greater than or equal to $1 \times 10^{18}$ molecules/cm$^3$ and less than or equal to $5 \times 10^{19}$ molecules/cm$^3$) is used as the oxide insulating film 23, Reaction Formulae (A-1) and (A-2) are satisfied; nitrogen oxide reacts with ammonia and oxygen and a nitrogen gas is formed and released by heat treatment in the manufacturing process. Thus, the nitrogen concentration of the oxide insulating film 23 and the amount of nitrogen oxide therein can be reduced. Moreover, the carrier trap at the interface between the oxide insulating film 23 and the oxide semiconductor film can be reduced. Furthermore, a shift in the threshold voltage of the transistor included in the semiconductor device can be reduced, which leads to a reduced change in the electrical characteristics of the transistor.

$$4NO+4NH_3+O_2 \rightarrow 4N_2+6H_2O \quad (A-1)$$

$$2NO_2+4NH_3+O_2 \rightarrow 3N_2+6H_2O \quad (A-2)$$

In an ESR spectrum at 100 K or lower of the oxide insulating film having a small amount of defects, after heat treatment, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The oxide insulating film 23 preferably has a nitrogen concentration measured by SIMS of lower than or equal to $6 \times 10^{20}$ atoms/cm$^3$. In that case, nitrogen oxide is unlikely to be generated in the oxide insulating film 23, so that the carrier trap at the interface between the oxide insulating film 23 and the oxide semiconductor film 17 can be reduced. Furthermore, a shift in the threshold voltage of the transistor included in the semiconductor device can be reduced, which leads to a reduced change in the electrical characteristics of the transistor.

When the oxide insulating film 23 in contact with the oxide semiconductor film 17 contains a small amount of nitrogen oxide as described above, the carrier trap at the interface between the oxide insulating film 23 and the oxide semiconductor film 17 can be reduced. As a result, a shift in the threshold voltage of the transistor included in the semiconductor device can be reduced, which leads to a reduced change in the electrical characteristics of the transistor.

In the case where an oxide insulating film with a low content of nitrogen oxide and a low density of defect states is formed as the oxide insulating film 23, a silicon oxide film or a silicon oxynitride film can be formed by a CVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

The oxide insulating film with a low content of nitrogen oxide and a low density of defect states can be formed by a CVD method under the conditions where the ratio of the oxidizing gas to the deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

As the nitride insulating film 27, a film having an effect of blocking at least hydrogen and oxygen is used. Preferably, the nitride insulating film 27 has an effect of blocking oxygen, hydrogen, water, an alkali metal, an alkaline earth metal, or the like. The nitride insulating film 27 can prevent outward diffusion of oxygen from the oxide semiconductor film 17 and entry of hydrogen, water, or the like into the oxide semiconductor film 17 from the outside.

The nitride insulating film 27 is formed using a silicon nitride film, a silicon nitride oxide film, an aluminum nitride film, an aluminum nitride oxide film, or the like with a thickness greater than or equal to 50 nm and less than or equal to 300 nm, preferably greater than or equal to 100 nm and less than or equal to 200 nm.

Note that instead of the nitride insulating film 27, an oxide insulating film having an effect of blocking oxygen, hydrogen, water, and the like may be provided. As the oxide insulating film having an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The nitride insulating film 27 can be formed by a sputtering method, a CVD method, or the like.

In the case where a silicon nitride film is formed by the plasma CVD method as the nitride insulating film 27, a deposition gas containing silicon, nitrogen, and ammonia is used as the source gas. As the source gas, ammonia whose amount is smaller than the amount of nitrogen is used, whereby ammonia is dissociated in the plasma and activated species are generated. The activated species cleave a bond between silicon and hydrogen which are contained in a deposition gas containing silicon and a triple bond between silicon, hydrogen, and nitrogen. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in the source gas, decomposition of a deposition gas containing silicon and decomposition of nitrogen are not promoted, so that a sparse silicon nitride film in which bonds between silicon and hydrogen remain and defects are increased is formed. Therefore, in the source gas, the flow rate ratio of the nitrogen to the ammonia is set to be preferably greater than or equal to 5 and less than or equal to 50, more preferably greater than or equal to 10 and less than or equal to 50.

Figure 3C:
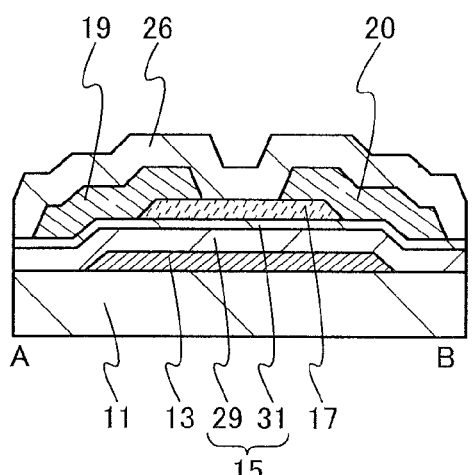

In a transistor illustrated in FIG. 3C, the gate insulating film 15 has a stacked-layer structure of a nitride insulating film 29 and the oxide insulating film 31, and the oxide insulating film 31 in contact with the oxide semiconductor film 17 is an oxide insulating film with a low content of nitrogen oxide and a low density of defect states.

Figure 3D:
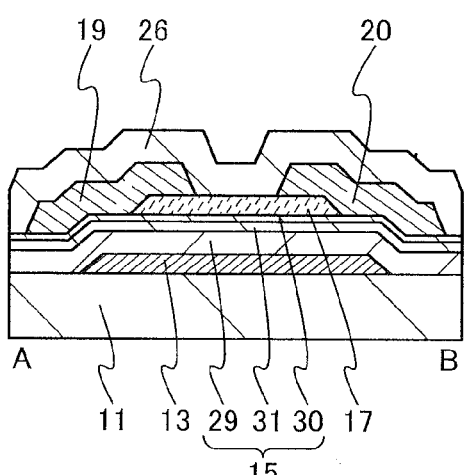

As shown in FIG. 3D, the gate insulating film 15 may include the nitride insulating film 29, the oxide insulating film 31, and the metal oxide film 30 that are formed in this order.

Figure 3E:
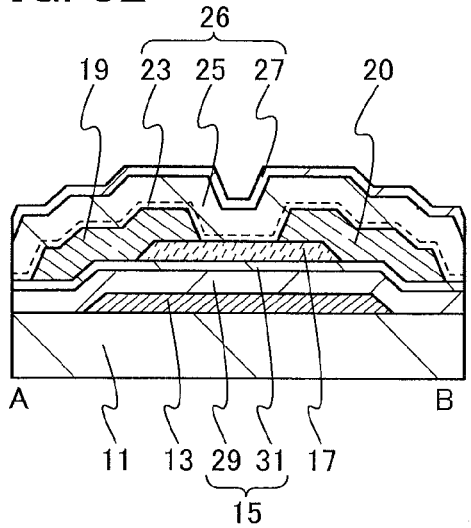

As shown in FIG. 3E, the gate insulating film 15 may include the nitride insulating film 29 and the oxide insulating film 31 that are formed in this order. Furthermore, the protective film 26 may include the oxide insulating film 23, the oxide insulating film 25, and the nitride insulating film 27 that are formed in this order.

Figure 3F:
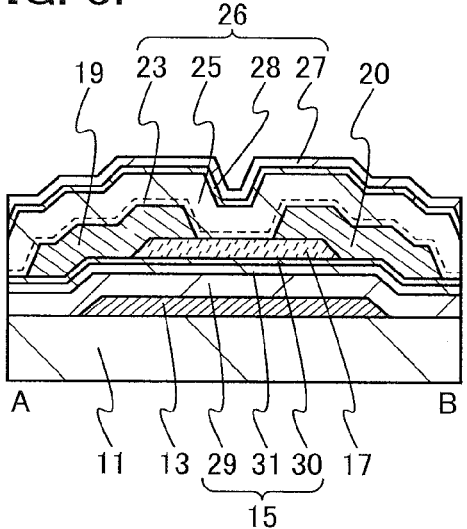

As shown in FIG. 3F, the gate insulating film 15 may include the nitride insulating film 29, the oxide insulating film 31, and the metal oxide film 30 that are formed in this order. Furthermore, the protective film 26 may include the oxide insulating film 23, the oxide insulating film 25, the metal oxide film 28, and the nitride insulating film 27 that are formed in this order.

As the nitride insulating film 29, a film having an effect of blocking water, hydrogen, or the like is preferably used. Alternatively, as the nitride insulating film 29, a film with a small amount of defects is preferably used. Typical examples of the nitride insulating film 29 include a silicon nitride film, a silicon nitride oxide film, an aluminum nitride film, an aluminum nitride oxide film, and the like.

The use of a silicon nitride film as the nitride insulating film 29 has the following effect. A silicon nitride film has a higher dielectric constant than a silicon oxide film and needs a larger thickness for capacitance equivalent to that of the silicon oxide. Thus, the physical thickness of the gate insulating film 15 can be increased. Therefore, the electrostatic breakdown of the semiconductor device can be suppressed by preventing a reduction in the withstand voltage of the transistor and improving the withstand voltage.

In the transistor including the oxide semiconductor film, when trap states (also referred to as interface states) are included in the gate insulating film 15, the trap states might cause a change in electrical characteristics, for a typical example, a shift of threshold voltage, of the transistor. As a result, electrical characteristics vary among transistors. With the use of a silicon nitride film having a small amount of defects as the nitride insulating film 29, the shift of threshold voltage and the variation in electrical characteristics among transistors can be reduced.

For example, the nitride insulating film 29 has a stacked-layer structure in which a first silicon nitride film is formed using a silicon nitride film having fewer defects, and a second silicon nitride film is formed using a silicon nitride film that releases a small amount of hydrogen molecules and ammonia molecules over the first silicon nitride film, whereby the gate insulating film 15 can be formed using a gate insulating film which has fewer defects and releases a small amount of hydrogen molecules and ammonia molecules. As a result, movement of hydrogen and nitrogen contained in the gate insulating film 15 to the oxide semiconductor film 17 can be suppressed.

The nitride insulating film 29 is preferably formed by stacking silicon nitride films by a two-step formation method. First, a first silicon nitride film with a small amount of defects is formed by a plasma CVD method in which a mixed gas of silane, nitrogen, and ammonia is used as a source gas. Then, by using a source gas at a flow rate ratio which is similar to that of a source gas used for the nitride insulating film 27 described later, a silicon nitride film which releases the small amount of hydrogen molecules and ammonia molecules can be formed as the second silicon nitride film.

When trap states are included in the gate insulating film 15, the trap states might cause a change in threshold voltage, for a typical example, a shift of threshold voltage, of the transistor. As a result, electrical characteristics vary among transistors. With the use of a dense oxide insulating film in the gate insulating film 15, the variation in electrical characteristics among transistors can be reduced. Furthermore, with the use of an oxide insulating film to which oxygen is easily added as the protective film 26, the amount of oxygen vacancies in the oxide semiconductor film can be reduced, so that the reliability of the transistor can be increased. Therefore, it is preferable that an oxide insulating film which is etched at an etching rate of lower than or equal to 8 nm/min when the oxide insulating film is immersed in a 0.5 wt/vol % hydrofluoric acid at 24° C. be used as the gate insulating film 15 and an oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. be used as the protective film 26.

MODIFICATION EXAMPLE 2

A modification example of the transistor described in Embodiment 1 is described with reference to FIGS. 4A to 4F. The transistors illustrated in FIGS. 1A to 1F, FIGS. 2A to 2F, and FIGS. 3A to 3F are channel-etched transistors; in contrast, transistors described in this modification example are channel-protective transistors.

Figure 4A:
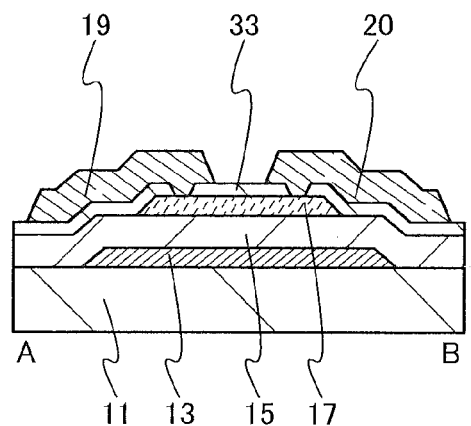
FIGS. 4A to 4F are each a cross-sectional view illustrating one embodiment of a transistor.

A transistor illustrated in FIG. 4A includes the gate electrode 13 over the substrate 11; the gate insulating film 15 over the substrate 11 and the gate electrode 13; the oxide semiconductor film 17 overlapping with the gate electrode 13 with the gate insulating film 15 therebetween; an insulating film 33 over the gate insulating film 15 and the oxide semiconductor film 17; and the pair of electrodes 19 and 20 in contact with the oxide semiconductor film 17 in openings of the insulating film 33.

Figure 4B:
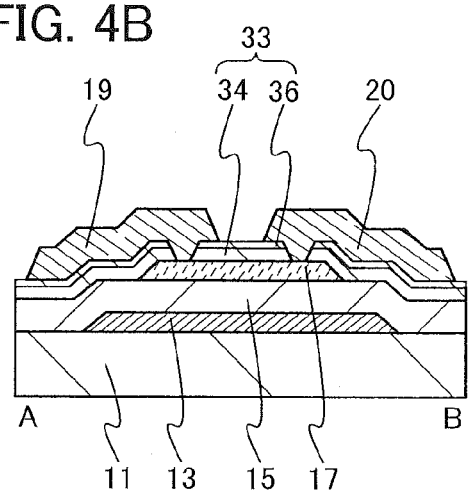

Note that as shown in FIG. 4B, the insulating film 33 may include an oxide insulating film 34 and a metal oxide film 36 that are formed in this order.

Figure 4C:
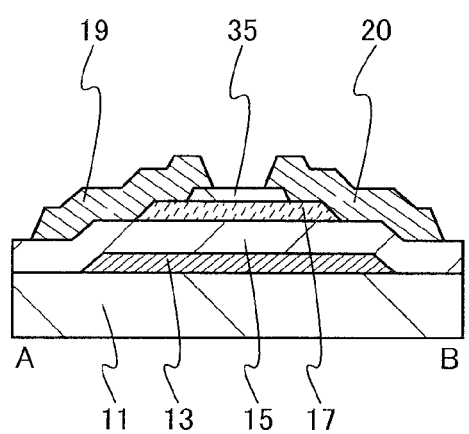

Alternatively, as in a transistor illustrated in FIG. 4C, an island-like insulating film 35 formed over the oxide semiconductor film 17 and the pair of electrodes 19 and 20 in contact with the oxide semiconductor film 17 may be included; the end portions of the pair of electrodes 19 and 20 are formed over the island-like insulating film 35.

Figure 4D:
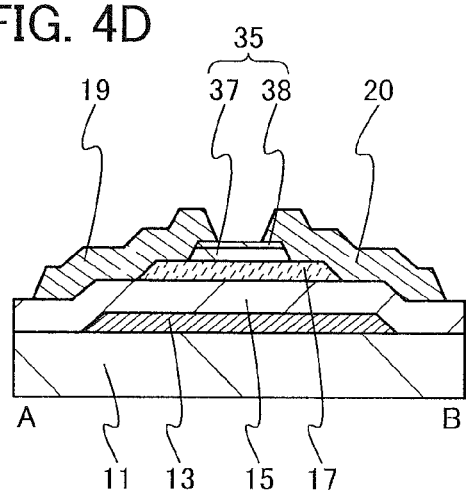

As shown in FIG. 4D, the island-like insulating film 35 may include an oxide insulating film 37 and a metal oxide film 38 that are formed in this order.

Figure 4E:
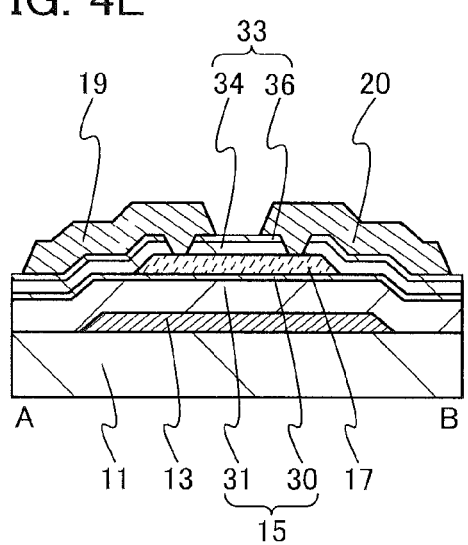

As shown in FIG. 4E, the gate insulating film 15 may include the oxide insulating film 31 and the metal oxide film 30 that are formed in this order, and furthermore, the insulating film 33 may include the oxide insulating film 34 and the metal oxide film 36 that are formed in this order.

Figure 4F:
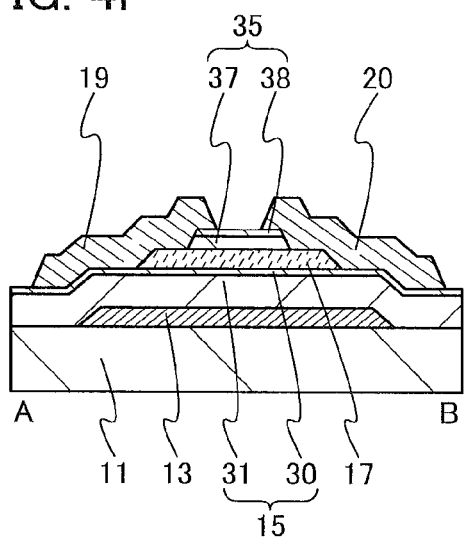

As shown in FIG. 4F, the gate insulating film 15 may include the oxide insulating film 31 and the metal oxide film 30 that are formed in this order, and furthermore, the island-like insulating film 35 may include the oxide insulating film 37 and the metal oxide film 38 that are formed in this order.

The insulating films 33 and 35 can be formed in a manner similar to that of the gate insulating film 15 or the protective film 26 shown in FIG. 1B.

The oxide insulating films 31, 34, and 37 can be formed in a manner similar to that of the oxide insulating film 25 shown in FIG. 1D.

The metal oxide films 30, 36, and 38 can be formed in a manner similar to that of the metal oxide film 28 shown in FIG. 1D.

In each of the transistors shown in FIGS. 4A to 4F, part of the oxide semiconductor film 17 is covered with the insulating film 33 or 35 when the pair of electrodes 19 and 20 is formed; accordingly, the oxide semiconductor film 17 is not damaged by etching for forming the pair of electrodes 19 and 20. Furthermore, when the oxide insulating films 31, 34, and 37 are oxide insulating films to which oxygen is added, the transistor can have excellent electrical characteristics in which a negative shift of the threshold voltage is suppressed. In addition, a highly reliable transistor in which a change in electrical characteristics with time or a change in electrical characteristics due to a gate BT photostress test is small can be manufactured.

MODIFICATION EXAMPLE 3

A modification example of the transistor described in Embodiment 1 is described with reference to FIGS. 5A to 5F. A transistor described in this modification example includes an oxide semiconductor film 17a and a pair of electrodes 19a and 20a that are formed using a multi-tone mask.

Figure 5A:
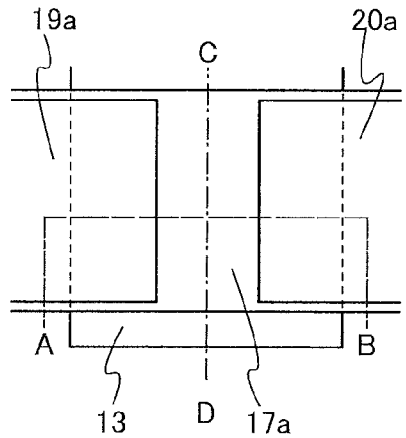
FIGS. 5A to 5F are a top view and cross-sectional views illustrating one embodiment of a transistor.
Figure 5B:
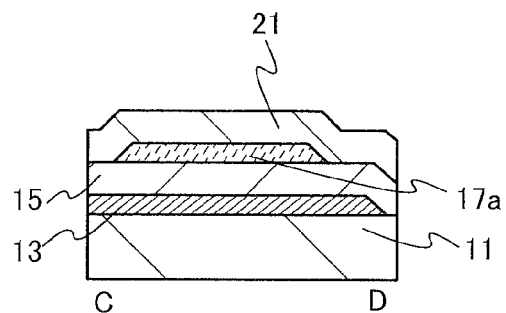
Figure 5C:
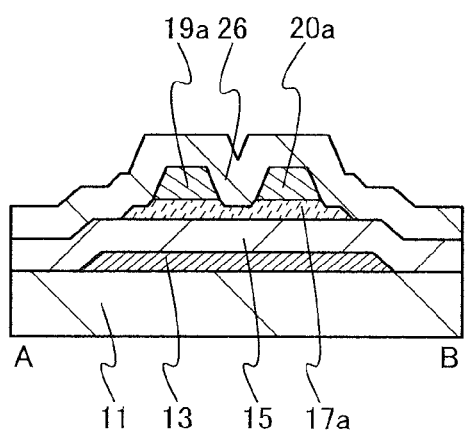
Figure 5D:
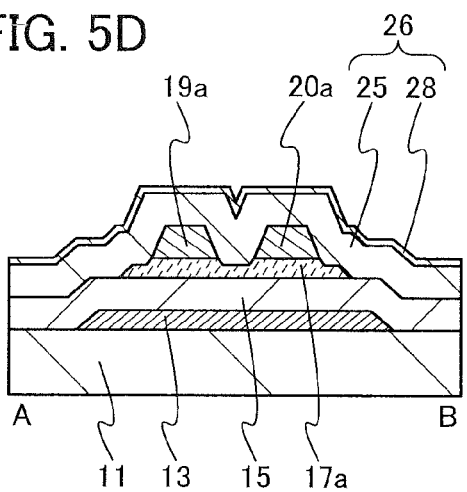
Figure 5E:
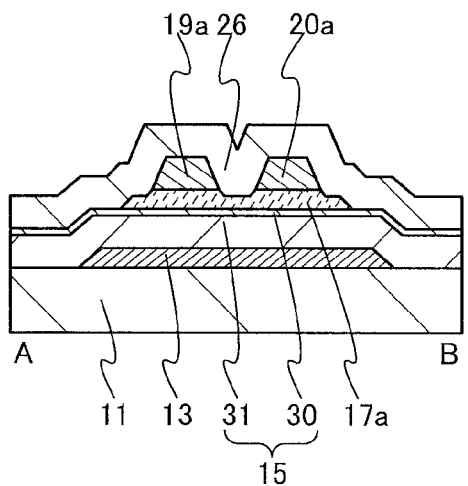
Figure 5F:
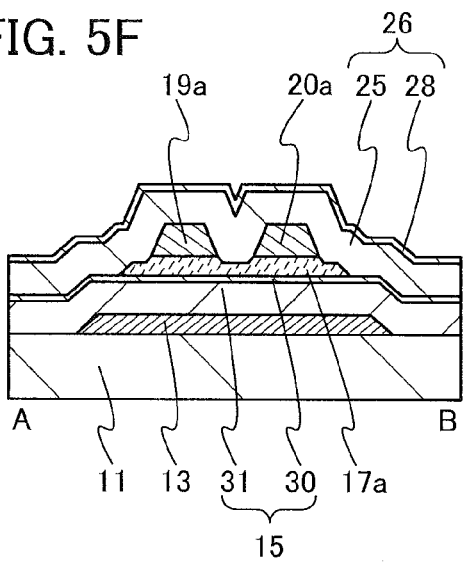

FIGS. 5A to 5F are a top view and cross-sectional views of transistors included in semiconductor devices. FIG. 5A is a top view of a transistor, FIG. 5B is a cross-sectional view taken along dashed-dotted line C-D in FIG. 5A, and FIG. 5C is a cross-sectional view taken along dashed-dotted line A-B in FIG. 5A. FIGS. 5D to 5F are modification examples of FIG. 5C.

As shown in FIG. 5C, an oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. is included in at least one of the gate insulating film 15 and the protective film 26.

As shown in FIG. 5D, the protective film 26 may include the oxide insulating film 25 and the metal oxide film 28 that are formed in this order.

As shown in FIG. 5E, the gate insulating film 15 may include the oxide insulating film 31 and the metal oxide film 30 that are formed in this order.

As shown in FIG. 5F, the gate insulating film 15 may include the oxide insulating film 31 and the metal oxide film 30 that are formed in this order, and furthermore, the protective film 26 may include the oxide insulating film 25 and the metal oxide film 28 that are formed in this order.

With the use of a multi-tone mask, a resist mask having a plurality of regions with different thicknesses can be formed. After the oxide semiconductor film 17a is formed using the resist mask, the resist mask is exposed to oxygen plasma or the like, whereby the resist mask is partly removed to be a resist mask used for formation of the pair of electrodes 19a and 19b. As a result, the number of steps in photolithography in a process for forming the oxide semiconductor film 17a and the pair of electrodes 19a and 20a can be reduced.

The oxide semiconductor film 17a formed using the multi-tone mask is partly exposed to the outside of the pair of electrodes 19a and 20a when seen in a plan view.

Note that the structures, methods, and the like described in this embodiment can be used as appropriate in combination with any of the structures, methods, and the like described in the other embodiments and examples.

MODIFICATION EXAMPLE 4

A modification example of the insulating film over the transistor described in Embodiment 1 is described with reference to FIGS. 6A to 6F. A transistor described in this modification example includes an organic insulating film 41 over the protective film 26.

Figure 6A:
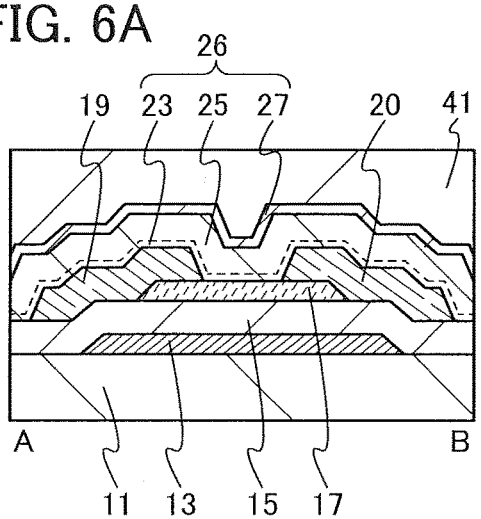
FIGS. 6A to 6F are each a cross-sectional view illustrating one embodiment of a transistor.

The protective film 26 over a transistor shown in FIG. 6A includes the oxide insulating film 23, the oxide insulating film 25, and the nitride insulating film 27 that are formed in this order.

Figure 6B:
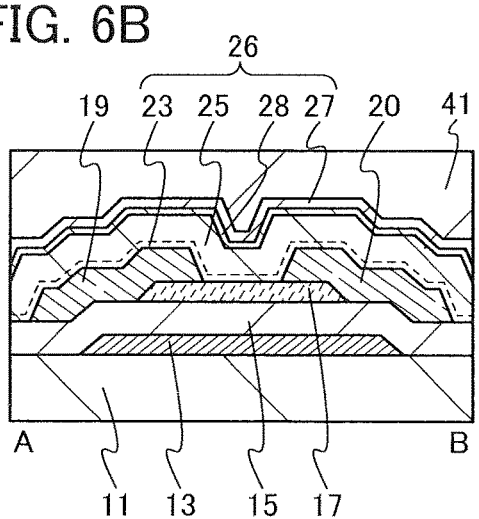

As shown in FIG. 6B, the protective film 26 may include the oxide insulating film 23, the oxide insulating film 25, the metal oxide film 28, and the nitride insulating film 27 that are formed in this order.

Figure 6C:
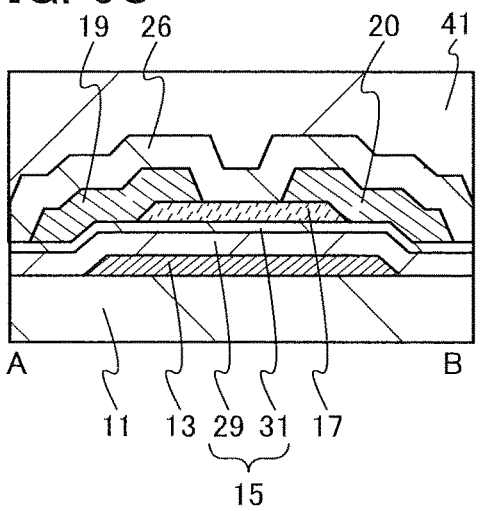

As shown in FIG. 6C, the gate insulating film 15 may include the nitride insulating film 29 and the oxide insulating film 31 that are formed in this order.

Figure 6D:
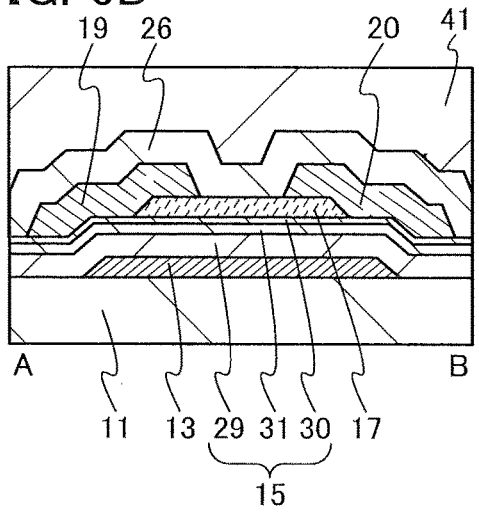

As shown in FIG. 6D, the gate insulating film 15 may include the nitride insulating film 29, the oxide insulating film 31, and the metal oxide film 30 that are formed in this order.

Figure 6E:
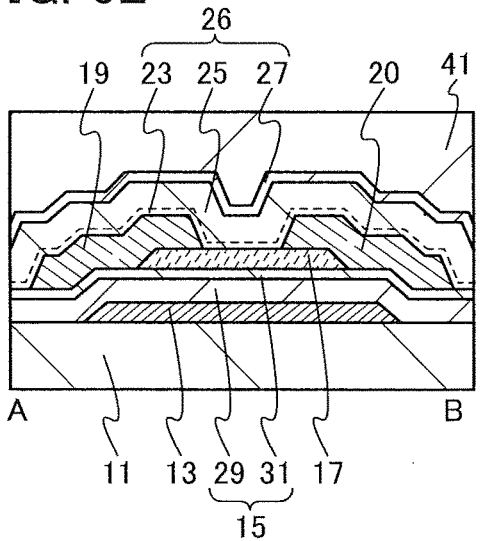

As shown in FIG. 6E, the gate insulating film 15 may include the nitride insulating film 29 and the oxide insulating film 31 that are formed in this order, and furthermore, the protective film 26 may include the oxide insulating film 23, the oxide insulating film 25, and the nitride insulating film 27 that are formed in this order.

Figure 6F:
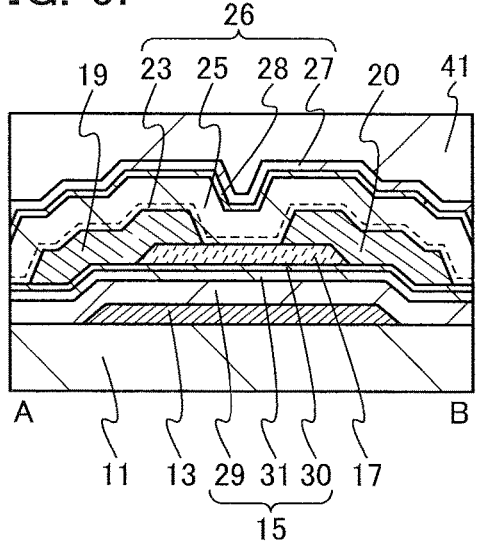

As shown in FIG. 6F, the gate insulating film 15 may include the nitride insulating film 29, the oxide insulating film 31, and the metal oxide film 30 that are formed in this order. Furthermore, the protective film 26 may include the oxide insulating film 23, the oxide insulating film 25, the metal oxide film 28, and the nitride insulating film 27 that are formed in this order.

As the organic insulating film 41, for example, an organic resin film of polyimide, acrylic, polyamide, or epoxy can be used. The thickness of the organic insulating film 41 is preferably greater than or equal to 500 nm and less than or equal to 10 μm.

The organic insulating film 41 may be provided to cover the whole protective film 26. Alternatively, the organic insulating film 41 may be provided for each transistor to overlap with the oxide semiconductor film 17 of each transistor. The organic insulating film 41 is preferably isolated from other organic insulating film 41 because water from the outside is not diffused into the semiconductor device through the organic insulating film 41.

The transistor includes the organic insulating film 41 over the protective film 26. Since the organic insulating film 41 is thick (greater than or equal to 500 nm), an electric field generated by application of negative voltage to the gate electrode 13 does not affect a surface of the organic insulating film 41; as a result, positive charges are less likely to be accumulated on the surface of the organic insulating film 41. In addition, even when positive fixed charges exist on the surface of the organic insulating film 41, the positive fixed charges are less likely to affect the interface between the oxide semiconductor film 17 and the protective film 26 because the organic insulating film 41 is thick (greater than or equal to 500 nm). As a result, practically no positive bias is applied to the interface between the oxide semiconductor film 17 and the protective film 26; thus, a change in the threshold voltage of the transistor is small.

MODIFICATION EXAMPLE 5

A modification example of the insulating film over the transistor described in Embodiment 1 is described.

When the oxygen 24 is added to the oxide insulating film 21 through the film 22 as shown in FIG. 2D, some of metal elements contained in the film 22 are added to the oxide insulating film 21 in some cases. This is because part of the film 22 is introduced into the oxide insulating film 21 when the oxygen 24 is added to the oxide insulating film 21.

Therefore, oxygen which can be released by heating is contained in the oxide insulating film 21 in the case where a metal element such as indium, zinc, titanium, aluminum, tungsten, tantalum, or molybdenum which is different from a main component of the oxide insulating film 21 is detected in an upper portion of the oxide insulating film 21 by elemental analysis.

For example, an IGZO film having an atomic ratio of In:Ga:Zn=1:4:5 is formed as the film 22. Furthermore, the oxygen 24 is added to the oxide insulating film 21 through the film 22. As a result, indium is added to the upper portion of the oxide insulating film 21. That is, indium is contained in the oxide insulating film 21. Note that whether indium is contained in the oxide insulating film 21 can be determined by SIMS.

Note that the structures, methods, and the like described in this embodiment can be used as appropriate in combination with any of the structures, methods, and the like described in the other embodiments and examples.

Embodiment 2

In this embodiment, a semiconductor device and a manufacturing method thereof, which are different from those in Embodiment 1, are described with reference to drawings. The transistors described in Embodiment 1 each include one gate electrode; in contrast, a transistor described in this embodiment includes two gate electrodes with an oxide semiconductor film interposed between the gate electrodes.

Figure 7A:
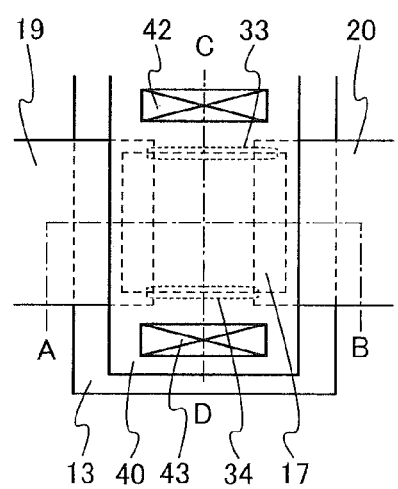
FIGS. 7A to 7F are a top view and cross-sectional views illustrating one embodiment of a transistor.
Figure 7B:
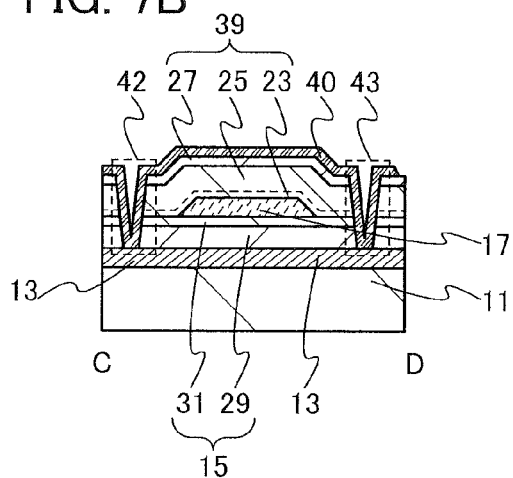
Figure 7C:
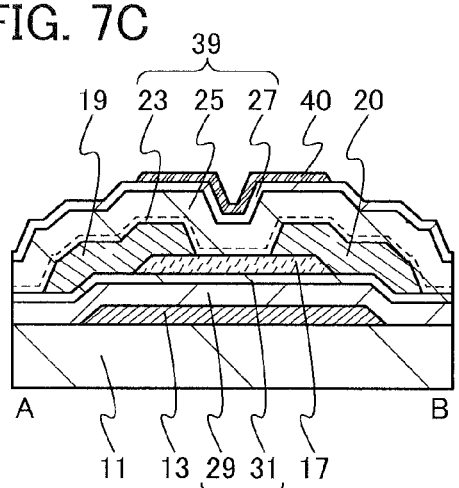
Figure 7D:
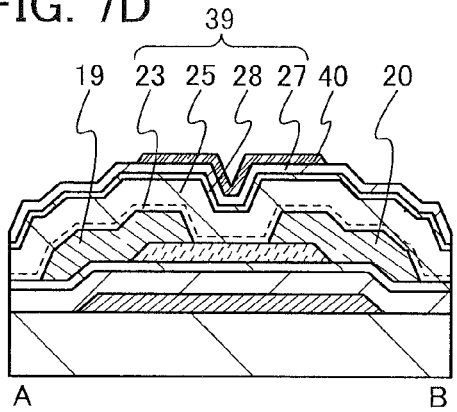
Figure 7E:
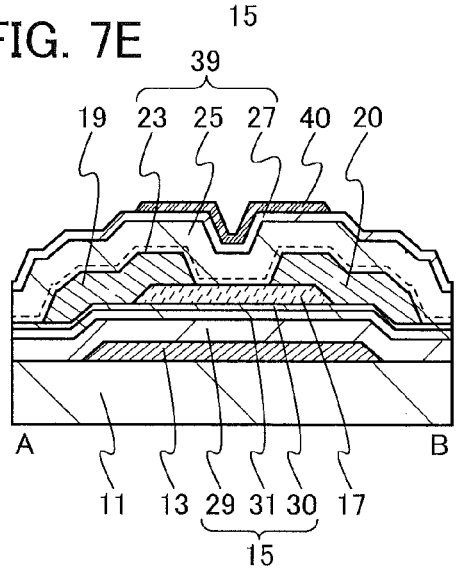
Figure 7F:
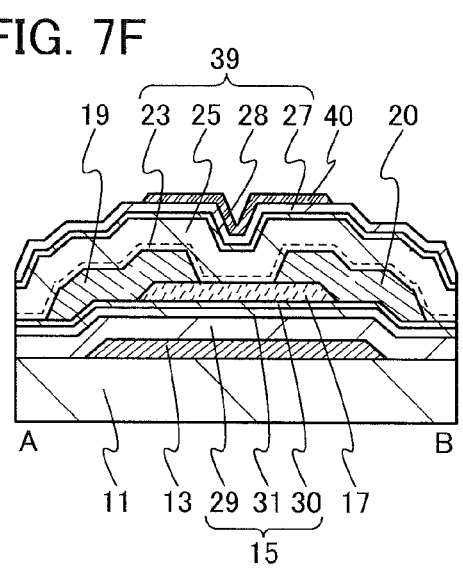

FIGS. 7A to 7C are a top view and cross-sectional views of the transistor included in a semiconductor device. FIG. 7A is a top view of the transistor, FIG. 7B is a cross-sectional view taken along dashed-dotted line C-D in FIG. 7A, and FIG. 7C is a cross-sectional view taken along dashed-dotted line A-B in FIG. 7A. FIGS. 7D to 7F are modification examples of FIG. 7C.

The transistor shown in FIGS. 7A to 7C is a channel-etched transistor and includes the gate electrode 13 over the substrate 11, the gate insulating film 15 over the substrate 11 and the gate electrode 13, the oxide semiconductor film 17 overlapping with the gate electrode 13 with the gate insulating film 15 provided therebetween, and the pair of electrodes 19 and 20 in contact with the oxide semiconductor film 17. Furthermore, a gate insulating film 39 over the gate insulating film 15, the oxide semiconductor film 17, and the pair of electrodes 19 and 20 and a gate electrode 40 over the gate insulating film 39 are included. The gate insulating film 39 includes the oxide insulating film 23, the oxide insulating film 25, and the nitride insulating film 27 that are formed in this order. The gate electrode 40 is connected to the gate electrode 13 through opening portions 42 and 43 provided in the gate insulating film 15 and the gate insulating film 39. Here, the gate insulating film 15 is a stack of the nitride insulating film 29 and oxide insulating film 31. The gate insulating film 39 is a stack of the oxide insulating film 23, the oxide insulating film 25, and the nitride insulating film 27.

A plurality of opening portions are provided in the gate insulating film 15 and the gate insulating film 39. Typically, the opening portions 42 and 43 are provided with the oxide semiconductor film 17 provided therebetween in the channel width direction as illustrated in FIG. 7B. In other words, the opening portions 42 and 43 are provided on outer sides of the side surfaces of the oxide semiconductor film 17. In addition, in the opening portions 42 and 43, the gate electrode 13 is connected to the gate electrode 40. This means that the gate electrode 13 and the gate electrode 40 surround the oxide semiconductor film 17 in the channel width direction with the gate insulating film 15 provided between the oxide semiconductor film 17 and the gate electrode 13 and with the gate insulating film 39 provided between the oxide semiconductor film 17 and the gate electrode 40. Furthermore, the gate electrode 40 in the opening portions 42 and 43 faces the side surfaces of the oxide semiconductor film 17. Note that the gate insulating film 15 and the gate insulating film 39 may include one opening portion. That is, the gate insulating film 15 and the gate insulating film 39 may include the opening portion 42 or the opening portion 43.

As shown in FIG. 7D, the gate insulating film 39 may include the oxide insulating film 23, the oxide insulating film 25, the metal oxide film 28, and the nitride insulating film 27 that are formed in this order.

As shown in FIG. 7E, the gate insulating film 15 may include the nitride insulating film 29, the oxide insulating film 31, and the metal oxide film 30 that are formed in this order, and furthermore, the gate insulating film 39 may include the oxide insulating film 23, the oxide insulating film 25, and the nitride insulating film 27 that are formed in this order.

As shown in FIG. 7F, the gate insulating film 15 may include the nitride insulating film 29, the oxide insulating film 31, and the metal oxide film 30 that are formed in this order, and furthermore, the gate insulating film 39 may include the oxide insulating film 23, the oxide insulating film 25, the metal oxide film 28, and the nitride insulating film 27 that are formed in this order.

As shown in FIG. 7B, the side surfaces of the oxide semiconductor film 17 face the gate electrode 40 in the channel width direction. Furthermore, the gate electrode 13 and the gate electrode 40 surround the oxide semiconductor film 17 in the channel width direction with the gate insulating film 15 provided between the oxide semiconductor film 17 and the gate electrode 13 and with the gate insulating film 39 provided between the oxide semiconductor film 17 and the gate electrode 40. Therefore, a gate electric field is applied to the oxide semiconductor film 17 not only in the vertical direction but also from the side surfaces. That is, the gate electric field is applied to the whole oxide semiconductor film 17, whereby a current flows in the bulk of the oxide semiconductor film 17. Therefore, the amount of transfer of carriers in the transistor is increased. As a result, the on-state current and field-effect mobility of the transistor are increased. The electric field of the gate electrode 40 affects the side surface or an end portion including the side surface and its vicinity of the oxide semiconductor film 17;

thus, generation of a parasitic channel at the side surface or the end portion of the oxide semiconductor film 17 can be suppressed.

Embodiment 3

Modification examples of the transistors described in Embodiments 1 and 2 are described with reference to FIGS. 8A to 8F, FIGS. 9A to 9D, FIGS. 10A to 10D, FIGS. 11A to 11D, and FIGS. 12A and 12B. The transistors described in Embodiments 1 and 2 each include the single-layer oxide semiconductor film. Transistors described in Embodiment 3 each include a multi-layer oxide semiconductor film.

Figure 8A:
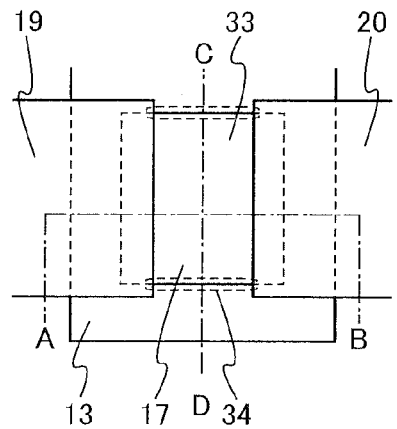
FIGS. 8A to 8F are a top view and cross-sectional views illustrating one embodiment of a transistor.
Figure 8B:
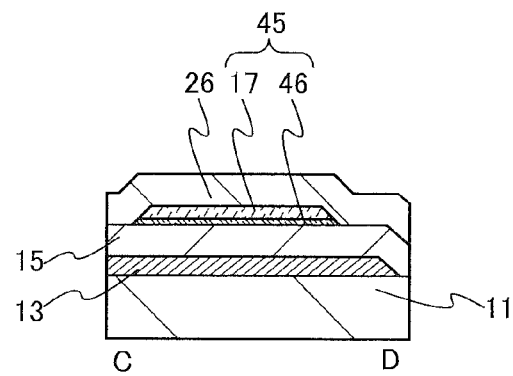
Figure 8C:
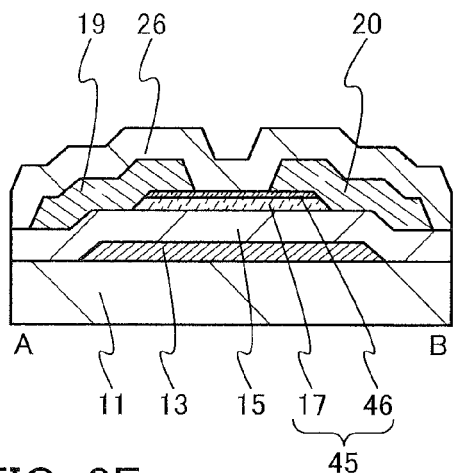
Figure 8D:
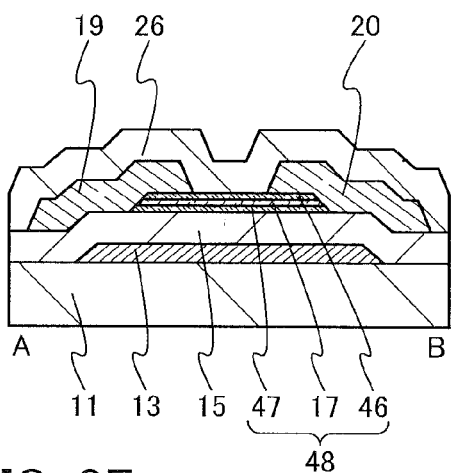
Figure 8E:
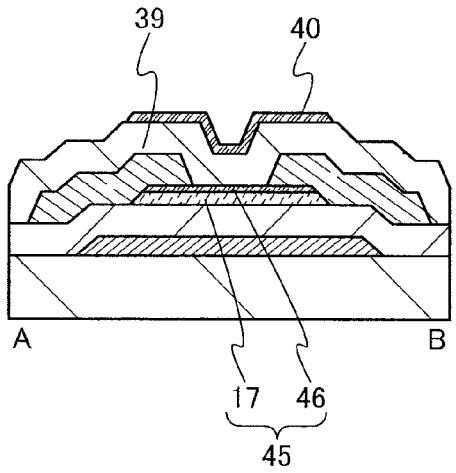
Figure 8F:
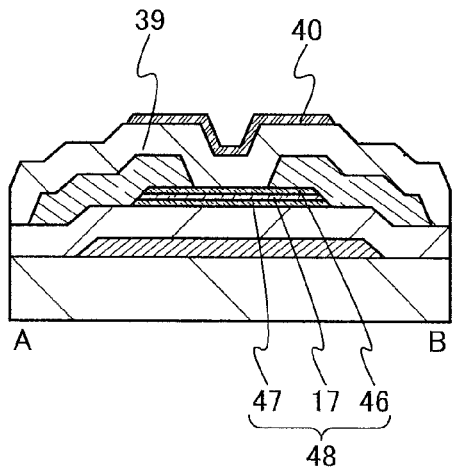

FIGS. 8A to 8C are a top view and cross-sectional views of the transistor included in a semiconductor device. FIG. 8A is a top view of the transistor, FIG. 8B is a cross-sectional view taken along dashed-dotted line C-D in FIG. 8A, and FIG. 8C is a cross-sectional view taken along dashed-dotted line A-B in FIG. 8A. FIGS. 8D to 8F are modification examples of FIG. 8C.

The transistor illustrated in FIGS. 8A to 8C includes a multilayer film 45 overlapping with the gate electrode 13 with the gate insulating film 15 provided therebetween, and the pair of electrodes 19 and 20 in contact with the multilayer film 45. The protective film 26 is stacked over the gate insulating film 15, the multilayer film 45, and the pair of electrodes 19 and 20.

In the transistor described in this embodiment, the multilayer film 45 includes the oxide semiconductor film 17 and an oxide semiconductor film 46. That is, the multilayer film 45 has a two-layer structure. Furthermore, part of the oxide semiconductor film 17 serves as a channel region. In addition, the protective film 26 is formed in contact with the multilayer film 45.

The oxide semiconductor film 46 contains one or more elements that form the oxide semiconductor film 17. Thus, interface scattering is unlikely to occur at the interface between the oxide semiconductor film 17 and the oxide semiconductor film 46. Thus, the transistor can have high field-effect mobility because the movement of carriers is not hindered at the interfaces.

The oxide semiconductor film 46 is formed using a metal oxide film containing at least In or Zn. Typical examples of the metal oxide film include an In—Ga oxide film, an In—Zn oxide film, and an In-M-Zn oxide film (M represents Al, Ga, Y, Zr, La, Ce, or Nd). The conduction band minimum of the oxide semiconductor film 46 is closer to a vacuum level than that of the oxide semiconductor film 17 is; as a typical example, the energy difference between the conduction band minimum of the oxide semiconductor film 46 and the conduction band minimum of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 46 and the electron affinity of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 46 preferably contains In because carrier mobility (electron mobility) can be increased.

When the oxide semiconductor film 46 contains a larger amount of Al, Ti, Ga, Y, Zr, Sn, La, Ce, Mg, or Nd in an atomic ratio than the amount of In in an atomic ratio, any of the following effects may be obtained.

(1) The energy gap of the oxide semiconductor film 46 is large.
(2) The electron affinity of the oxide semiconductor film 46 is low.
(3) Impurity diffusion from the outside is suppressed.
(4) An insulating property of the oxide semiconductor film 46 is higher than that of the oxide semiconductor film 17.
(5) An oxygen vacancy is less likely to be generated in the oxide semiconductor film 46 because Al, Ga, Y, Zr, La, Ce, or Nd is a metal element that is strongly bonded to oxygen.

In the case where the oxide semiconductor film 46 is an In-M-Zn oxide film, the proportions of In and M when the summation of In and M is assumed to be 100 atomic % are preferably as follows: the proportion of In is less than 50 atomic % and the proportion of M is greater than or equal to 50 atomic %, or further preferably, the proportion of In is less than 25 atomic % and the proportion of M is greater than or equal to 75 atomic %.

Furthermore, in the case where each of the oxide semiconductor films 17 and 46 is an In-M-Zn oxide film (M represents Al, Ga, Y, Zr, La, Ce, or Nd), the proportion of M atoms (M represents Ga, Y, Zr, La, Ce, or Nd) in the oxide semiconductor film 46 is higher than that in the oxide semiconductor film 17. As a typical example, the proportion of M in the oxide semiconductor film 17 is 1.5 or more times, preferably twice or more, further preferably three or more times as high as that in the oxide semiconductor film 17.

Furthermore, in the case where each of the oxide semiconductor films 17 and 46 is an In-M-Zn oxide film (M represents Al, Ga, Y, Zr, La, Ce, or Nd), when In:M:Zn=$x_1$:$y_1$:$z_1$ [atomic ratio] is satisfied in the oxide semiconductor film 46 and In:M:Zn=$x_2$:$y_2$:$z_2$ [atomic ratio] is satisfied in the oxide semiconductor film 17, $y_1/x_1$ is higher than $y_2/x_2$, and preferably, $y_1/x_1$ be 1.5 or more times as high as $y_2/x_2$. Alternatively, $y_1/x_1$ is preferably twice or more as high as $y_2/x_2$. Further alternatively, $y_1/x_1$ is preferably three or more times as high as $y_2/x_2$. In this case, it is preferable that in the oxide semiconductor film, $y_2$ be higher than or equal to $x_2$ because a transistor including the oxide semiconductor film can have stable electrical characteristics. However, when $y_2$ is three or more times as large as $x_2$, the field-effect mobility of the transistor including the oxide semiconductor film is reduced; accordingly, $y_2$ is preferably smaller than three times $x_2$.

In the case where the oxide semiconductor film 17 is an In-M-Zn oxide film (M is Al, Ga, Y, Zr, La, Ce, or Nd) and a target having the atomic ratio of metal elements of InM:Zn=$x_1$:$y_1$:$z_1$ is used for formation of the oxide semiconductor film 17, $x_1/y_1$ is preferably greater than or equal to 1/3 and less than or equal to 6, further preferably greater than or equal to 1 and less than or equal to 6, and $z_1/y_1$ is preferably greater than or equal to 1/3 and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 17 is easily formed. Typical examples of the atomic ratio of the metal elements of the target are In:M:Zn=1:1:1, In:M:Zn=1:1:1.2, In:M:Zn=3:1:2, and In:M:Zn=4:2:4.1.

In the case where the oxide semiconductor film 46 is an In-M-Zn oxide film (M is Al, Ga, Y, Zr, La, Ce, or Nd) and a target having the atomic ratio of metal elements of InM:Zn=$x_2$:$y_2$:$z_2$ is used for formation of the oxide semiconductor film 46, $x_2/y_2$ is preferably less than $x_1/y_1$, and $z_2/y_2$ is preferably greater than or equal to 1/3 and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 46 is easily formed. Typical examples of the atomic ratio of the metal elements of the target are In:M:Zn=1:2:4, In:M:Zn=1.1:2.9:7.5, In:M:Zn=1:3:2, In:M:Zn=1:3:4, In:M:Zn=1:3:6, In:M:Zn=1:3:8, InM:Zn=1:4:3, In:M:Zn=1:4:4, In:M:Zn=1:4:5, In:M:Zn=1:4:6, In:M:Zn=1:5:5, In:M:Zn=1:5:6, and the like.

Note that the proportion of each metal element in the atomic ratio of each of the oxide semiconductor films 17 and 46 varies within a range of ±40% of that in the above atomic ratio as an error.

The thickness of the oxide semiconductor film 46 is greater than or equal to 3 nm and less than or equal to 100 nm, preferably greater than or equal to 3 nm and less than or equal to 50 nm.

The oxide semiconductor film 46 may have a non-single-crystal structure, for example, like the oxide semiconductor film 17. The non-single crystal structure includes a c-axis aligned crystalline oxide semiconductor (CAAC-OS) that is described later, a polycrystalline structure, a microcrystalline structure described later, or an amorphous structure, for example.

The oxide semiconductor film 46 may have an amorphous structure, for example. An amorphous oxide semiconductor film has, for example, disordered atomic arrangement and no crystalline component. Alternatively, an amorphous oxide film has, for example, an absolutely amorphous structure and no crystal part.

Note that the oxide semiconductor films 17 and 46 may form a mixed film including two or more of a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

Here, the oxide semiconductor film 46 is provided between the oxide semiconductor film 17 and the protective film 26. Hence, if trap states are formed between the oxide semiconductor film 46 and the protective film 26 owing to impurities and defects, electrons flowing in the oxide semiconductor film 17 are less likely to be captured by the trap states because there is a distance between the trap states and the oxide semiconductor film 17. Accordingly, the amount of on-state current of the transistor can be increased, and the field-effect mobility can be increased. When the electrons are captured by the trap states, the electrons become negative fixed charges. As a result, a threshold voltage of the transistor fluctuates. However, by the distance between the oxide semiconductor film 17 and the trap states, capture of the electrons by the trap states can be reduced, and accordingly a change in threshold voltage can be reduced.

The oxide semiconductor film 46 can block impurities from the outside, and accordingly, the amount of impurities that are transferred from the outside to the oxide semiconductor film 17 can be reduced. Furthermore, an oxygen vacancy is less likely to be formed in the oxide semiconductor film 46. Consequently, the impurity concentration and the amount of oxygen vacancies in the oxide semiconductor film 17 can be reduced.

Note that the oxide semiconductor films 17 and 46 are not formed by simply stacking each film, but are formed to form a continuous junction (here, in particular, a structure in which the energy of the conduction band minimum is changed continuously between each film). In other words, a stacked-layer structure is formed such that there exist no impurities which form a defect level such as a trap center or a recombination center at each interface. If an impurity exists between the oxide semiconductor films 17 and 46 that are stacked, a continuity of the energy band is damaged, and the carrier is trapped or recombined at the interface and then disappears.

To form such a continuous energy band, it is necessary to form films continuously without being exposed to the air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of gas, especially gas containing carbon or hydrogen from an exhaust system to the inside of the chamber.

Note that a multilayer film 48 in the transistor illustrated in FIG. 8D may be included instead of the multilayer film 45.

An oxide semiconductor film 47, the oxide semiconductor film 17, and the oxide semiconductor film 46 are stacked in this order in the multilayer film 48. That is, the multilayer film 48 has a three-layer structure. Furthermore, the oxide semiconductor film 17 serves as a channel region.

The gate insulating film 15 is in contact with the oxide semiconductor film 47. In other words, the oxide semiconductor film 47 is provided between the gate insulating film 15 and the oxide semiconductor film 17.

Furthermore, the oxide semiconductor film 46 is in contact with the protective film 26. That is, the oxide semiconductor film 46 is provided between the oxide semiconductor film 17 and the protective film 26.

The oxide semiconductor film 47 can be formed using a material and a formation method similar to those of the oxide semiconductor film 46.

It is preferable that the thickness of the oxide semiconductor film 47 be smaller than that of the oxide semiconductor film 17. When the thickness of the oxide semiconductor film 47 is greater than or equal to 1 nm and less than or equal to 5 nm, preferably greater than or equal to 1 nm and less than or equal to 3 nm, the amount of change in the threshold voltage of the transistor can be reduced.

In the transistors described in this embodiment, the oxide semiconductor film 46 is provided between the oxide semiconductor film 17 and the protective film 26. Thus, if trap states are formed between the oxide semiconductor film 46 and the protective film 26 by impurities and defects, electrons flowing in the oxide semiconductor film 17 are less likely to be trapped by the trap states because there is a distance between the trap states and the oxide semiconductor film 17. Accordingly, the amount of on-state current of the transistor can be increased, and the field-effect mobility can be increased. When the electrons are trapped by the trap states, the electrons behave as negative fixed charges. As a result, the threshold voltage of the transistor varies. However, by the distance between the trap states and the oxide semiconductor film 17, trap of electrons by the trap states can be reduced, and accordingly, fluctuations of the threshold voltage can be reduced.

The oxide semiconductor film 46 can block entry of impurities from the outside, and accordingly, the amount of impurities transferred to the oxide semiconductor film 17 from the outside can be reduced. Furthermore, an oxygen vacancy is less likely to be formed in the oxide semiconductor film 46. Consequently, the impurity concentration and the number of oxygen vacancies in the oxide semiconductor film 17 can be reduced.

The oxide semiconductor film 47 is provided between the gate insulating film 15 and the oxide semiconductor film 17, and the oxide semiconductor film 46 is provided between the oxide semiconductor film 17 and the protective film 26. Thus, it is possible to reduce the concentration of silicon or carbon in the vicinity of the interface between the oxide semiconductor film 47 and the oxide semiconductor film 17, in the oxide semiconductor film 17, or in the vicinity of the interface between the oxide semiconductor film 46 and the oxide semiconductor film 17.

The transistor having such a structure includes very few defects in the multilayer film 48 including the oxide semiconductor film 17; thus, the electrical characteristics, typified by the on-state current and the field-effect mobility, of these transistors can be improved. Further, in a BT stress test and a BT photostress test that are examples of a stress test, the amount of change in threshold voltage is small, and thus, reliability is high.

The transistor illustrated in FIG. 8C can be provided with the gate electrode 40 so that a transistor can be manufactured (see FIG. 8E). The transistor illustrated in FIG. 8D can be provide with the gate electrode 40 so that a transistor can be manufactured (see FIG. 8F).

Figure 9A:
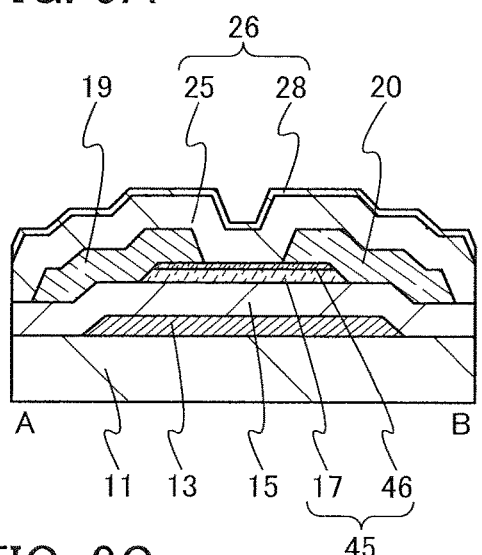
FIGS. 9A to 9D are each a cross-sectional view illustrating one embodiment of a transistor.

As shown in FIG. 9A, the protective film 26 provided over the multilayer film 45 and the pair of electrodes 19 and 20 may include the oxide insulating film 25 and the metal oxide film 28 that are formed in this order.

Figure 9B:
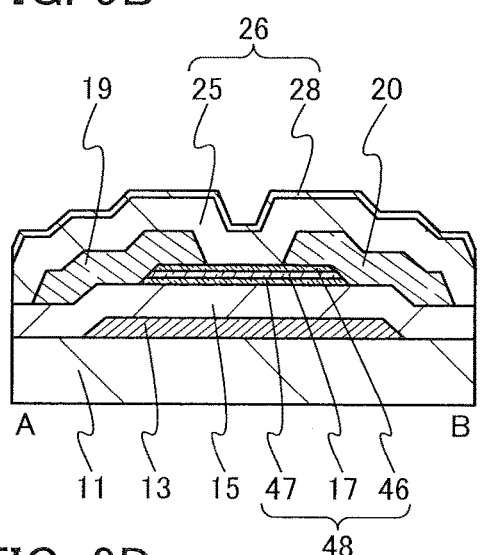

As shown in FIG. 9B, the protective film 26 provided over the multilayer film 48 and the pair of electrodes 19 and 20 may include the oxide insulating film 25 and the metal oxide film 28 that are formed in this order.

Figure 9C:
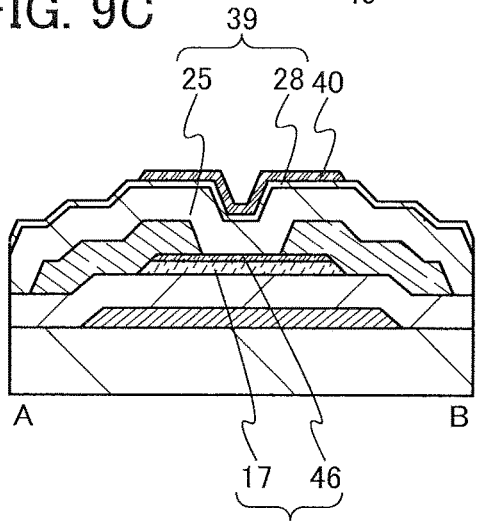

As shown in FIG. 9C, the gate insulating film 39 between the multilayer film 45 and the gate electrode 40 may include the oxide insulating film 25 and the metal oxide film 28 that are formed in this order.

Figure 9D:
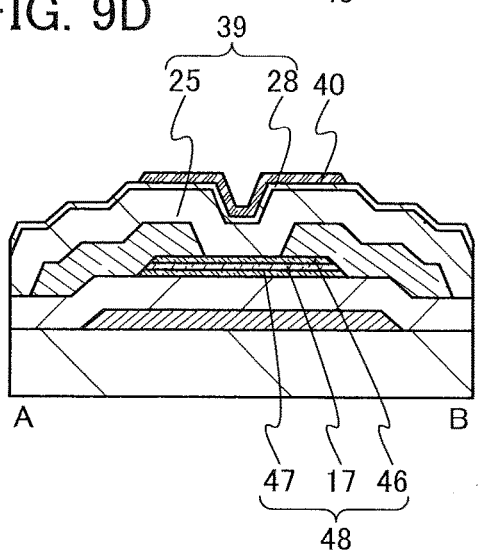

As shown in FIG. 9D, the gate insulating film 39 between the multilayer film 48 and the gate electrode 40 may include the oxide insulating film 25 and the metal oxide film 28 that are formed in this order.

Figure 10A:
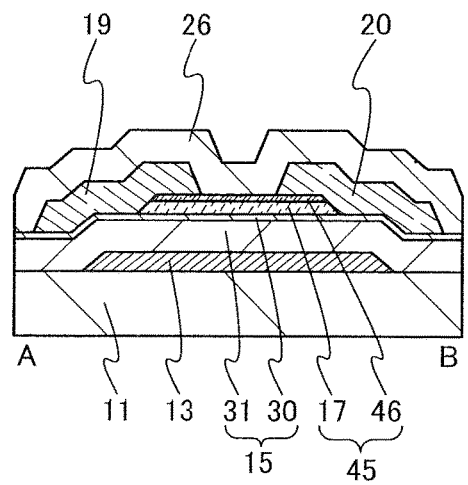
FIGS. 10A to 10D are each a cross-sectional view illustrating one embodiment of a transistor.

As shown in FIG. 10A, the gate insulating film 15 between the gate electrode 13 and the multilayer film 45 may include the oxide insulating film 31 and the metal oxide film 30 that are formed in this order.

Figure 10B:
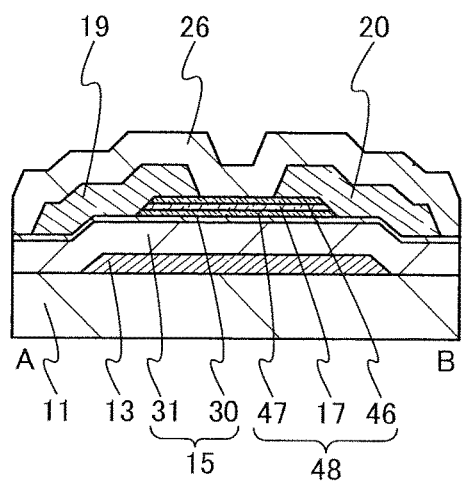

As shown in FIG. 10B, the gate insulating film 15 between the gate electrode 13 and the multilayer film 48 may include the oxide insulating film 31 and the metal oxide film 30 that are formed in this order.

Figure 10C:
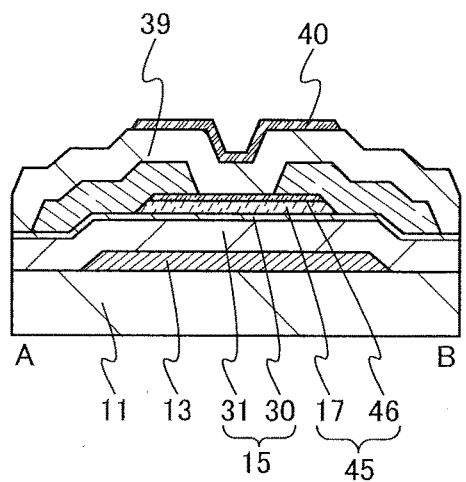

As shown in FIG. 10C, the gate insulating film 15 between the gate electrode 13 and the multilayer film 45 may include the oxide insulating film 31 and the metal oxide film 30 that are formed in this order, and furthermore, the gate insulating film 39 may be provided between the multilayer film 45 and the gate electrode 40.

Figure 10D:
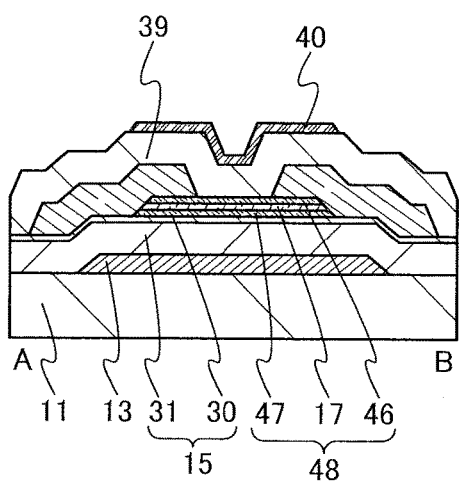

As shown in FIG. 10D, the gate insulating film 15 between the gate electrode 13 and the multilayer film 48 may include the oxide insulating film 31 and the metal oxide film 30 that are formed in this order, and furthermore, the gate insulating film 39 may be provided between the multilayer film 48 and the gate electrode 40.

Figure 11A:
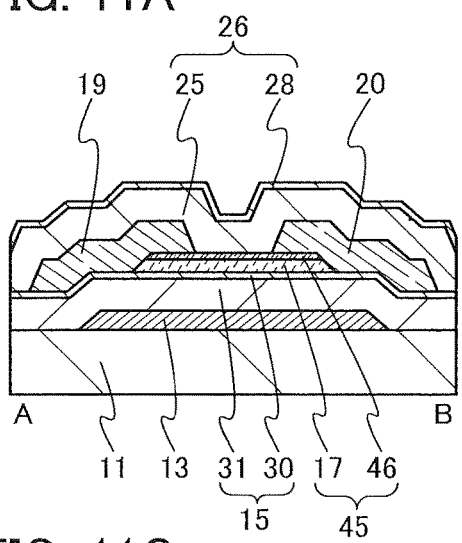
FIGS. 11A to 11D are each a cross-sectional view illustrating one embodiment of a transistor.

As shown in FIG. 11A, the gate insulating film 15 between the gate electrode 13 and the multilayer film 45 may include the oxide insulating film 31 and the metal oxide film 30 that are formed in this order, and furthermore, the protective film 26 provided over the multilayer film 45 and the pair of electrodes 19 and 20 may include the oxide insulating film 25 and the metal oxide film 28 that are formed in this order.

Figure 11B:
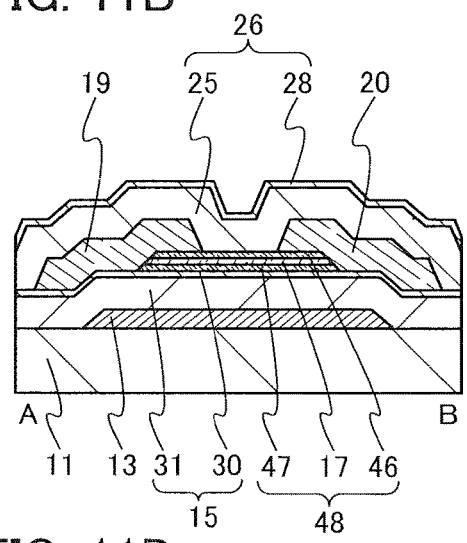

As shown in FIG. 11B, the gate insulating film 15 between the gate electrode 13 and the multilayer film 48 may include the oxide insulating film 31 and the metal oxide film 30 that are formed in this order, and furthermore, the protective film 26 provided over the multilayer film 48 and the pair of electrodes 19 and 20 may include the oxide insulating film 25 and the metal oxide film 28 that are formed in this order.

Figure 11C:
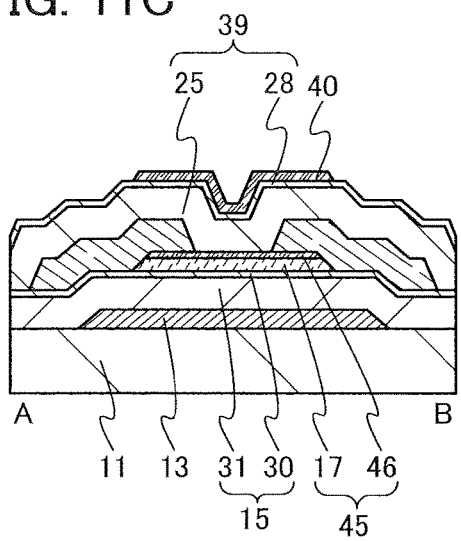

As shown in FIG. 11C, the gate insulating film 15 between the gate electrode 13 and the multilayer film 45 may include the oxide insulating film 31 and the metal oxide film 30 that are formed in this order, and furthermore, the gate insulating film 39 between the multilayer film 45 and the gate electrode 40 may include the oxide insulating film 25 and the metal oxide film 28 that are formed in this order.

Figure 11D:
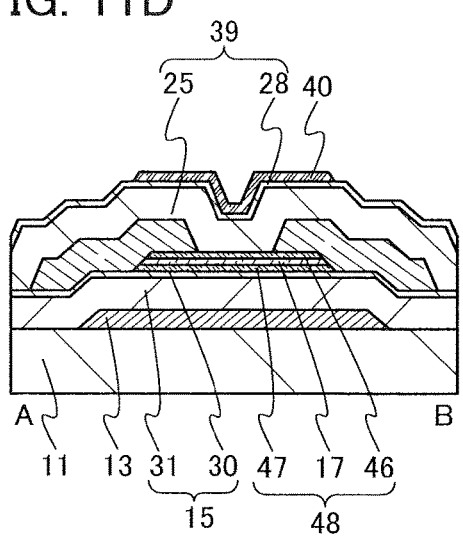

As shown in FIG. 11D, the gate insulating film 15 between the gate electrode 13 and the multilayer film 48 may include the oxide insulating film 31 and the metal oxide film 30 that are formed in this order, and furthermore, the gate insulating film 39 between the multilayer film 48 and the gate electrode 40 may include the oxide insulating film 25 and the metal oxide film 28 that are formed in this order.

<Band Structure of Transistor>

Next, band structures of the multilayer film 45 included in the transistor illustrated in FIG. 8C and the multilayer film 48 included in the transistor illustrated in FIG. 8D are described with reference to FIGS. 12A and 12B.

Here, for example, an In—Ga—Zn oxide having an energy gap of 3.15 eV is used for the oxide semiconductor film 17, and an In—Ga—Zn oxide having an energy gap of 3.5 eV is used for the oxide semiconductor film 46. The energy gaps can be measured using a spectroscopic ellipsometer (UT-300 manufactured by HORIBA JOBIN YVON SAS.).

The energy difference between the vacuum level and the valence band maximum (also called ionization potential) of the oxide semiconductor film 17 and the energy difference between the vacuum level and the valence band maximum of the oxide semiconductor film 46 are 8 eV and 8.2 eV, respectively. Note that the energy difference between the vacuum level and the valence band maximum can be measured using an ultraviolet photoelectron spectroscopy (UPS) device (VersaProbe manufactured by ULVAC-PHI, Inc.).

Thus, the energy difference between the vacuum level and the conduction band minimum (also called electron affinity) of the oxide semiconductor film 17 and the energy difference between the vacuum level and the conduction band minimum of the oxide semiconductor film 46 are 4.85 eV and 4.7 eV, respectively.

Figure 12A:
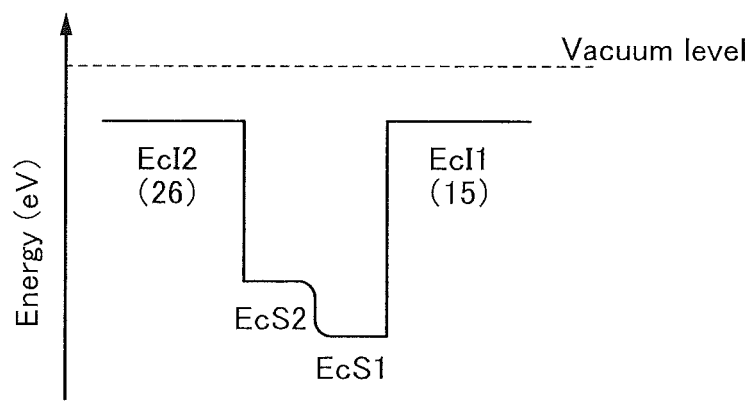
FIGS. 12A and 12B are diagrams each showing a band structure of a transistor.

FIG. 12A schematically illustrates a part of the band structure of the multilayer film 45 included in the transistor. Here, the case where silicon oxide films are used for the gate insulating film 15 and the protective film 26 and the silicon oxide films are provided in contact with the multilayer film 45 is described. In FIG. 12A, EcI1 denotes the energy of the conduction band minimum of the silicon oxide film; EcS1 denotes the energy of the conduction band minimum of the oxide semiconductor film 17; EcS2 denotes the energy of the conduction band minimum of the oxide semiconductor film 46; and EcI2 denotes the energy of the conduction band minimum of the silicon oxide film. Furthermore, EcI1 and EcI2 correspond to the gate insulating film 15 and the protective film 26 in FIG. 12B, respectively.

As illustrated in FIG. 12A, there is no energy barrier between the oxide semiconductor films 17 and 46, and the energy of the conduction band minimum gradually changes therebetween. In other words, the energy of the conduction band minimum is continuously changed. This is because the multilayer film 45 contains an element contained in the oxide semiconductor film 17 and oxygen is transferred between the oxide semiconductor films 17 and 46, so that a mixed layer is formed.

As shown in FIG. 12A, the oxide semiconductor film 17 in the multilayer film 45 serves as a well and a channel region of the transistor including the multilayer film 45 is formed in the oxide semiconductor film 17. Note that since the energy of the conduction band minimum of the multilayer film 45 is continuously changed, it can be said that the oxide semiconductor films 17 and 46 are continuous.

Although trap levels due to impurities or defects might be generated in the vicinity of the interface between the oxide semiconductor film 46 and the protective film 26, the oxide semiconductor film 17 can be distanced from the trap levels owing to the existence of the oxide semiconductor film 46. However, when the energy difference between EcS1 and EcS2 is small, an electron in the oxide semiconductor film 17 might reach the trap level across the energy difference. Since the electron is trapped at the trap level, a negative fixed charge is generated at the interface with the insulating film, causing the threshold voltage of the transistor to be shifted in the positive direction. Therefore, it is preferable that the energy difference between EcS1 and EcS2 be 0.1 eV or more, more preferably 0.15 eV or more because a change in the threshold voltage of the transistor is prevented and stable electrical characteristics are obtained.

Figure 12B:
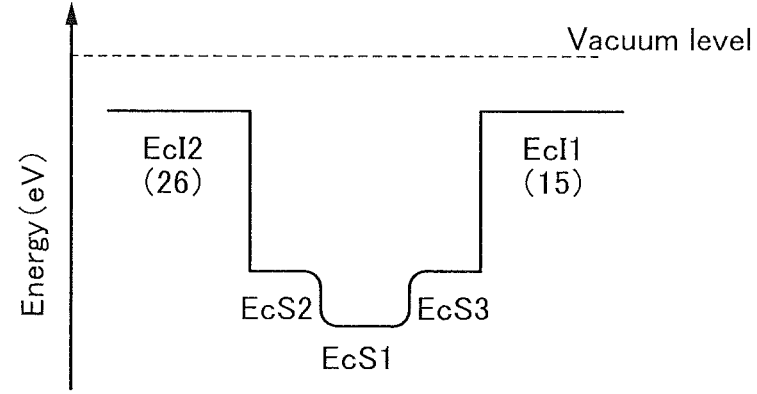

FIG. 12B schematically illustrates a part of the band structure of the multilayer film 48 included in the transistor. Here, the case where silicon oxide films are used for the gate insulating film 15 and the protective film 26 and the silicon oxide films are provided in contact with the multilayer film 48 is described. In FIG. 12B, EcI1 denotes the energy of the conduction band minimum of the silicon oxide film; EcS1 denotes the energy of the conduction band minimum of the oxide semiconductor film 17; EcS2 denotes the energy of the conduction band minimum of the oxide semiconductor film 46; EcS3 denotes the energy of the conduction band minimum of the oxide semiconductor film 47; and EcI2 denotes the energy of the conduction band minimum of the silicon oxide film. Furthermore, EcI1 and EcI2 correspond to the gate insulating film 15 and the protective film 26 in FIG. 8D, respectively.

As illustrated in FIG. 12B, there is no energy barrier between the oxide semiconductor films 47, 17, and 46, and the conduction band minimums thereof smoothly vary. In other words, the conduction band minimums are continuous. This is because the multilayer film 45 contains an element contained in the oxide semiconductor film 17 and oxygen is transferred between the oxide semiconductor films 17 and 47 and between the oxide semiconductor films 17 and 46, so that a mixed layer is formed.

As shown in FIG. 12B, the oxide semiconductor film 17 in the multilayer film 45 serves as a well and a channel region of the transistor including the multilayer film 48 is formed in the oxide semiconductor film 17. Note that since the energy of the conduction band minimum of the multilayer film 48 is continuously changed, it can be said that the oxide semiconductor films 47, 17, and 46 are continuous.

Although trap levels due to impurities or defects might be generated in the vicinity of the interface between the oxide semiconductor film 17 and the protective film 26 and in the vicinity of the interface between the oxide semiconductor film 17 and the gate insulating film 15, as illustrated in FIG. 12B, the oxide semiconductor film 17 can be distanced from the trap levels owing to the existence of the oxide semiconductor films 46 and 47. However, when the energy difference between EcS1 and EcS2 and the energy difference between EcS1 and EcS3 are small, electrons in the oxide semiconductor film 17 might reach the trap level across the energy difference. When the electrons are trapped by the trap level, a negative fixed charge is generated at the interface with the insulating film, whereby the threshold voltage of the transistor shifts in the positive direction. Thus, it is preferable that the energy difference between EcS1 and EcS2 and the energy difference between EcS1 and EcS3 be 0.1 eV or more, further preferably 0.15 eV or more, because a change in the threshold voltage of the transistor is reduced and stable electrical characteristics are obtained.

Instead of the oxide semiconductor film 46, a metal oxide film formed of an In-M oxide (M is Al, Ga, Y, Zr, La, Ce, or Nd) can be used. Note that to prevent the metal oxide film from functioning as part of a channel region, a material having sufficiently low conductivity is used for the metal oxide film. Alternatively, a material which has a smaller electron affinity (an energy difference between a vacuum level and a conduction band minimum) than the oxide semiconductor film 17 and has a difference in conduction band minimum from the oxide semiconductor film 17 (band offset) is used for the metal oxide film. Furthermore, to inhibit generation of a difference between threshold voltages due to the value of the drain voltage, it is preferable to use a metal oxide film whose conduction band minimum is closer to the vacuum level than the conduction band minimum of the oxide semiconductor film 17 is by 0.2 eV or more, preferably 0.5 eV or more.

When an atomic ratio of M to In (M/In) is increased, the energy gap of the metal oxide film is increased and the electron affinity thereof can be small. In the case where a material containing an In-M oxide (M is Al, Ga, Y, Zr, La, Ce, or Nd) is used for the metal oxide film, for example, and where the atomic ratio of In to M in the metal oxide film is x:y, $y/(x+y)$ is preferably greater than or equal to 0.75 and less than or equal to 1, further preferably greater than or equal to 0.78 and less than or equal to 1, still further preferably greater than or equal to 0.80 and less than or equal to 1 in order to form a conduction band offset between the metal oxide film and the oxide semiconductor film 17 and inhibit a channel from being formed in the metal oxide film. Note that an element other than indium, M, and oxygen that are main components may be mixed in the metal oxide film as an impurity. In that case, the impurity preferably accounts for less than or equal to 0.1% of the metal oxide film.

In the case where the metal oxide film is formed by a sputtering method, when the atomic ratio of the element M to In is increased, the number of particles in deposition can be reduced. To reduce the number of particles, when the atomic ratio is In:M=x:y, $y/(x+y)$ may be greater than or equal to 0.90, e.g., 0.93. Note that in the case where the metal oxide film is formed by a sputtering method, when the atomic ratio of M to In is too high, the insulating property of a target becomes high, which makes it difficult to perform deposition using DC discharge; as a result, it is necessary to use RF discharge. Accordingly, when deposition is performed using DC discharge, which is applicable to the case of using a large-sized substrate, y/(x +y) is set less than or equal to 0.96, preferably less than or equal to 0.95, e.g., 0.93. The use of the deposition method applicable to the case of using a large-sized substrate can increase the productivity of the semiconductor device.

Note that it is preferable that the metal oxide film not have a spinel crystal. This is because if a metal oxide film 110 has a spinel crystal, a constituent element of the pair of electrodes 19 and 20 might be diffused into the oxide semiconductor film 17 through the region between the spinel crystal and another region. For example, it is preferable that an In-M oxide film be used as the metal oxide film and that a divalent metal element (e.g., zinc) not be contained as M, in which case the formed metal oxide film does not have a spinel crystal structure.

The thickness of the metal oxide film is greater than or equal to a thickness that is capable of inhibiting diffusion of the constituent element of the pair of electrodes 19 and 20 into the oxide semiconductor film 17, and less than a thickness which inhibits supply of oxygen from the protective film 26 to the oxide semiconductor film 17. For example, when the thickness of the metal oxide film is greater than or equal to 10 nm, the constituent element of the pair of electrodes 19 and 20 can be prevented from diffusing into the oxide semiconductor film 17. When the thickness of the metal oxide film is less than or equal to 100 nm, oxygen can be effectively supplied from the protective film 26 to the oxide semiconductor film 17.

Embodiment 4

In this embodiment, a semiconductor device and a manufacturing method thereof, which are different from those in Embodiment 1, are described with reference to drawings. Transistors of this embodiment are top-gate transistors, which are different from the transistors in Embodiment 1 and Embodiment 2.

<1. Structure of Transistor>

Figure 13A:
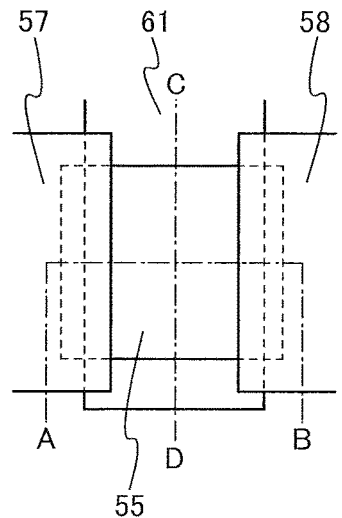
FIGS. 13A to 13F are a top view and cross-sectional views illustrating one embodiment of a transistor.
Figure 13B:
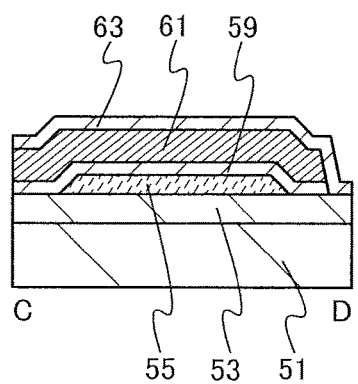
Figure 13C:
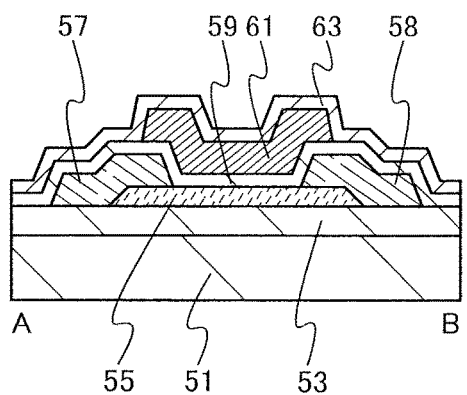
Figure 13D:
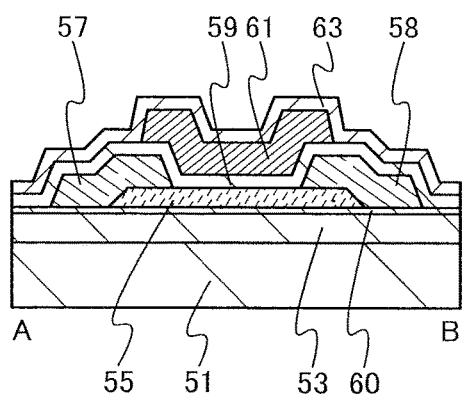
Figure 13E:
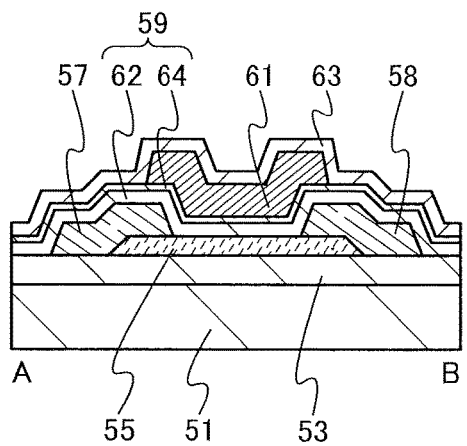
Figure 13F:
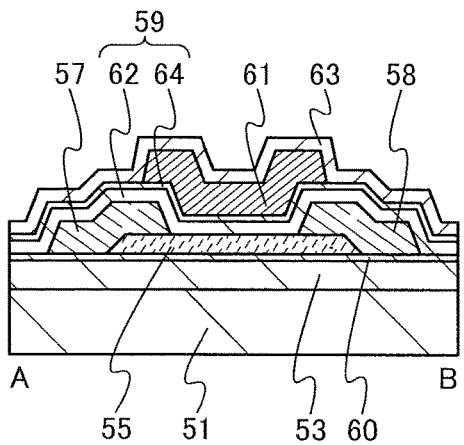

FIG. 13A to 13F are a top view and cross-sectional views of a transistor. FIG. 13A is a top view of the transistor, FIG. 13B is a cross-sectional view taken along dashed-dotted line C-D in FIG. 13A, and FIG. 13C is a cross-sectional view taken along dashed-dotted line A-B in FIG. 13A. FIGS. 13D to 13F are modification examples of FIG. 13C.

The transistor illustrated in FIGS. 13A to 13C includes an oxide semiconductor film 55 over a protective film 53; a pair of electrodes 57 and 58 in contact with the oxide semiconductor film 55; a gate insulating film 59 in contact with the oxide semiconductor film 55 and the pair of electrodes 57 and 58; and a gate electrode 61 overlapping with the oxide semiconductor film 55 with the gate insulating film 59 therebetween. An insulating film 63 may be provided over the protective film 53, the pair of electrodes 57 and 58, the gate insulating film 59, and the gate electrode 61.

In this embodiment, the film in contact with the oxide semiconductor film 55, typically at least one of the protective film 53 and the gate insulating film 59, includes an oxide insulating film. The etching rate of the oxide insulating film is higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. In other words, at least one of the protective film 53 and the gate insulating film 59 includes an oxide insulating film to which oxygen is added. In other words, at least one of the protective film 53 and the gate insulating film 59 includes an oxide insulating film containing more oxygen than that in the stoichiometric composition. In other words, at least one of the protective film 53 and the gate insulating film 59 is an oxide insulating film which releases oxygen by heat treatment. At least one of the protective film 53 and the gate insulating film 59 can be formed in a manner similar to that of the gate insulating film 15 and the protective film 26 shown in FIG. 1B.

The oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. is used as at least one of the protective film 53 and the gate insulating film 59, and heat treatment is performed, whereby oxygen contained in the oxide insulating film can be transferred to the oxide semiconductor film, and the amount of oxygen vacancies in the oxide semiconductor film can be reduced. As a result, the transistor including the oxide semiconductor film can have highly reliable electrical characteristics.

As shown in FIG. 13D, a metal oxide film 60 may be provided between the protective film 53 and the oxide semiconductor film 55.

As shown in FIG. 13E, the gate insulating film 59 may include an oxide insulating film 62 and a metal oxide film 64 that are formed in this order.

As shown in FIG. 13F, the metal oxide film 60 may be provided between the protective film 53 and the oxide semiconductor film 55, and furthermore, the gate insulating film 59 may include the oxide insulating film 62 and the metal oxide film 64 that are formed in this order.

The oxide insulating film 62 can be formed in a manner similar to that of the oxide insulating film 25 shown in FIG. 1D.

Each of the metal oxide films 60 and 64 can be formed in a manner similar to that of the metal oxide film 28 shown in FIG. 1D.

Figure 31:
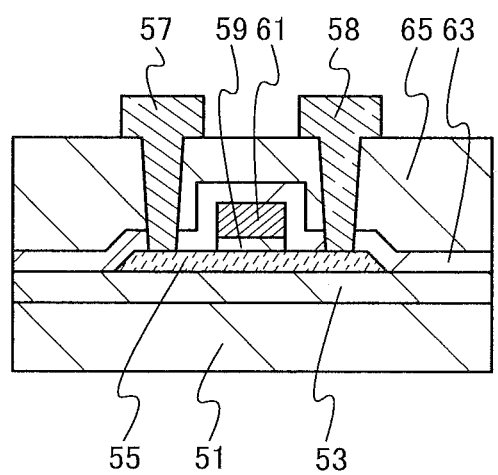
FIG. 31 is a cross-sectional view illustrating one embodiment of a transistor.

In a transistor shown in FIG. 31, a film in contact with the oxide semiconductor film 55, typically at least one of the protective film 53 and the gate insulating film 59 may include an oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C.

The transistor illustrated in FIG. 31 includes the oxide semiconductor film 55 over the protective film 53; the gate insulating film 59 in contact with the oxide semiconductor film 55; and the gate electrode 61 overlapping with the oxide semiconductor film 55 with the gate insulating film 59 therebetween. The insulating film 63 may be provided over the protective film 53, the oxide semiconductor film 55, the gate insulating film 59, and the gate electrode 61. An insulating film 65 may be formed over the insulating film 63. The pair of electrodes 57 and 58 may be formed in opening portions in the insulating films 63 and 65. The pair of electrodes 57 and 58 are in contact with the oxide semiconductor film 55.

Note that when an element which forms an oxygen vacancy is added to the oxide semiconductor film 55 using the gate electrode 61 as a mask, a low-resistance region can be formed in the oxide semiconductor film 55. Typical examples of the element which forms an oxygen vacancy are hydrogen, boron, carbon, nitrogen, fluorine, aluminum, silicon, phosphorus, chlorine, and rare gas elements. Typical examples of rare gas elements are helium, neon, argon, krypton, and xenon.

In the case where the insulating film 63 is an insulating film containing hydrogen, hydrogen contained in the insulating film 63 is diffused into the oxide semiconductor film 55. As a result, a low-resistance region can be formed in a region in contact with the insulating film 63 in the oxide semiconductor film 55. Typical examples of the insulating film containing hydrogen include a silicon nitride film and an aluminum nitride film.

Other details of the transistor are described below.

As the substrate 51, a substrate given as an example of the substrate 11 of Embodiment 1 can be used as appropriate.

In the case where the gate insulating film 59 is formed using an oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C., the protective film 53 can be formed using silicon oxide, silicon oxynitride, silicon nitride oxide, gallium oxide, hafnium oxide, yttrium oxide, aluminum oxide, aluminum oxynitride, or the like.

The thickness of the protective film 53 can be greater than or equal to 50 nm, preferably greater than or equal to 200 nm and less than or equal to 3000 nm, preferably greater than or equal to 300 nm and less than or equal to 1000 nm. In the case where the protective film 53 is thick and formed using an oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C., the amount of oxygen molecules released from the protective film 53 can be increased, and furthermore, the interface state density at the interface between the protective film 53 and the oxide semiconductor film formed later can be reduced.

The oxide semiconductor film 55 can be formed in a manner similar to that of the oxide semiconductor film 17 in Embodiment 1.

The pair of electrodes 57 and 58 can be formed in a manner similar to that of the pair of electrodes 19 and 20 in Embodiment 1.

Note that although the pair of electrodes 57 and 58 are provided between the oxide semiconductor film 55 and the gate insulating film 59 in this embodiment, the pair of electrodes 57 and 58 may be provided between the protective film 53 and the oxide semiconductor film 55.

In the case where the protective film 53 is formed using an oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C., the gate insulating film 59 is formed with a single-layer structure or a stacked-layer structure using, for example, silicon oxide, silicon oxynitride, silicon nitride oxide, silicon nitride, aluminum oxide, hafnium oxide, gallium oxide, a Ga—Zn oxide, or the like. Note that the oxide insulating film is preferably used for at least a region of the gate insulating film 59 which is in contact with the oxide semiconductor film 55 in order to improve characteristics of the interface with the oxide semiconductor film 55.

Furthermore, it is possible to prevent outward diffusion of oxygen from the oxide semiconductor film 55 and entry of hydrogen, water, or the like into the oxide semiconductor film 55 from the outside by providing an insulating film having an effect of blocking oxygen, hydrogen, water, and the like as the gate insulating film 59. The insulating film having an effect of blocking oxygen, hydrogen, water, and the like is formed using aluminum oxide, aluminum oxynitride, gallium oxide, gallium oxynitride, yttrium oxide, yttrium oxynitride, hafnium oxide, hafnium oxynitride, or the like.

The gate insulating film 59 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 59 is, for example, greater than or equal to 5 nm and less than or equal to 400 nm, preferably greater than or equal to 10 nm and less than or equal to 300 nm, preferably greater than or equal to 15 nm and less than or equal to 100 nm.

The gate electrode 61 can be formed in a manner similar to that of the gate electrode 13 of Embodiment 1.

The insulating film 63 is formed with a single-layer structure or a stacked-layer structure of one or more of a silicon oxide film, a silicon oxynitride film, a silicon nitride oxide film, a silicon nitride film, an aluminum oxide film, an aluminum oxynitride film, an aluminum nitride oxide film, an aluminum nitride film, and the like to a thickness greater than or equal to 30 nm and less than or equal to 500 nm, preferably greater than or equal to 100 nm and less than or equal to 400 nm.

The insulating film 63 may have a stacked-layer structure of an insulating film having a blocking property against hydrogen, water, and the like and an oxide insulating film like the protective film 53, i.e., an oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. As the insulating film having an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film can be given as examples. In the case where such insulating films are used, in heat treatment, oxygen contained in the gate insulating film 59 and/or the protective film 53 is supplied to the oxide semiconductor film 55, which enables a reduction in the interface state density between the oxide semiconductor film 55 and the gate insulating film 59 and/or the interface state density between the oxide semiconductor film 55 and the protective film 53. Furthermore, the amount of oxygen vacancies in the oxide semiconductor film 55 can be reduced.

<2. Method for Manufacturing Transistor>

Next, a method for manufacturing the transistor in FIGS. 13A to 13C is described with reference to FIGS. 14A to 14E. A cross-section in the channel length direction along dot-dashed line A-B in FIG. 13A and a cross-section in the channel width direction along dot-dashed line C-D in FIG. 13A are used to describe the method for manufacturing the transistor.

Figure 14A:
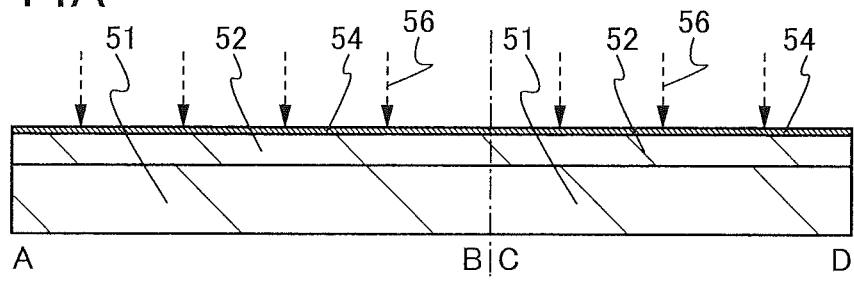
FIGS. 14A to 14E are cross-sectional views illustrating one embodiment of a method for manufacturing a transistor.

First, the oxide insulating film 52 is formed over the substrate 51 as shown in FIG. 14A. Next, a film 54 is formed over the oxide insulating film 52. Then, oxygen 56 is added to the oxide insulating film 52 through the film 54. Note that oxygen is also added to the film 54 in this step.

The film 54 can be formed by the formation method of the film 22 in Embodiment 1 as appropriate.

As a method for adding the oxygen 56, the method for adding the oxygen 24 in Embodiment 1 can be employed as appropriate.

Figure 14B:
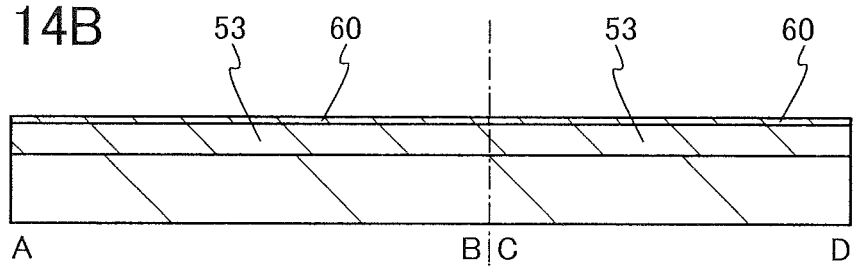

Through the above-described steps, the protective film 53 formed using the oxide insulating film which is etched at an etching rate of higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min, when the oxide insulating film is immersed in a 0.5 wt/vol % hydrofluoric acid at 24° C. and the metal oxide film 60 can be formed as shown in FIG. 14B.

Figure 14C:
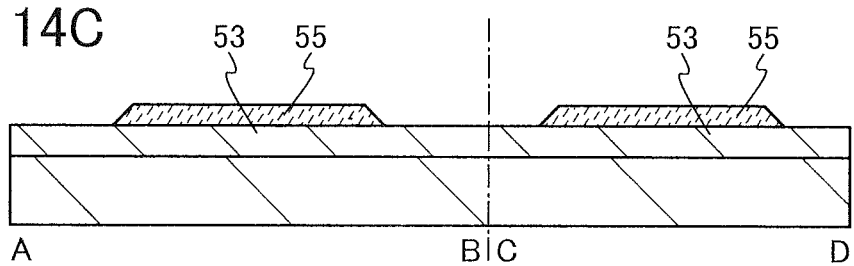

Next, the oxide semiconductor film 55 is formed over the protective film 53 as shown in FIG. 14C.

The oxide semiconductor film 55 can be formed as appropriate by a formation method similar to that of the oxide semiconductor film 17 described in Embodiment 1.

In order to improve the orientation of the crystal parts in the CAAC-OS film, planarity of the surface of the protective film 53 serving as a base insulating film of the oxide semiconductor film is preferably improved. Typically, the protective film 53 preferably has an average surface roughness (Ra) of 1 nm or less, 0.3 nm or less, or 0.1 nm or less.

As planarization treatment for improving planarity of the surface of the protective film 53, one or more can be selected from chemical mechanical polishing (CMP) treatment, dry etching treatment, plasma treatment (what is called reverse sputtering), and the like. The plasma treatment is the one in which minute unevenness of the surface is reduced by introducing an inert gas such as an argon gas into a vacuum chamber and applying an electric field so that a surface to be processed serves as a cathode.

Figure 14D:
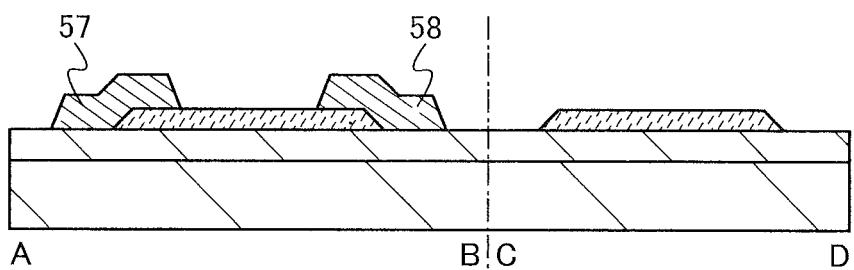

Next, as illustrated in FIG. 14D, the pair of electrodes 57 and 58 are formed. The pair of electrodes 57 and 58 can be formed as appropriate by a formation method similar to that of the pair of electrodes 19 and 20 described in Embodiment 1. Alternatively, the pair of electrodes 57 and 58 can be formed by a printing method or an inkjet method.

Figure 14E:
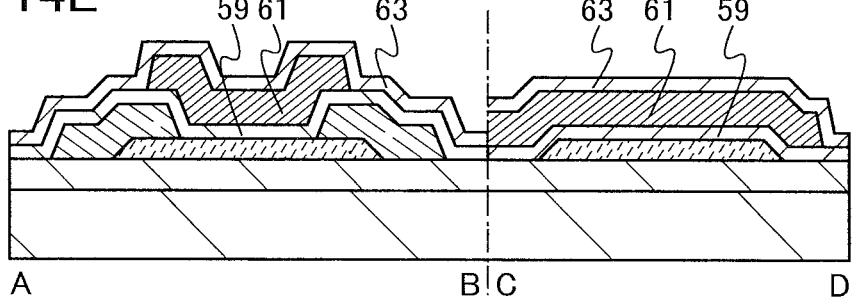

Next, the gate insulating film 59, the gate electrode 61, and the insulating film 63 are formed as shown in FIG. 14E.

The gate insulating film 59 is formed by a sputtering method, a CVD method, an evaporation method, or the like. A film to be the gate electrode 61 is formed by a sputtering method, a CVD method, an evaporation method, or the like.

A conductive film is formed over the gate insulating film 59 by a sputtering method, a CVD method, an evaporation method, or the like. Then, a mask is formed over the conductive film by a photolithography process. After that, parts of the insulating film and the conductive film are etched using the mask to form the gate electrode 61. After that, the mask is removed.

The insulating film 63 can be formed as appropriate by a sputtering method, a CVD method, a printing method, a coating method, or the like.

Next, in a manner similar to that in Embodiment 1, heat treatment may be performed. The heat treatment is performed typically at a temperature higher than or equal to 150° C. and lower than the strain point of the substrate, preferably higher than or equal to 250° C. and lower than or equal to 450° C., more preferably higher than or equal to 300° C. and lower than or equal to 450° C.

Through the above-described steps, the transistor shown in FIG. 13C can be manufactured.

Note that the transistor shown in FIG. 13D can be manufactured by performing the steps shown in FIGS. 14C to 14E with the metal oxide film 60 in FIG. 14B left.

By this embodiment, a transistor in which a shift in the threshold voltage is reduced can be manufactured. Further, a transistor in which a change in electrical characteristics is reduced can be manufactured.

Note that the structures, methods, and the like described in this embodiment can be used as appropriate in combination with any of the structures, methods, and the like described in the other embodiments and examples.

MODIFICATION EXAMPLE 1

A modification example of the transistor described in Embodiment 4 is described with reference to FIGS. 15A to 15F. In this modification example, a transistor in which an oxide semiconductor film is provided between a gate insulating film and a pair of electrodes is described.

Figure 15A:
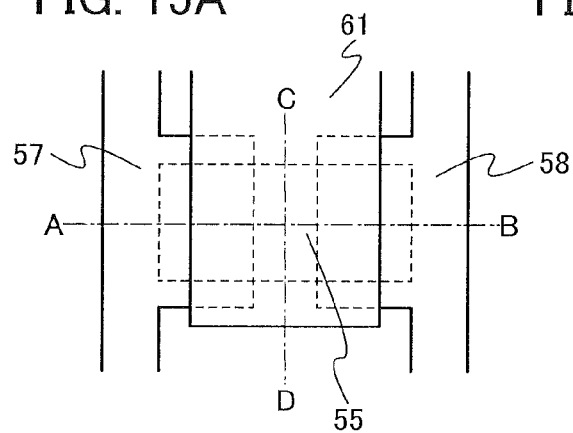
FIGS. 15A to 15F are a top view and cross-sectional views illustrating one embodiment of a transistor.
Figure 15B:
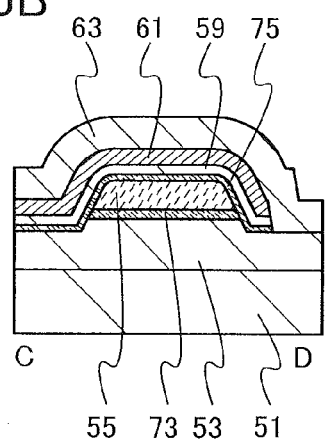
Figure 15C:
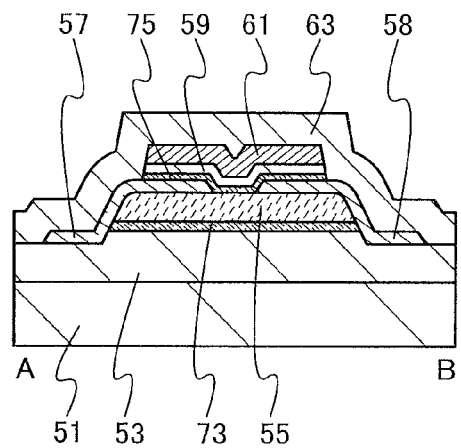
Figure 15D:
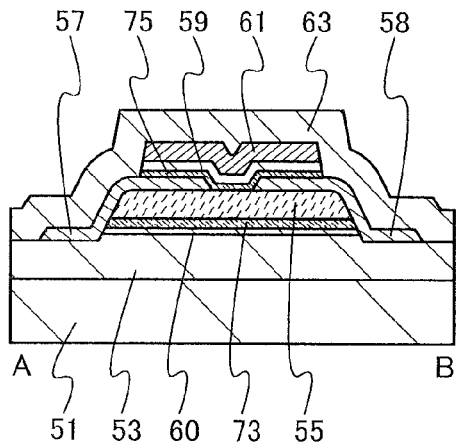
Figure 15E:
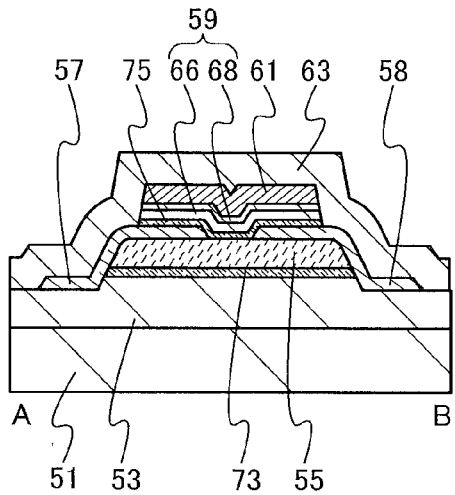
Figure 15F:
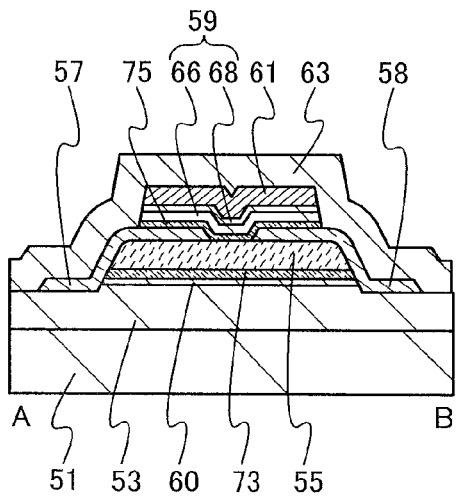

FIGS. 15A to 15C are a top view and cross-sectional views of a transistor included in a semiconductor device of one embodiment of the present invention. FIG. 15A is a top view, FIG. 15B is a cross-sectional view taken along dashed-dotted line C-D in FIG. 15A, and FIG. 15C is a cross-sectional view taken along dashed-dotted line A-B in FIG. 15A. FIGS. 15D to 15F are modification examples of FIG. 15C.

The transistor illustrated in FIGS. 15A to 15C includes an oxide semiconductor film 73 over the protective film 53; the oxide semiconductor film 55 over the oxide semiconductor film 73; the pair of electrodes 57 and 58 in contact with the oxide semiconductor film 55 and the oxide semiconductor film 73; an oxide semiconductor film 75 in contact with the oxide semiconductor film 55 and the pair of electrodes 57 and 58; the gate insulating film 59 over the oxide semiconductor film 75; and the gate electrode 61 overlapping with the oxide semiconductor film 55 with the gate insulating film 59 therebetween. The insulating film 63 may be provided over the protective film 53, the pair of electrodes 57 and 58, the oxide semiconductor film 75, the gate insulating film 59, and the gate electrode 61.

In the transistor, the protective film 53 has a projecting portion, and the oxide semiconductor films 73 and 55 are stacked in this order over the projecting portion of the protective film 53.

As shown in FIG. 15D, the metal oxide film 60 may be provided between the protective film 53 and the oxide semiconductor film 55.

As shown in FIG. 15E, the gate insulating film 59 may include an oxide insulating film 66 and a metal oxide film 68 that are formed in this order.

As shown in FIG. 15F, the metal oxide film 60 may be provided between the protective film 53 and the oxide semiconductor film 55, and furthermore, the gate insulating film 59 may include the oxide insulating film 66 and the metal oxide film 68 that are formed in this order.

The oxide insulating film 66 can be formed in a manner similar to that of the oxide insulating film 25 shown in FIG. 1D.

Each of the metal oxide films 60 and 68 can be formed in a manner similar to that of the metal oxide film 28 shown in FIG. 1D.

As illustrated in FIG. 15C, the oxide semiconductor film 75 is in contact with the top surface of the oxide semiconductor film 55 and the top and side surfaces of the pair of electrodes 57 and 58. As illustrated in FIG. 15B, the oxide semiconductor film 75 is in contact with a side surface of the projecting portion of the protective film 53, a side surface of the oxide semiconductor film 73, and the top and side surfaces of the oxide semiconductor film 55.

As illustrated in FIG. 15B, in the channel width direction of the transistor, the gate electrode 61 faces the top and side surfaces of the oxide semiconductor film 55 with the oxide semiconductor film 75 and the gate insulating film 59 therebetween.

The gate electrode 61 electrically surrounds the oxide semiconductor film 55. With this structure, on-state current of the transistor can be increased. Such a transistor structure is referred to as a surrounded channel (s-channel) structure. Note that in the s-channel structure, current flows in the whole (bulk) of the oxide semiconductor film 55. Since current flows in an inner part of the oxide semiconductor film 55, the current is hardly affected by interface scattering, and on-state current can be increased. In addition, by making the oxide semiconductor film 55 thick, on-state current can be increased.

In fabricating a transistor with a small channel length and a small channel width, when a pair of electrodes, an oxide semiconductor film, or the like is processed while a resist mask is reduced in size, the pair of electrodes, the oxide semiconductor film, or the like has a round end portion (curved surface) in some cases. With this structure, the coverage with the oxide semiconductor film 75 and the gate insulating film 59, which are to be formed over the oxide semiconductor film 55, can be improved. In addition, electric field concentration which might occur at the edges of the pair of electrodes 57 and 58 can be relaxed, which can suppress deterioration of the transistor.

Miniaturization of a transistor leads to high integration and high density. For example, the channel length of the transistor can be less than or equal to 100 nm, preferably less than or equal to 40 nm, more preferably less than or equal to 30 nm, still more preferably less than or equal to 20 nm, and the channel width of the transistor can be less than or equal to 100 nm, preferably less than or equal to 40 nm, more preferably less than or equal to 30 nm, still more preferably less than or equal to 20 nm. The transistor of one embodiment of the present invention has an s-channel structure. Therefore, even when the channel width is shortened to the above range, on-state current can be increased.

For the oxide semiconductor film 73, the material of the oxide semiconductor film 46 described in Embodiment 3 can be used as appropriate. Before a film to be the oxide semiconductor film 55 is formed in FIG. 14C, a film to be the oxide semiconductor film 73 is formed. Then, the film to be the oxide semiconductor film 73 and the film to be the oxide semiconductor film 55 are processed, whereby the oxide semiconductor film 73 and the oxide semiconductor film 55 can be obtained.

For the oxide semiconductor film 75, the material of the oxide semiconductor film 47 in Embodiment 3 can be used as appropriate. Before a film to be the gate insulating film 59 is formed in FIG. 14E, a film to be the oxide semiconductor film 75 is formed. Then, the film to be the gate insulating film 59 and a film to be the gate electrode 61 are formed. After that, the films are processed at the same time, whereby the oxide semiconductor film 75, the gate insulating film 59, and the gate electrode 61 can be obtained.

The thickness of the oxide semiconductor film 73 may be set as appropriate as long as formation of an interface state at the interface with the oxide semiconductor film 55 is inhibited. For example, the oxide semiconductor film 55 includes a region whose thickness is larger than that of the oxide semiconductor film 73, preferably 2 times or more, further preferably 4 times or more, still further preferably 6 times or more as large as that of the oxide semiconductor film 73. Note that the above does not apply in the case where the on-state current of the transistor need not be increased, and the oxide semiconductor film 73 may include a region whose thickness is equal to or greater than that of the oxide semiconductor film 55.

The oxide semiconductor film 75 includes a region whose thickness is set as appropriate, in a manner similar to that of the oxide semiconductor film 73, as long as formation of an interface state at the interface with the oxide semiconductor film 55 is inhibited. For example, the oxide semiconductor film 75 includes a region whose thickness is smaller than or equal to that of the oxide semiconductor film 73. If the oxide semiconductor film 75 is thick, it may become difficult for the electric field from the gate electrode 61 to reach the oxide semiconductor film 55; thus, it is preferable that the oxide semiconductor film 75 be thin. For example, the oxide semiconductor film 75 includes a region thinner than the oxide semiconductor film 55. Note that the thickness of the oxide semiconductor film 75 is not limited to the above, and may be set as appropriate depending on a driving voltage of the transistor in consideration of the withstand voltage of the gate insulating film 59.

High integration of a semiconductor device requires miniaturization of a transistor. However, it is known that miniaturization of a transistor causes degradation of the electric characteristics of the transistor. When a channel width is decreased, the on-state current becomes low.

However, in the transistor of one embodiment of the present invention, as described above, the oxide semiconductor film 75 is formed to cover the channel formation region of the oxide semiconductor film 55, and the channel formation region and the gate insulating film 59 are not in contact with each other. Therefore, scattering of carriers formed at the interface between the oxide semiconductor film 55 and the gate insulating film 59 can be suppressed, whereby on-state current of the transistor can be increased.

In the case where an oxide semiconductor film is an intrinsic or substantially intrinsic oxide semiconductor film, it is concerned that the field-effect mobility is decreased because of a reduction in the number of carriers in the oxide semiconductor film. However, in the transistor of one embodiment of the present invention, a gate electric field is applied to the oxide semiconductor film 55 not only in the vertical direction but also from the side surfaces. That is, the gate electric field is applied to the whole of the oxide semiconductor film 55, whereby current flows in the bulk of the oxide semiconductor film 55. Consequently, a change in the electrical characteristics can be suppressed owing to the highly purified intrinsic oxide semiconductor layer and the field-effect mobility of the transistor can be increased.

In the transistor of one embodiment of the present invention, the oxide semiconductor film 55 is formed over the oxide semiconductor film 73, so that an interface state is less likely to be formed. In addition, impurities do not enter the oxide semiconductor film 55 from above and below because the oxide semiconductor film 55 are provided between the oxide semiconductor films 73 and 75. Thus, the oxide semiconductor film 55 is surrounded by the oxide semiconductor film 73 and the oxide semiconductor film 75 (also electrically surrounded by the gate electrode 61), so that stabilization of the threshold voltage in addition to the above-described increase of on-state current of the transistor is possible. As a result, current flowing between the source and the drain when the voltage of the gate electrode is 0 V can be reduced, which leads to lower power consumption. Further, the threshold voltage of the transistor becomes stable; thus, long-term reliability of the semiconductor device can be improved.

As described above, the transistor of one embodiment of the present invention can be a transistor of various types. Depending on the case or situation, a planar type transistor, a FIN-type transistor, a TRI-GATE transistor, or the like can be used, for example.

Note that the structures, methods, and the like described in this embodiment can be used as appropriate in combination with any of the structures, methods, and the like described in the other embodiments and examples.

Embodiment 5

In this embodiment, a structural example of a display panel of one embodiment of the present invention is described.

STRUCTURAL EXAMPLE

Figure 16A:
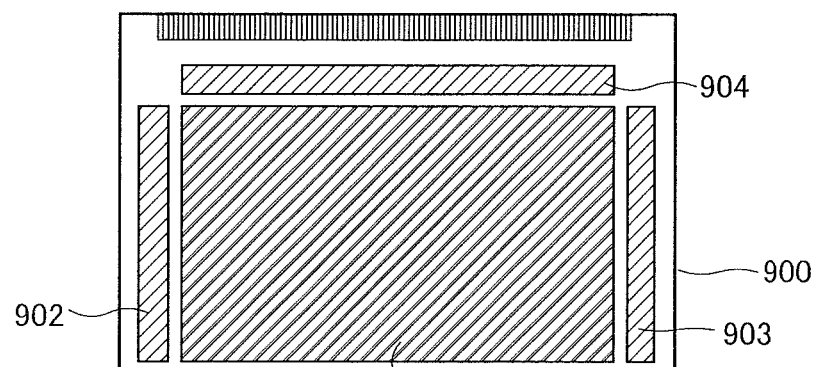
FIGS. 16A to 16C illustrate a structure of a display panel of an embodiment.
Figure 16B:
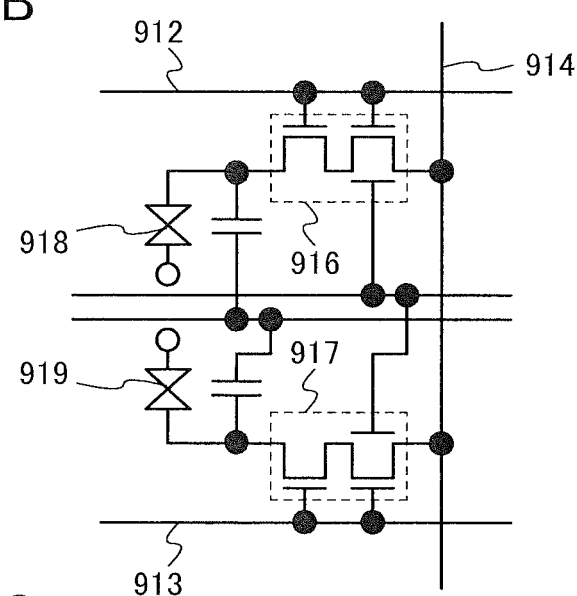
Figure 16C:
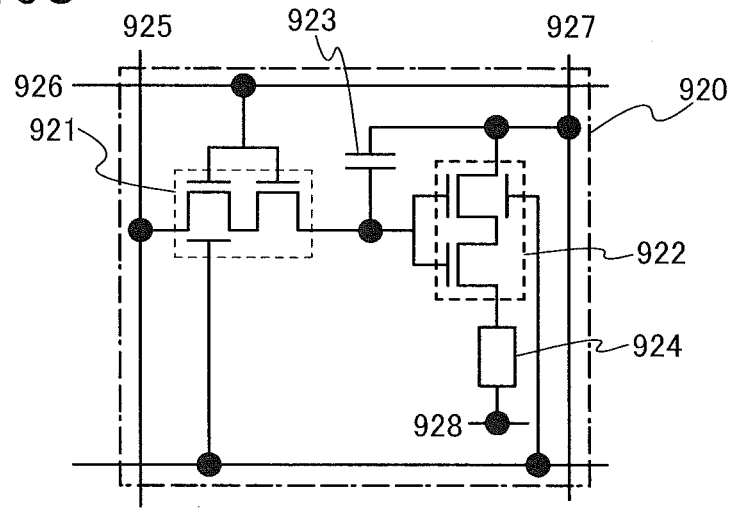

FIG. 16A is a top view of the display panel of one embodiment of the present invention. FIG. 16B is a circuit diagram illustrating a pixel circuit that can be used in the case where a liquid crystal element is used in a pixel in the display panel of one embodiment of the present invention. FIG. 16C is a circuit diagram illustrating a pixel circuit that can be used in the case where an organic EL element is used in a pixel in the display panel of one embodiment of the present invention.

The transistor in the pixel portion can be formed in accordance with the above embodiments. Further, the transistor can easily be an n-channel transistor, and thus, part of a driver circuit that can be formed using an n-channel transistor in the driver circuit is formed over the same substrate as the transistor of the pixel portion. With the use of any of the transistors described in the above embodiments for the pixel portion or the driver circuit in this manner, a highly reliable display device can be provided.

FIG. 16A illustrates an example of a block diagram of an active matrix display device. A pixel portion 901, a first scan line driver circuit 902, a second scan line driver circuit 903, and a signal line driver circuit 904 are provided over a substrate 900 in the display device. In the pixel portion 901, a plurality of signal lines extended from the signal line driver circuit 904 are arranged, and a plurality of scan lines extended from the first scan line driver circuit 902 and the second scan line driver circuit 903 are arranged. Pixels each including a display element are provided in matrix in respective regions in each of which the scan line and the signal line intersect with each other. The substrate 900 of the display device is connected to a timing control circuit (also referred to as controller or control IC) through a connection portion such as a flexible printed circuit (FPC).

In FIG. 16A, the first scan line driver circuit 902, the second scan line driver circuit 903, and the signal line driver circuit 904 are formed over the same substrate 900 as the pixel portion 901. Accordingly, the number of components provided outside, such as a driver circuit, is reduced, so that a reduction in cost can be achieved. Further, if the driver circuit is provided outside the substrate 900, wirings would need to be extended and the number of wiring connections would increase. However, by providing the driver circuit over the substrate 900, the number of wiring connections can be reduced and the reliability or yield can be improved.

<Liquid Crystal Panel>

FIG. 16B illustrates an example of a circuit configuration of the pixel. Here, a pixel circuit that can be used in a pixel of a VA liquid crystal display panel is illustrated.

This pixel circuit can be used in a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 912 of a transistor 916 and a gate wiring 913 of a transistor 917 are separated so that different gate signals can be given thereto. In contrast, a source or drain electrode 914 serving as a data line is used in common for the transistors 916 and 917. Any of the transistors described in the above embodiments can be used as appropriate as each of the transistors 916 and 917. In this way, a highly reliable liquid crystal display panel can be provided.

The shapes of a first pixel electrode electrically connected to the transistor 916 and a second pixel electrode electrically connected to the transistor 917 are described. The first pixel electrode and the second pixel electrode are separated. Shapes of the first pixel electrode and the second pixel electrode are not especially limited. For example, the first pixel electrode may have a V-shape.

A gate electrode of the transistor 916 is connected to the gate wiring 912, and a gate electrode of the transistor 917 is connected to the gate wiring 913. When different gate signals are supplied to the gate wiring 912 and the gate wiring 913, operation timings of the transistor 916 and the transistor 917 can be varied. As a result, alignment of liquid crystals can be controlled.

Further, a storage capacitor may be formed using a capacitor wiring 910, a gate insulating film serving as a dielectric, and a capacitor electrode electrically connected to the first pixel electrode or the second pixel electrode.

The multi-domain pixel includes a first liquid crystal element 918 and a second liquid crystal element 919. The first liquid crystal element 918 includes the first pixel electrode, a counter electrode, and a liquid crystal layer therebetween. The second liquid crystal element 919 includes the second pixel electrode, a counter electrode, and a liquid crystal layer therebetween.

Note that a pixel circuit of the present invention is not limited to that shown in FIG. 16B. For example, a switch, a resistor, a capacitor, a transistor, a sensor, a logic circuit, or the like may be added to the pixel circuit illustrated in FIG. 16B.

<Organic EL Panel>

FIG. 16C illustrates another example of a circuit configuration of a pixel. Here, a circuit configuration of a pixel of a display panel using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 16C illustrates an example of a pixel circuit that can be used. Here, an example in which an n-channel transistor is used in the pixel is shown. Further, digital time grayscale driving can be employed for the pixel circuit.

The configuration of the pixel circuit that can be used and operation of a pixel employing digital time grayscale driving are described.

A pixel 920 includes a switching transistor 921, a driving transistor 922, a light-emitting element 924, and a capacitor 923. A gate electrode of the switching transistor 921 is connected to a scan line 926. A first electrode (one of a source electrode and a drain electrode) of the switching transistor 921 is connected to a signal line 925. A second electrode (the other of the source electrode and the drain electrode) of the switching transistor 921 is connected to a gate electrode of the driving transistor 922. The gate electrode of the driving transistor 922 is connected to a power supply line 927 through the capacitor 923, a first electrode of the driving transistor 922 is connected to the power supply line 927, and a second electrode of the driving transistor 922 is connected to a first electrode (pixel electrode) of the light-emitting element 924. A second electrode of the light-emitting element 924 corresponds to a common electrode 928. The common electrode 928 is electrically connected to a common potential line formed over the same substrate as the common electrode 928.

As the switching transistor 921 and the driving transistor 922, any of the transistors described in the above embodiments can be used as appropriate. In this way, a highly reliable organic EL display panel can be provided.

The potential of the second electrode (the common electrode 928) of the light-emitting element 924 is set to be a low power supply potential. Note that the low power supply potential is lower than a high power supply potential supplied to the power supply line 927. For example, the low power supply potential can be GND, 0 V, or the like. The high power supply potential and the low power supply potential are set to be higher than or equal to the forward threshold voltage of the light-emitting element 924, and the difference between the potentials is applied to the light-emitting element 924, whereby current is supplied to the light-emitting element 924, leading to light emission. The forward voltage of the light-emitting element 924 refers to a voltage at which a desired luminance is obtained, and at least includes a forward threshold voltage.

Note that gate capacitance of the driving transistor 922 may be used as a substitute for the capacitor 923, so that the capacitor 923 can be omitted. The gate capacitance of the driving transistor 922 may be formed between the semiconductor film and the gate electrode.

Next, a signal input to the driving transistor 922 is described. For a voltage-input voltage driving method, a video signal for turning on or off the driving transistor 922 without fail is input to the driving transistor 922. In order for the driving transistor 922 to operate in a subthreshold region, voltage higher than the voltage of the power supply line 927 is applied to the gate electrode of the driving transistor 922. Voltage higher than or equal to voltage that is the sum of power supply line voltage and the threshold voltage Vth of the driving transistor 922 is applied to the signal line 925.

In the case where analog grayscale driving is performed, voltage higher than or equal to voltage that is the sum of the forward voltage of the light-emitting element 924 and the threshold voltage Vth of the driving transistor 922 is applied to the gate electrode of the driving transistor 922. A video signal by which the driving transistor 922 is operated in a saturation region is input, so that current is supplied to the light-emitting element 924. In order for the driving transistor 922 to operate in a saturation region, the potential of the power supply line 927 is set higher than the gate potential of the driving transistor 922. When an analog video signal is used, current corresponding to the video signal can be supplied to the light-emitting element 924 and analog grayscale driving can be performed.

Note that the configuration of the pixel circuit is not limited to that shown in FIG. 16C. For example, a switch, a resistor, a capacitor, a sensor, a transistor, a logic circuit, or the like may be added to the pixel circuit illustrated in FIG. 16C.

In the case where the transistor described in the above embodiments is used for the circuit shown in FIGS. 16A to 16C, the source electrode (the first electrode) is electrically connected to the low potential side and the drain electrode (the second electrode) is electrically connected to the high potential side. Further, the potential of the first gate electrode (and the third gate electrode) may be controlled by a control circuit or the like, and a potential lower than the potential applied to the source electrode may be input to the second gate electrode through a wiring that is not illustrated.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink or electrophoretic elements include electronic paper.

This embodiment can be combined with any of the other embodiments disclosed in this specification as appropriate.

Embodiment 6

In this embodiment, a display module and electronic devices that can be formed using a semiconductor device of one embodiment of the present invention are described.

Figure 17:
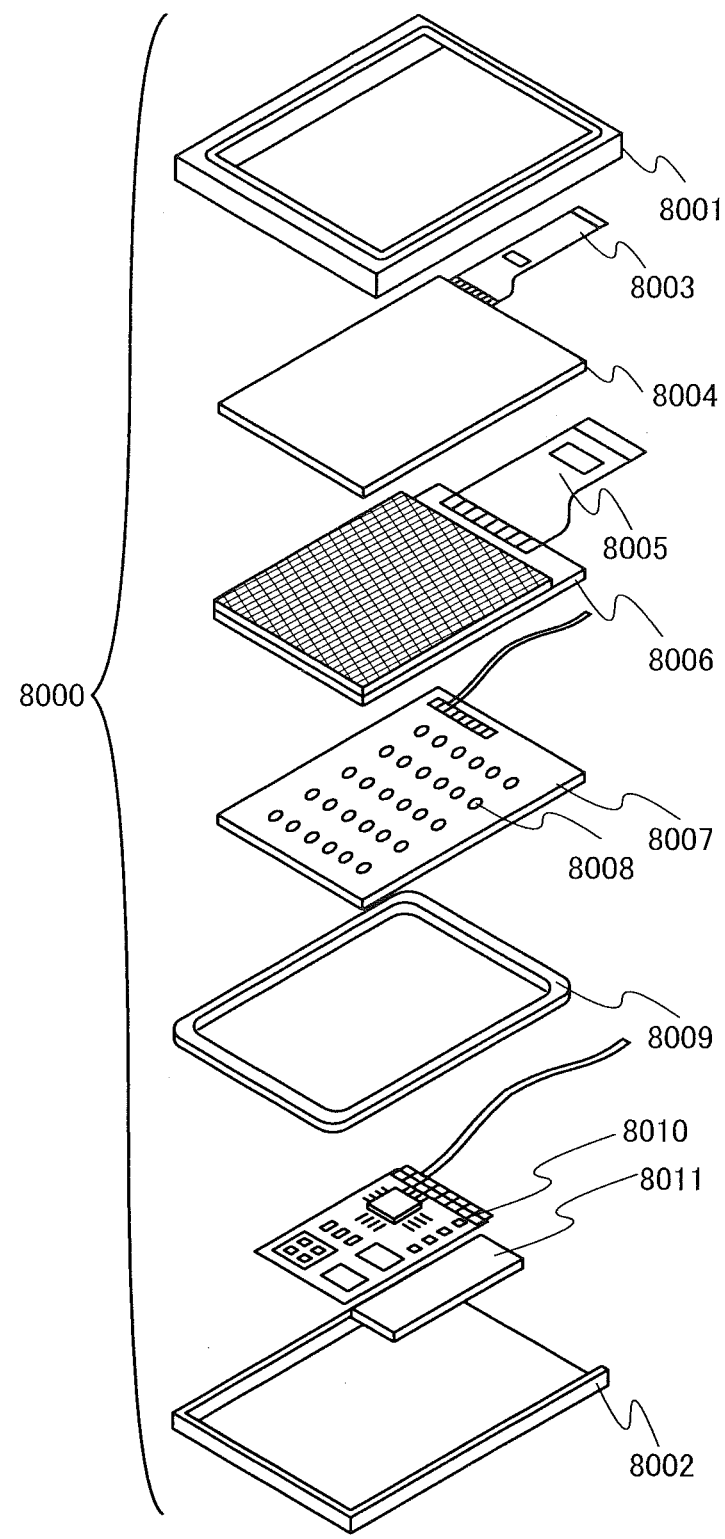
FIG. 17 is a diagram illustrating a display module.

In a display module 8000 illustrated in FIG. 17, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 18A to 18D are external views of electronic devices each including the semiconductor device of one embodiment of the present invention.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 18A:
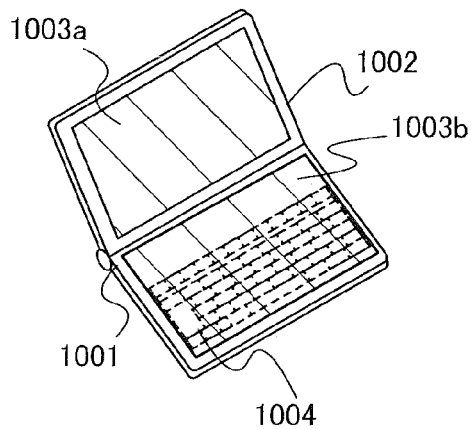
FIGS. 18A to 18D each illustrate an external view of an electronic device of an embodiment.

FIG. 18A illustrates a portable information terminal including a main body 1001, a housing 1002, display portions 1003*a* and 1003*b*, and the like. The display portion 1003*b* is a touch panel. By touching a keyboard button 1004 displayed on the display portion 1003*b*, a screen can be operated, and text can be input. It is needless to say that the display portion 1003*a* may be a touch panel. A liquid crystal panel or an organic light-emitting panel is manufactured by using any of the transistors described in the above embodiments as a switching element and used in the display portion 1003*a* or 1003*b*, whereby a highly reliable portable information terminal can be provided.

The portable information terminal illustrated in FIG. 18A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 18A may transmit and receive data wirelessly. Through wireless communication, desired book data or the like can be purchased and downloaded from an e-book server.

Figure 18B:
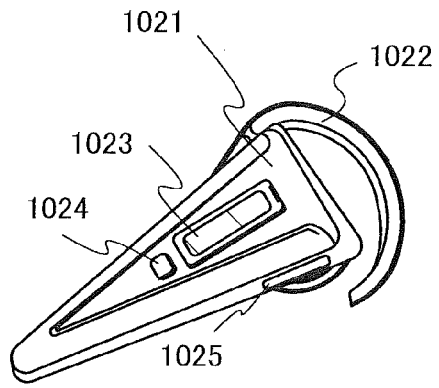

FIG. 18B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element, and used in the display portion 1023, whereby a highly reliable portable music player can be provided.

Furthermore, when the portable music player illustrated in FIG. 18B has an antenna, a microphone function, or a wireless communication function and is used with a mobile phone, a user can talk on the phone wirelessly in a hands-free way while driving a car or the like.

Figure 18C:
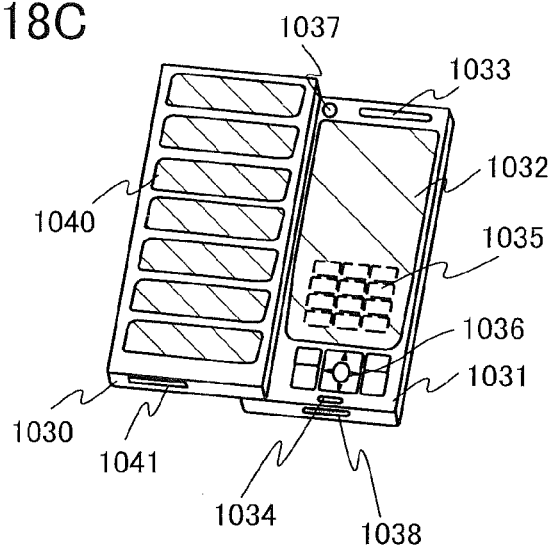

FIG. 18C illustrates a mobile phone that includes two housings, a housing 1030 and a housing 1031. The housing 1031 includes a display panel 1032, a speaker 1033, a microphone 1034, a pointing device 1036, a camera 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Further, the display panel 1032 includes a touch panel. A plurality of operation keys 1035 that are displayed as images are indicated by dotted lines in FIG. 18C. Note that a boosting circuit by which a voltage output from the solar cell 1040 is increased to be sufficiently high for each circuit is also included.

In the display panel 1032, the direction of display is changed as appropriate depending on the application mode. Further, the mobile phone is provided with the camera 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are opened as illustrated in FIG. 18C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 18D:
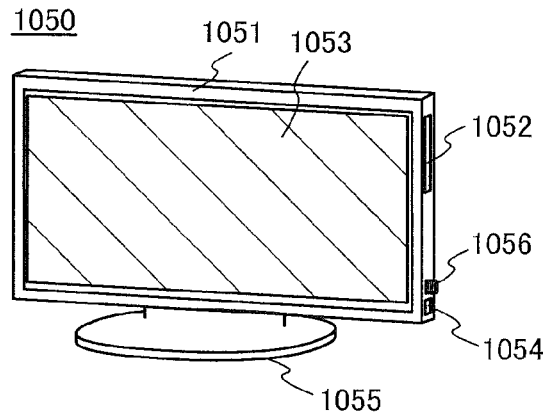

FIG. 18D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in the above embodiments is extremely small, when the transistor is used in the external memory 1056 or the CPU, the television set 1050 can have high reliability and sufficiently reduced power consumption.

This embodiment can be combined with any of the other embodiments disclosed in this specification as appropriate.

EXAMPLE 1

In this example, the physical property of an oxynitride insulating film to which oxygen is easily added was examined. Specifically, the etching rate of the oxynitride insulating film and the amount of released gas of the oxynitride insulating film in TDS analysis were measured.

In this example, Samples A1 and A2 each including the oxide insulating film of one embodiment of the present invention and Comparative Samples A3 to A8 were fabricated. Samples A1 and A2 were each fabricated by forming the oxide insulating film over a glass substrate under formation conditions that can be used for at least one of the gate insulating film 15 and the protective film 26 described in Embodiment 1 (see FIG. 1C). A 400-nm-thick silicon oxynitride film was formed as the oxide insulating film.

<Sample A1>

In Sample A1, an oxide insulating film was formed by a plasma CVD method under the conditions where the glass substrate was held at a temperature of 220° C., silane at a flow rate of 160 sccm and dinitrogen monoxide at a flow rate of 4000 sccm were used as a source gas, the pressure in the treatment chamber was 200 Pa, and a high-frequency power of 1500 W at 13.56 MHz ($8\times10^{-1}$ W/cm$^2$ as the power density) was supplied to parallel-plate electrodes.

<Sample A2>

In Sample A2, an oxide insulating film was formed by a plasma CVD method under the conditions where the glass substrate was held at a temperature of 220° C., silane at a flow rate of 30 sccm and dinitrogen monoxide at a flow rate of 4000 sccm were used as a source gas, the pressure in the treatment chamber was 200 Pa, and a high-frequency power of 150 W at 13.56 MHz ($8.0\times10^{-2}$ W/cm$^2$ as the power density) was supplied to parallel-plate electrodes.

<Samples A3 and A4>

In Sample A3, an oxide insulating film was formed by a plasma CVD method under the conditions similar to those used for formation of Sample A2 except that a glass substrate was held at a temperature of 350° C. and the pressure in the treatment chamber was 40 Pa.

In Sample A4, an oxide insulating film was formed by a plasma CVD method under the conditions similar to those used for formation of Sample A2 except that a glass substrate was held at a temperature of 350° C. and the pressure in the treatment chamber was 200 Pa.

<Sample A5>

In Sample A5, an oxide insulating film was formed by a plasma CVD method under the conditions where a glass substrate was held at a temperature of 200° C., silane at a flow rate of 250 sccm and dinitrogen monoxide at a flow rate of 2500 sccm were used as a source gas, the pressure in the treatment chamber was 30 Pa, and a microwave power of 5000 W (2.76 W/cm$^2$ as the power density) was supplied to electrodes.

<Samples A6 to A8>

Oxide insulating films in Samples A6 to A8 were formed under the following conditions.

In Sample A6, the oxide insulating film was formed by a plasma CVD method under the conditions similar to those used for formation of Sample A5 except that a glass substrate was held at 250° C. In Sample A7, the oxide insulating film was formed by a plasma CVD method under the conditions similar to those used for formation of Sample A5 except that a glass substrate was held at 300° C. In Sample A8, the oxide insulating film was formed by a plasma CVD method under the conditions similar to those used for formation of Sample A5 except that a glass substrate was held at 325° C.

<Samples B1 to B8>

After a conductive film was formed over the oxide insulating film in each of Samples A1 to A8, oxygen was added to the oxide insulating film through the conductive film. Then, the conductive film was removed. Thus, Samples B1 to B8 were fabricated.

Here, a 5-nm-thick tantalum nitride film was formed as the conductive film by a sputtering method. Oxygen was added to the oxide insulating film through the conductive film with an ashing apparatus under the conditions where an oxygen gas at a flow rate of 250 sccm was introduced into a chamber, the pressure was 15 Pa, and an RF power of 4500 W was supplied for 600 seconds between parallel-plate electrodes provided in the ashing apparatus so that a bias would be applied to the substrate side. The conductive film was removed by a dry etching method.

<Samples C1 to C8>

Fabricated Samples A1 to A8 were heated to obtain Samples C1 to C8. Here, heat treatment was performed in a nitrogen atmosphere at 350° C. for one hour, which is one of the conditions of the heat treatments performed in the process for manufacturing the transistor.

<Samples D1 to D8>

After a conductive film was formed over the oxide insulating film in each of Samples C1 to C8, oxygen was added to the oxide insulating film through the conductive film. Next, the conductive film was removed. Thus, Samples D1 to D8 were fabricated.

Note that the conductive film formed in each of Samples D1 to D8 was formed using a material different from that in Samples B1 to B8. Here, a 5-nm-thick indium tin oxide film containing silicon oxide was formed as the conductive film by a sputtering method. The conditions of the addition of oxygen to the oxide insulating film through the conductive film and a method for removing the conductive film were similar to those used for formation of Samples B1 to B8.

The etching rate of the oxide insulating film included in each of Samples A1 to A8, Samples B1 to B8, Samples C1 to C8, and Samples D1 to D8 was measured. Here, each sample was immersed in a 0.5 wt/vol % hydrofluoric acid at 24° C. for 120 seconds. Samples A1 to A8 and Samples B1 to B8 were each subjected to TDS analysis to measure the amount of gas released by heating. Furthermore, Samples D1 to D8 were each subjected to TDS analysis to measure the amount of oxygen released by heating. In the TDS analysis, the oxide insulating film in each sample was heated so that the temperature of a surface thereof was 50° C. to 450° C.

Table 1 shows the etching rate (denoted by E.R.) of the oxide insulating film included in each of Samples A1 to A8 and the amount of gas released from each of Samples A1 to A8.

Figure 19:
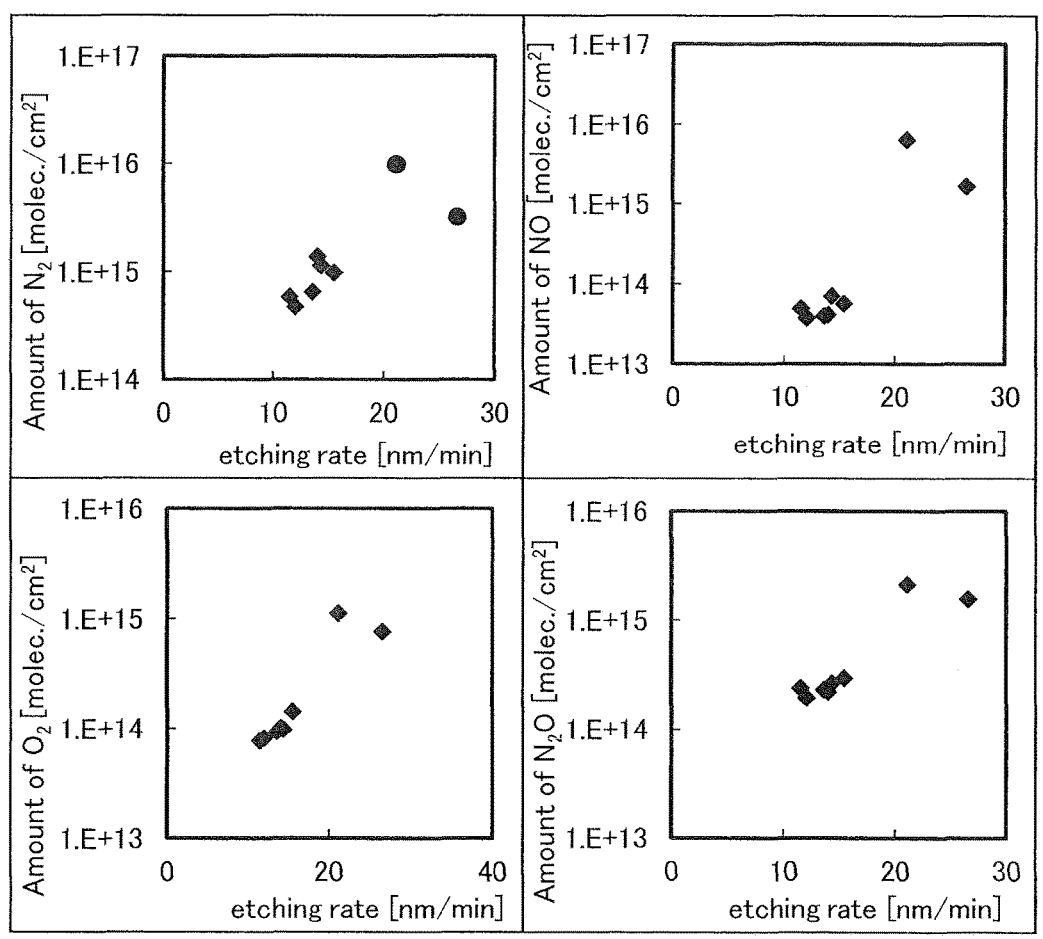
FIG. 19 shows TDS analysis results and the etching rates of oxide insulating films.

FIG. 19 shows graphs each illustrating the relationship between the etching rate of the oxide insulating film included in each of Samples A1 to A8 and the released amount of $N_2$, NO, $O_2$, or $N_2O$ which was measured by the TDS analysis. In FIG. 19, the horizontal axis indicates the etching rate of the oxide insulating film included in each of Samples A1 to A8, and the vertical axis indicates the amount of $N_2$, NO, $O_2$, or $N_2O$ released from each of Samples A1 to A8.

As shown in FIG. 19, the released amounts of $N_2$, NO, $O_2$, and $N_2O$ are larger as the etching rate of the oxide insulating film is higher.

Table 2 shows the etching rate of the oxide insulating film included in each of Samples A1 to A8 and the amount of oxygen released from each of Samples B1 to B8.

TABLE 2

| Sample No. | E.R. [nm/min] Sample A (as depo) | Amount of released $O_2$ (TDS) [molec./cm$^2$] Sample B (added O) |
|---|---|---|
| 1 | 21.1 | 7.7E+16 |
| 2 | 26.6 | 6.5E+16 |
| 3 | 14.4 | 3.5E+16 |
| 4 | 14.1 | 3.0E+16 |
| 5 | 15.5 | 3.6E+16 |
| 6 | 13.6 | 2.8E+16 |
| 7 | 12.1 | 2.4E+16 |
| 8 | 11.6 | 2.3E+16 |

Figure 20:
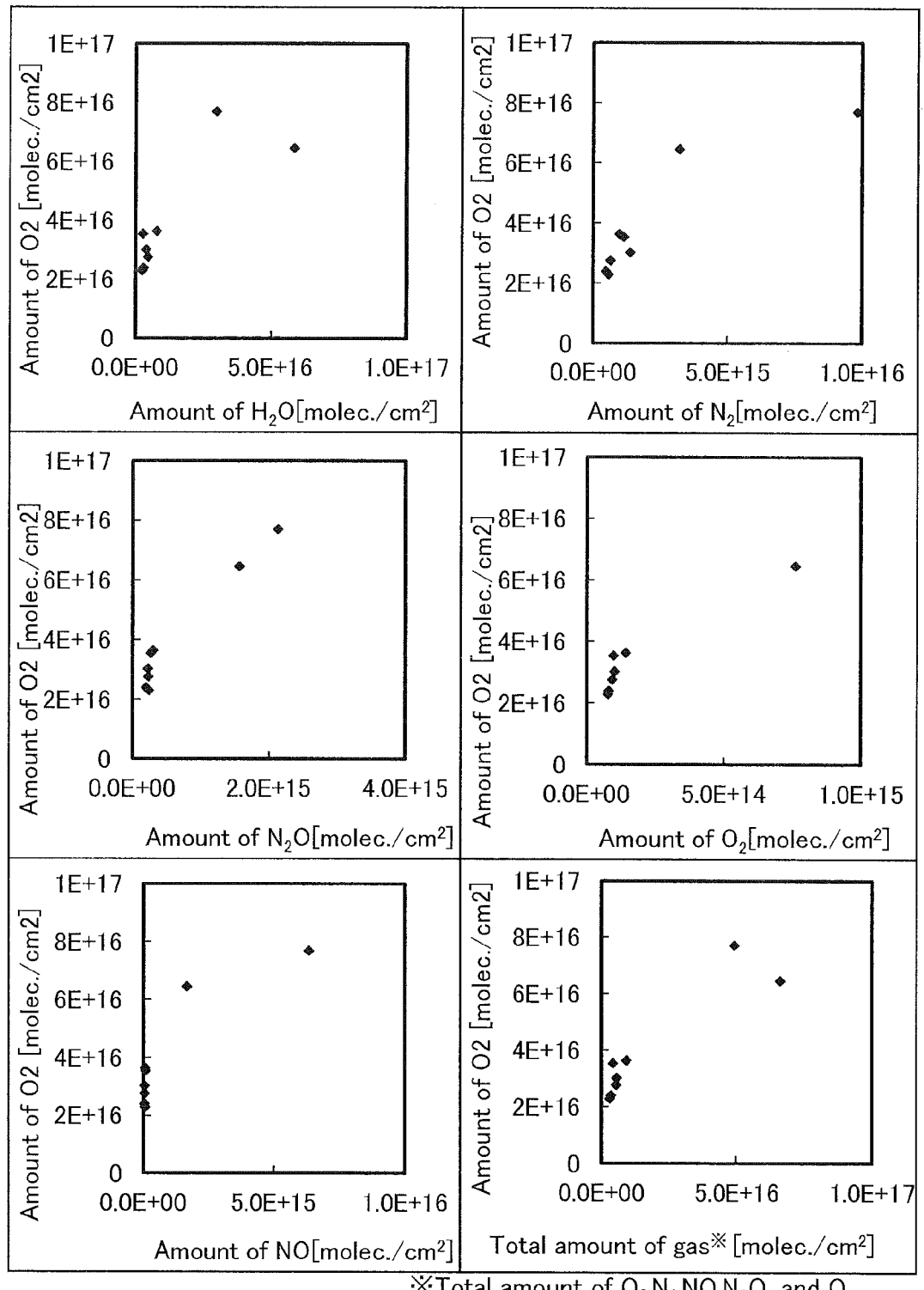
FIG. 20 shows TDS analysis results.

FIG. 20 shows graphs each illustrating the relationship between the amount of $O_2$ released from each of Samples B1 to B8 and the amount of $H_2O$, $N_2$, $N_2O$, $O_2$, or NO released from each of Samples A1 to A8 or the total amount of gases released from each of Samples A1 to A8. In FIG. 20, the horizontal axis indicates the amount of a gas released from each of Samples A1 to A8, and the vertical axis indicates the amount of $O_2$ released from each of Samples B1 to B8.

As shown in FIG. 20, the oxide insulating film which releases larger amounts of $H_2O$, $N_2$, $N_2O$, $O_2$, and NO releases a larger amount of oxygen after oxygen is added. In particular, the amount of released $N_2O$ is substantially proportional to the amount of released oxygen. A possible reason for this is as follows: in the oxide insulating film which releases a large amount of gas with a large volume such as $N_2O$, a space in a lattice is estimated to be large, and accordingly, oxygen is easily taken in the space in the lattice.

Furthermore, oxygen added to the oxide insulating film is easily released by heating because a bond between the oxygen and another atom is weak in the oxide insulating

TABLE 1

| | E.R. [nm/min] | Amount of released gas (TDS) [molec./cm$^2$] | | | | | |
|---|---|---|---|---|---|---|---|
| Sample No. | Sample A (as depo) | $H_2O$ (200~450° C.) | $N_2$ (50~450° C.) | $N_2O$ (50~450° C.) | $O_2$ (50~450° C.) | NO (50~450° C.) | Total |
| 1 | 21.1 | 3.0E+16 | 9.8E+15 | 2.1E+15 | 1.1E+15 | 6.4E+15 | 4.9E+16 |
| 2 | 26.6 | 5.9E+16 | 3.2E+15 | 1.6E+15 | 7.6E+14 | 1.7E+15 | 6.6E+16 |
| 3 | 14.4 | 2.7E+15 | 1.1E+15 | 2.6E+14 | 9.7E+13 | 7.0E+13 | 4.3E+15 |
| 4 | 14.1 | 3.9E+15 | 1.4E+15 | 2.2E+14 | 1.0E+14 | 4.1E+13 | 5.6E+15 |
| 5 | 15.5 | 7.9E+15 | 9.7E+14 | 2.9E+14 | 1.4E+14 | 5.7E+13 | 9.3E+15 |
| 6 | 13.6 | 4.5E+15 | 6.5E+14 | 2.3E+14 | 9.3E+13 | 4.0E+13 | 5.5E+15 |
| 7 | 12.1 | 2.9E+15 | 4.7E+14 | 2.0E+14 | 8.1E+13 | 3.7E+13 | 3.7E+15 |
| 8 | 11.6 | 2.3E+15 | 5.8E+14 | 2.4E+14 | 7.7E+13 | 4.9E+13 | 3.2E+15 | film. Therefore, the amount of oxygen released by heat treatment is likely to be proportional to the amount of added oxygen. That is, an oxide insulating film to which a larger amount of oxygen can be added releases a larger amount of oxygen.

It is desirable that the amount of released oxygen capable of reducing the amount of oxygen vacancies in the oxide semiconductor film by heating is greater than $4\times10^{16}$ molecules/cm$^2$, preferably greater than $5\times10^{16}$ molecules/cm$^2$, preferably greater than or equal to $6\times10^{16}$ molecules/cm$^2$.

The amount of H$_2$O released from such an oxide insulating film which has been deposited is greater than 8×10$^{15}$ molecules/cm$^2$, preferably greater than or equal to 3×10$^{16}$ molecules/cm$^2$. The amount of N$_2$ released from the oxide insulating film which has been deposited is greater than 2×10$^{15}$ molecules/cm$^2$, preferably greater than or equal to 3×10$^{15}$ molecules/cm$^2$. The amount of N$_2$O released from the oxide insulating film which has been deposited is greater than 3×10$^{14}$ molecules/cm$^2$, preferably greater than or equal to 2×10$^{15}$ molecules/cm$^2$. The amount of O$_2$ released from the oxide insulating film which has been deposited is greater than 2×10$^{14}$ molecules/cm$^2$, preferably greater than or equal to 8×10$^{14}$ molecules/cm$^2$. The amount of NO released from the oxide insulating film which has been deposited is greater than 7×10$^{13}$ molecules/cm$^2$, preferably greater than or equal to 2×10$^{15}$ molecules/cm$^2$. The total amount of released H$_2$O, N$_2$, N$_2$O, O$_2$, and NO is greater than 1×10$^{16}$ molecules/cm$^2$, preferably greater than or equal to 5×10$^{16}$ molecules/cm$^2$.

Table 3 shows the etching rate of the oxide insulating film included in each of Samples A1 to A8 and Samples C1 to C8 and the amount of oxygen released from each of Samples B1 to B8.

TABLE 3

| Sample No. | E.R. [nm/min] | | Amount of released O$_2$ (TDS) [molec./cm$^2$] |
|---|---|---|---|
| | Sample A (as-depo) | Sample C (baking @350° C.) | Sample B (added O) |
| 1 | 14.6 | 11.7 | 7.7E+16 |
| 2 | 16.5 | 14.6 | 6.5E+16 |
| 3 | 9.5 | 8.3 | 3.5E+16 |
| 4 | 8.9 | 8.1 | 3.0E+16 |
| 5 | 10.4 | 8.8 | 3.6E+16 |
| 6 | 9.1 | 8.2 | 2.8E+16 |
| 7 | 8.3 | 7.2 | 2.4E+16 |
| 8 | 8.0 | 7.1 | 2.3E+16 |

Figure 21:
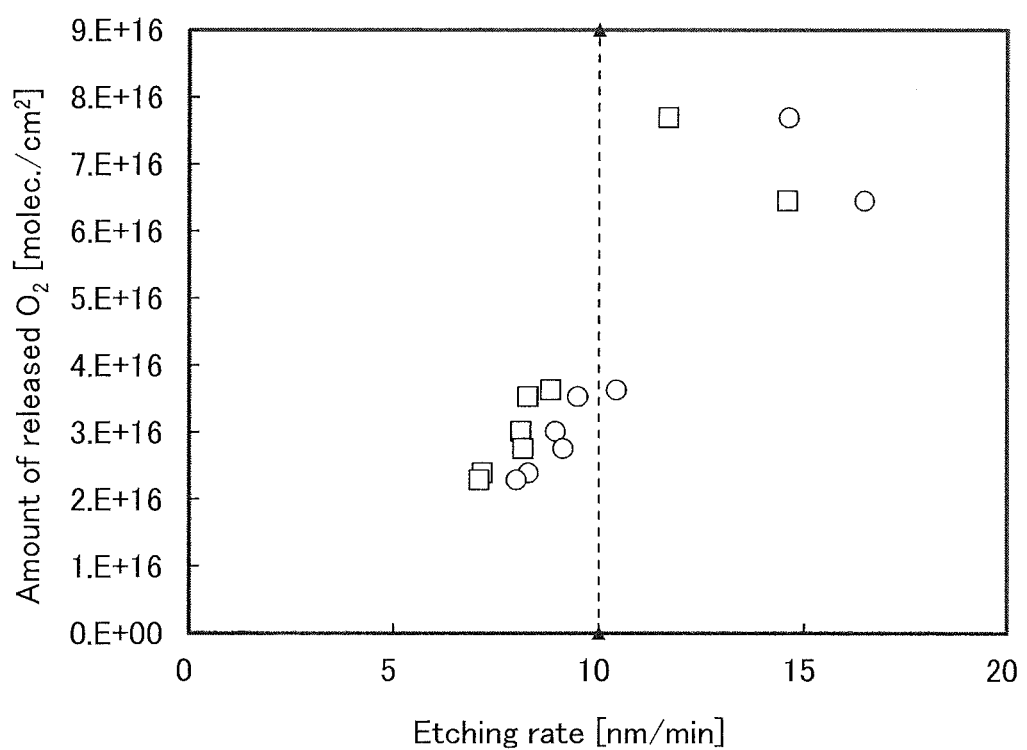
FIG. 21 shows TDS analysis results and the etching rates of oxide insulating films.

FIG. 21 is a graph showing the relationship between the etching rate of the oxide insulating film included in each of Samples A1 to A8 and Samples C1 to C8 and the amount of oxygen released from each of Samples B1 to B8 which was measured by TDS analysis. In FIG. 21, the horizontal axis indicates the etching rate of the oxide insulating film included in each of Samples A1 to A8 and Samples C1 to C8, and the vertical axis indicates the amount of oxygen released from each of Samples B1 to B8.

Specifically, in FIG. 21, a circle indicates the etching rate (shown by the horizontal axis) of the oxide insulating film included in each of Samples A1 to A8 and the amount of oxygen (shown by the vertical axis) released from each of Samples B1 to B8.

Furthermore, a square indicates the etching rate (shown by the horizontal axis) of the oxide insulating film included in each of Samples C1 to C8 and the amount of oxygen (shown by the vertical axis) released from each of Samples B1 to B8.

Table 4 shows the etching rate of the oxide insulating film included in each of Samples A1 to A8, Samples C1 to C8, and Samples D1 to D8 and the amount of oxygen released from Samples D1 to D8.

TABLE 4

| Sample No. | E.R. [nm/min] | | | Amount of released O$_2$ (TDS) [molec./cm$^2$] Sample D (added O) |
|---|---|---|---|---|
| | Sample A (as-depo) | Sample C (baking @350° C.) | Sample D (added O) | |
| 1 | 14.6 | 11.7 | 11.5 | 2.2E+16 |
| 2 | 16.5 | 14.6 | 14.0 | 3.0E+16 |
| 3 | 9.5 | 8.3 | 8.4 | 1.4E+16 |
| 4 | 8.9 | 8.1 | 8.3 | 1.6E+16 |
| 5 | 10.4 | 8.8 | NO DATA | NO DATA |
| 6 | 9.1 | 8.2 | NO DATA | NO DATA |
| 7 | 8.3 | 7.2 | NO DATA | NO DATA |
| 8 | 8.0 | 7.1 | 7.6 | 9.7E+15 |

Figure 22:
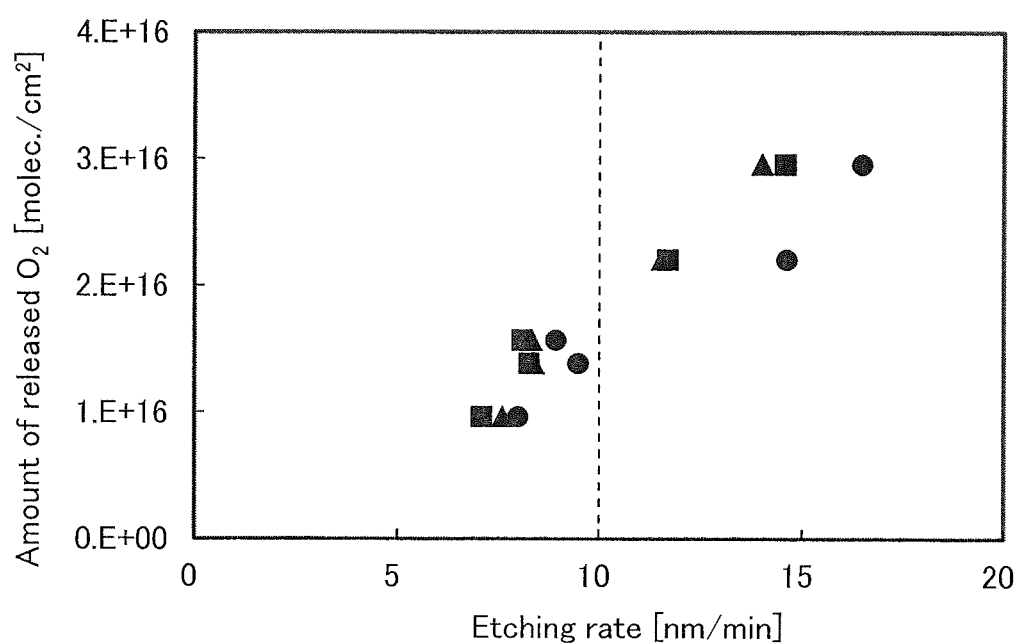
FIG. 22 shows TDS analysis results and the etching rates of oxide insulating films.

FIG. 22 is a graph showing the relationship between the etching rate of the oxide insulating film included in each of Samples A1 to A8, Samples C1 to C8, and Samples D1 to D8 and the amount of oxygen released from each of Samples D1 to D8 which is measured by TDS analysis. Note that the measurement results of Samples A5 to A7, Samples C5 to C7, and Samples D5 to D7 are omitted. In FIG. 22, the horizontal axis indicates the etching rate of the oxide insulating film included in each of Samples A1 to A8, Samples C1 to C8, and Samples D1 to D8, and the vertical axis indicates the amount of oxygen released from each of Samples D1 to D8.

Specifically, in FIG. 22, a circle indicates the etching rate (shown by the horizontal axis) of the oxide insulating film included in each of Samples A1 to A8 and the amount of oxygen (shown by the vertical axis) released from each of Samples D1 to D8.

Furthermore, a square indicates the etching rate (shown by the horizontal axis) of the oxide insulating film included in each of Samples C1 to C8 and the amount of oxygen (shown by the vertical axis) released from each of Samples D1 to D8.

Furthermore, a triangle indicates the etching rate (shown by the horizontal axis) of the oxide insulating film included in each of Samples D1 to D8 and the amount of oxygen (shown by the vertical axis) released from each of Samples D1 to D8.

As shown in FIG. 22, the etching rate of the oxide insulating film in each of Samples C1 to C8 subjected to heat treatment is substantially equal to the etching rate of the oxide insulating film in each of Samples D1 to D8 to which oxygen is added. That is, the etching rate of the oxide insulating film included in each of Samples B1 to B8 is substantially equal to the etching rate of the oxide insulating film included in each of Samples C1 to C8, although this is not shown in FIG. 21.

The vertical axis in each of FIG. 21 and FIG. 22 indicates the amount of oxygen released from each of Samples B1 to B8 and Samples D1 to D8. Samples B1 to B8 differ from Samples D1 to D8 in the material of the conductive film formed over the oxide insulating film before oxygen is added to the oxide insulating film. The amount of released oxygen in FIG. 21 is larger than the amount of released oxygen in FIG. 22. That is, the amount of oxygen released from the oxide insulating film included in each of Samples B1 to B8 is larger than the amount of oxygen released from the oxide insulating film included in each of Samples D1 to D8. The heat treatment is probably one of factors of Samples D1 to D8 whose amount of released oxygen is smaller than the amount of oxygen released from Samples B1 to B8.

The amount of released oxygen capable of reducing the amount of oxygen vacancies in the oxide semiconductor film by heating is greater than $4\times10^{16}$ molecules/cm$^2$, preferably greater than $5\times10^{16}$ molecules/cm$^2$, preferably greater than or equal to $6\times10^{16}$ molecules/cm$^2$. The etching rate of such an oxide insulating film is higher than 8 nm/min, preferably higher than or equal to 10 nm/min, preferably higher than 10 nm/min, further preferably higher than or equal to 12 nm/min, and lower than or equal to 50 nm/min, preferably lower than or equal to 20 nm/min. When such an oxide insulating film is provided in one or more of the gate insulating film and the protective film of the transistor, oxygen vacancies in the oxide semiconductor film can be reduced by heat treatment. Further, excellent electric characteristics of the transistor, in which a shift in the threshold voltage in the negative direction can be suppressed, can be obtained. In addition, a highly reliable transistor in which a variation in electrical characteristics with time or a variation in electrical characteristics due to a gate BT photostress test is small can be manufactured.

EXAMPLE 2

In this example, transistors were fabricated, and the $I_d$-$V_g$ characteristics and reliability of the transistors were evaluated. Results thereof are described.

<Fabrication Methods of Samples>

As Sample E1 of this example, the transistor in Embodiment 1 and FIG. 1D was fabricated.

Samples E2 and E3 were fabricated as comparative examples.

<Sample E1>

A method for fabricating Sample E1 is described with reference to FIGS. 2A to 2E.

First, a glass substrate was used as the substrate 11, and the gate electrode 13 was formed over the substrate 11, as illustrated in FIG. 2A.

The gate electrode 13 was formed in the following manner: a 100-nm-thick tungsten film was formed by a sputtering method, a mask was formed over the tungsten film by a photolithography process, and the tungsten film was partly etched using the mask.

Next, as shown in FIG. 2B, the gate insulating film 15 was formed over the gate electrode 13.

As the gate insulating film 15, a stack including a 400-nm-thick silicon nitride film and a 50-nm-thick silicon oxynitride film was used.

Note that the silicon nitride film had a three-layer structure of a first silicon nitride film, a second silicon nitride film, and a third silicon nitride film.

The first silicon nitride film was formed to have a thickness of 50 nm under the following conditions: silane with a flow rate of 200 sccm, nitrogen with a flow rate of 2000 sccm, and an ammonia gas with a flow rate of 100 sccm were supplied to a treatment chamber of a plasma CVD apparatus as the source gas; the pressure in the treatment chamber was controlled to 100 Pa, and a power of 2000 W was supplied with the use of a 27.12 MHz high-frequency power source.

The second silicon nitride film was formed to have a thickness of 300 nm under the following conditions: silane with a flow rate of 200 sccm, nitrogen with a flow rate of 2000 sccm, and an ammonia gas with a flow rate of 2000 sccm were supplied to a treatment chamber of a plasma CVD apparatus as the source gas; the pressure in the treatment chamber was controlled to 100 Pa, and a power of 2000 W was supplied with the use of a 27.12 MHz high-frequency power source.

The third silicon nitride film was formed to have a thickness of 50 nm under conditions similar to those used for formation of the first silicon nitride film. Note that the first silicon nitride film, the second silicon nitride film, and the third silicon nitride film were each formed at a substrate temperature of 350° C.

The silicon oxynitride film was formed under the following conditions: silane with a flow rate of 20 sccm and dinitrogen monoxide with a flow rate of 3000 sccm were supplied to the treatment chamber of the plasma CVD apparatus as the source gas; the pressure in the treatment chamber was controlled to 40 Pa, and a power of 100 W was supplied with the use of a 27.12 MHz high-frequency power source. Note that the silicon oxynitride film was formed at a substrate temperature of 350° C.

Next, the oxide semiconductor film 17 was formed to overlap with the gate electrode 13 with the gate insulating film 15 positioned therebetween.

Here, a 35-nm-thick oxide semiconductor film was formed over the gate insulating film 15 by a sputtering method, a mask was formed over the oxide semiconductor film by a photolithography process, and part of the oxide semiconductor film was etched with the use of the mask, whereby the oxide semiconductor film 17 was formed.

The oxide semiconductor film 17 was formed under the following conditions: an In—Ga—Zn oxide sputtering target having an atomic ratio of In:Ga:Zn=1:1:1 was used; oxygen at a flow proportion of 50% was supplied as a sputtering gas into a treatment chamber of a sputtering apparatus; the pressure in the treatment chamber was controlled to 0.6 Pa; and AC power of 2.5 kW was supplied. Note that the oxide semiconductor film was formed at a substrate temperature of 170° C.

Next, heat treatment was performed. Next, heat treatment was performed at 450° C. in a nitrogen atmosphere for one hour, and after that, another heat treatment was performed at 450° C. in a mixed gas of nitrogen and oxygen for one hour.

Next, as shown in FIG. 2C, the pair of electrodes 19 and 20 in contact with the oxide semiconductor film 17 was formed.

First, a conductive film was formed over the gate insulating film and the oxide semiconductor film. As the conductive film, a 400-nm-thick aluminum film was formed over a 50-nm-thick tungsten film, and a 100-nm-thick titanium film was formed over the aluminum film. Then, a mask was formed over the conductive film by a photolithography process, and the conductive film was partly etched using the mask. Through the above steps, the pair of electrodes 19 and 20 was formed.

Next, an impurity on an exposed portion of the oxide semiconductor film 17 was removed using a phosphoric acid obtained by diluting an 85 wt % phosphoric acid 100 times.

Next, the substrate was transferred to a treatment chamber in a reduced pressure and heated at 220° C. Then, the oxide semiconductor film 17 was exposed to oxygen plasma that was generated in a dinitrogen monoxide atmosphere by supply of a high-frequency power of 150 W to an upper electrode in the treatment chamber with the use of a 27.12 MHz high-frequency power source.

Next, as shown in FIG. 2D, the oxide insulating film 21 was formed over the oxide semiconductor film 17 and the pair of electrodes 19 and 20. Here, the oxide insulating film 21 had a two-layer structure of a first silicon oxynitride film and a second silicon oxynitride film.

The first silicon oxynitride film was formed by a plasma CVD method under the following conditions: silane with a flow rate of 50 sccm and dinitrogen monoxide with a flow rate of 2000 sccm were used as a source gas; the pressure in the treatment chamber was 20 Pa; the substrate temperature was 220° C.; and a high-frequency power of 100 W was supplied to parallel-plate electrodes. The thickness of the first silicon oxynitride film was 50 nm.

The second silicon oxynitride film was formed by a plasma CVD method under the following conditions: silane with a flow rate of 160 sccm and dinitrogen monoxide with a flow rate of 4000 sccm were used as a source gas; the pressure in the treatment chamber was 200 Pa; the substrate temperature was 220° C.; and the high-frequency power of 1500 W was supplied to parallel plate electrodes. Under the above conditions, it is possible to form a silicon oxynitride film containing oxygen at a higher proportion than oxygen in the stoichiometric composition and from which part of oxygen is released by heating. The thickness of the second silicon oxynitride film was 400 nm.

Next, by heat treatment, water, nitrogen, hydrogen, and the like were released from the first silicon oxynitride film and the second silicon oxynitride film and part of oxygen contained in the second silicon oxynitride film was supplied to the oxide semiconductor film 17. Here, the heat treatment was performed at 350° C. in a mixed atmosphere of nitrogen and oxygen for one hour.

Next, the film 22 was formed over the oxide insulating film 21.

As the film 22, a 5-nm-thick conductive film of an indium oxide-tin oxide compound containing silicon oxide (ITO-$SiO_2$) was formed by a sputtering method. Note that the composition of a target used for formation of the film was $In_2O_3$:$SnO_2$:$SiO_2$=85:10:5 [wt %].

Next, the oxygen 24 was added to the film 22.

A method for adding the oxygen 24 was conducted with an ashing apparatus under the conditions where an oxygen gas at a flow rate of 250 sccm was introduced into a chamber, the pressure was 15 Pa, and an RF power of 4500 W was supplied for 600 seconds between parallel-plate electrodes provided in the ashing apparatus so that a bias would be applied to the substrate side.

Consequently, the oxygen was added to the film 22, whereby the metal oxide film 28 was formed as shown in FIG. 2E.

Next, although not shown, a 100-nm-thick silicon nitride film was formed over the metal oxide film 28. The silicon nitride film was formed by a plasma CVD method under the following conditions: silane with a flow rate of 50 sccm, nitrogen with a flow rate of 5000 sccm, and ammonia with a flow rate of 100 sccm were used as a source gas; the pressure in the treatment chamber was 100 Pa; the substrate temperature was 350° C.; and a high-frequency power of 1000 W was supplied to parallel plate electrodes.

Then, heat treatment was performed in vacuum.

Next, an opening portion reaching one of the pair of electrodes 19 and 20 was formed in part of the oxide insulating film 21, part of the metal oxide film 28, and part of the silicon nitride film. The opening portion was formed by etching part of the oxide insulating film 21, part of the metal oxide film 28, and part of the silicon nitride film using a mask formed over the silicon nitride film.

Next, a pixel electrode was formed over the silicon nitride film. The pixel electrode was electrically connected to one of the pair of electrodes 19 and 20 through the opening portion.

Here, as the pixel electrode, a 100-nm-thick conductive film of an indium oxide-tin oxide compound containing silicon oxide (ITO-$SiO_2$) was formed by a sputtering method. Note that the composition of a target used for formation of the conductive film was $In_2O_3$:$SnO_2$:$SiO_2$=85:10:5 [wt %]. After that, heat treatment was performed at 250° C. in a nitrogen atmosphere for one hour.

Through the above process, Sample E1 of this example was fabricated.

<Sample E2>

Sample E2 was fabricated under conditions similar to those used for formation of Sample E1 except for the formation of a first silicon oxide film included in the oxide insulating film 21, the formation of the film 22, and the addition of the oxygen 24.

<Sample E3>

Sample E3 was fabricated under conditions similar to those used for formation of Sample E1 except for the formation of the film 22 and the addition of the oxygen 24.

<$I_d$-$V_g$ Characteristics of Transistors>

Next, the $I_d$-$V_g$ characteristics of Samples E1 to E3 were measured. Here, to measure $I_d$-$V_g$ characteristics, a drain voltage ($V_d$) was set to 1 V or 10 V and a gate voltage ($V_g$) was changed from −15 V to 20 V in transistors with L/W (channel length/channel width) of 2 μm/50 μm, with L/W of 3 μm/50 μm, and with L/W of 6 μm/50 μm. In each sample, the $I_d$-$V_g$ characteristics of 40 transistors were measured.

Figure 23A:
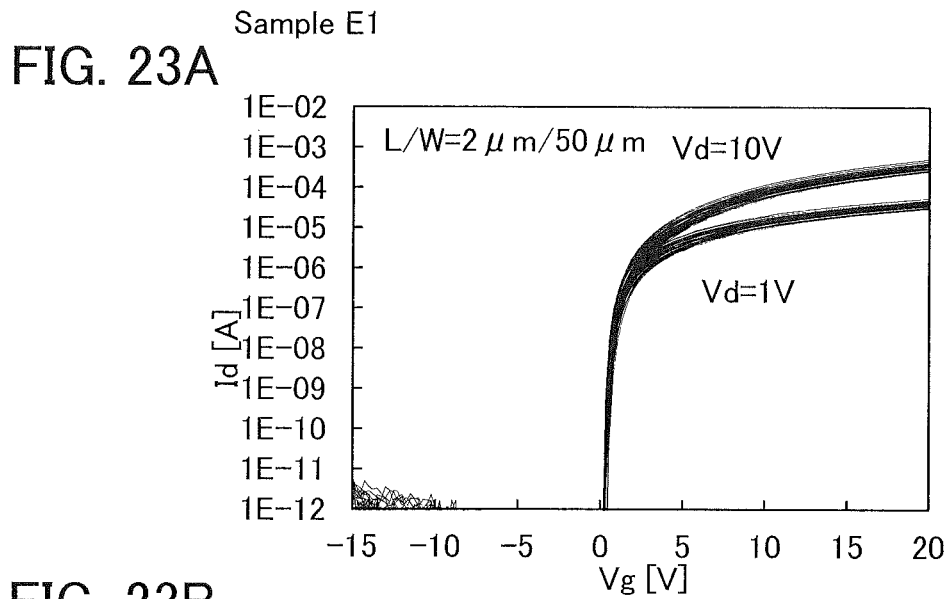
FIGS. 23A to 23C show $I_d$-$V_g$ characteristics of transistors.
Figure 23B:
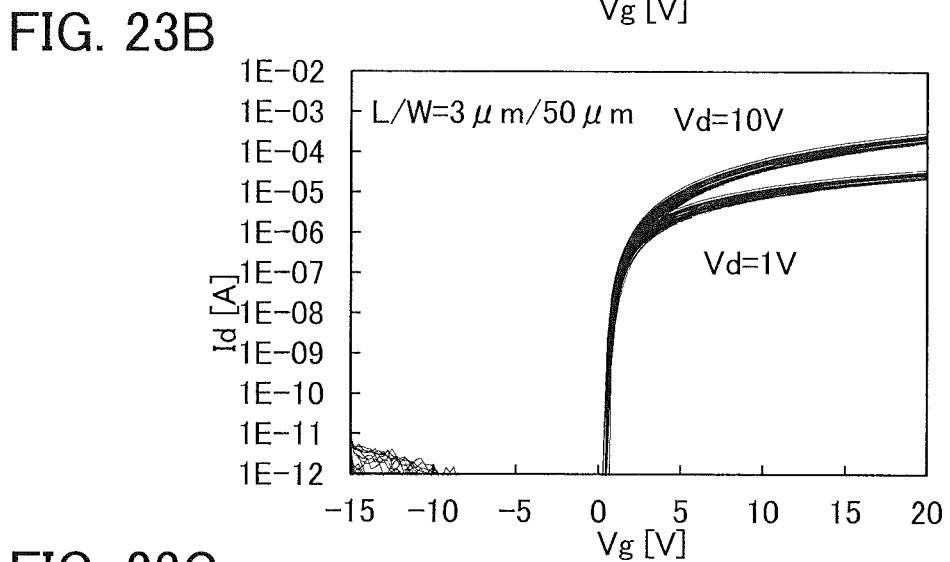
Figure 23C:
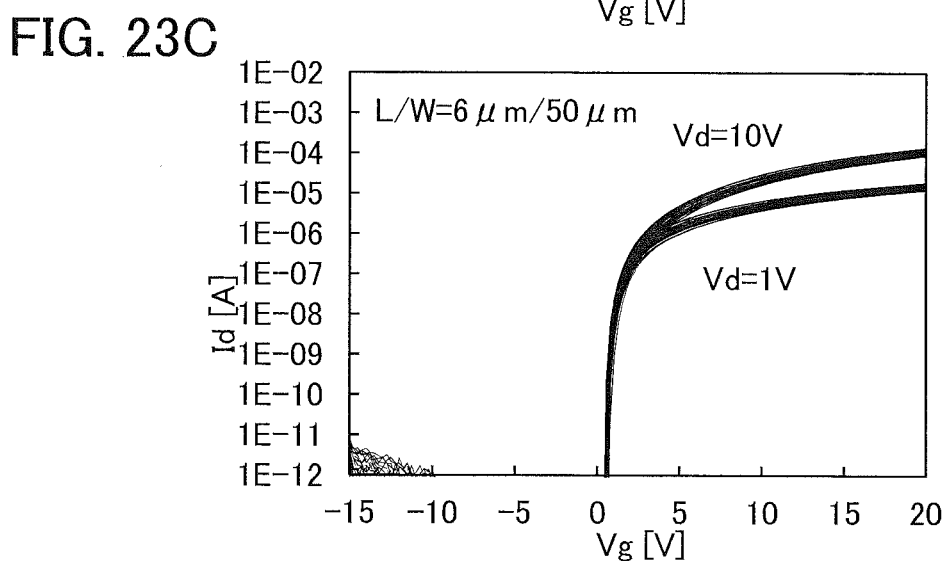
Figure 24A:
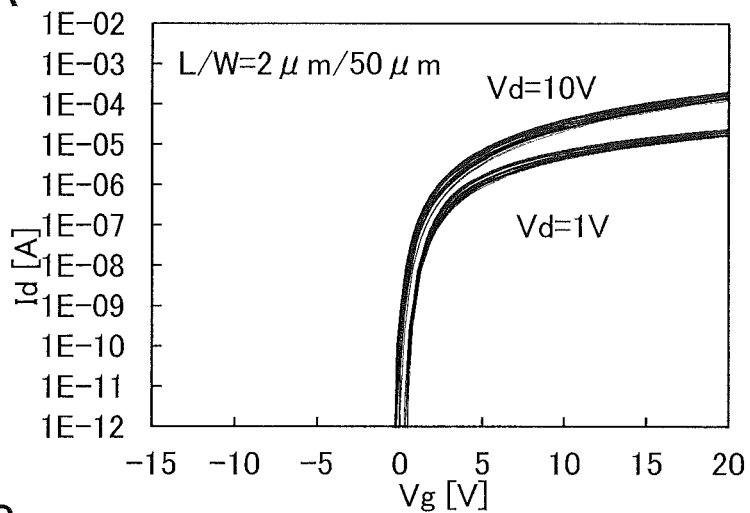
FIGS. 24A to 24C show $I_d$-$V_g$ characteristics of transistors.
Figure 24B:
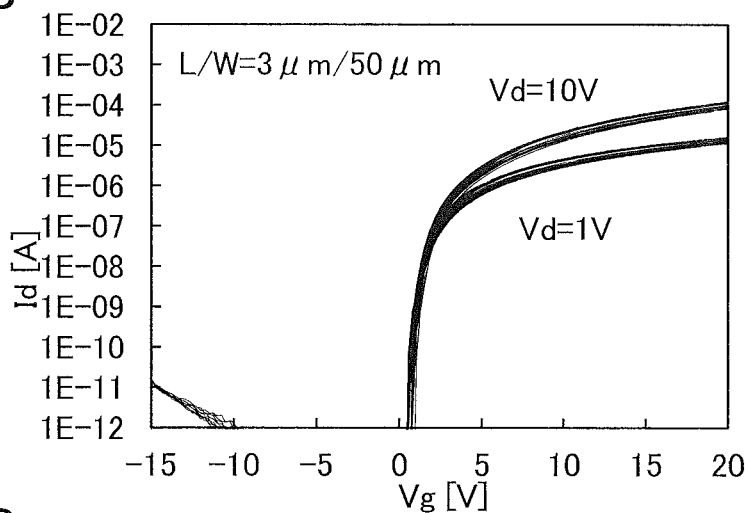
Figure 24C:
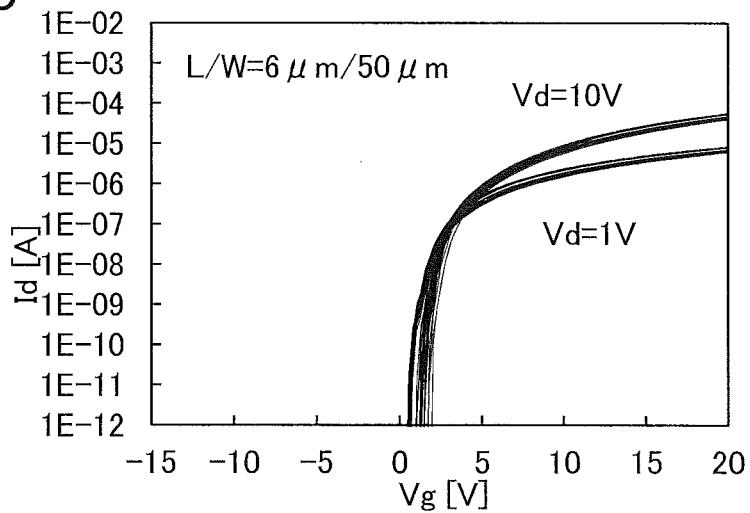
Figure 25A:
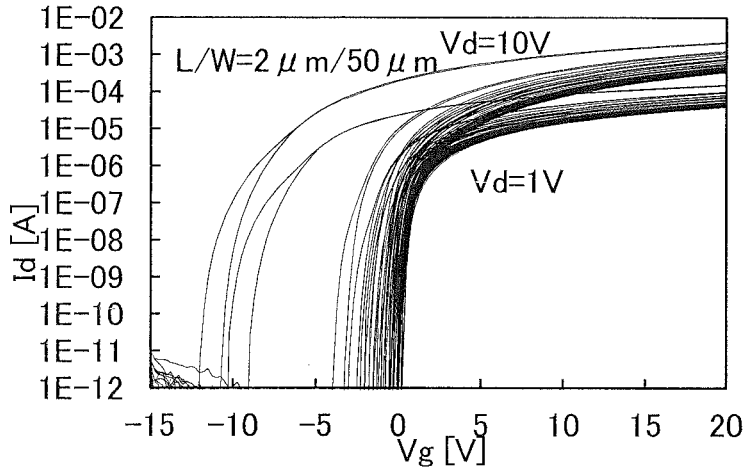
FIGS. 25A to 25C show $I_d$-$V_g$ characteristics of transistors.
Figure 25B:
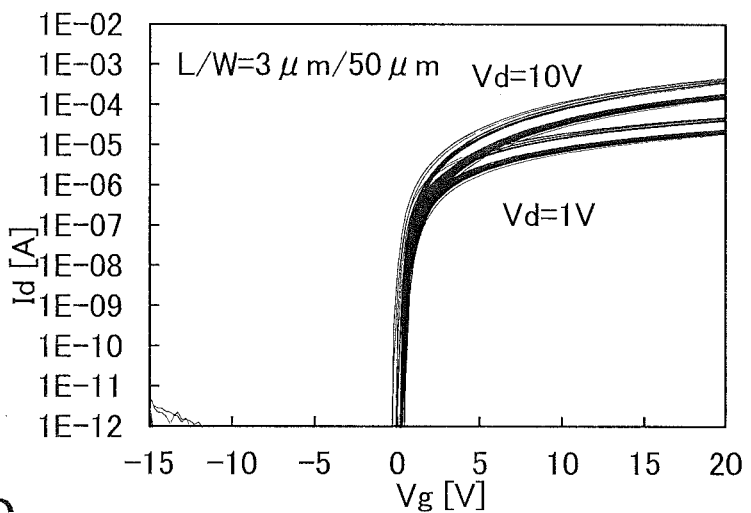
Figure 25C:
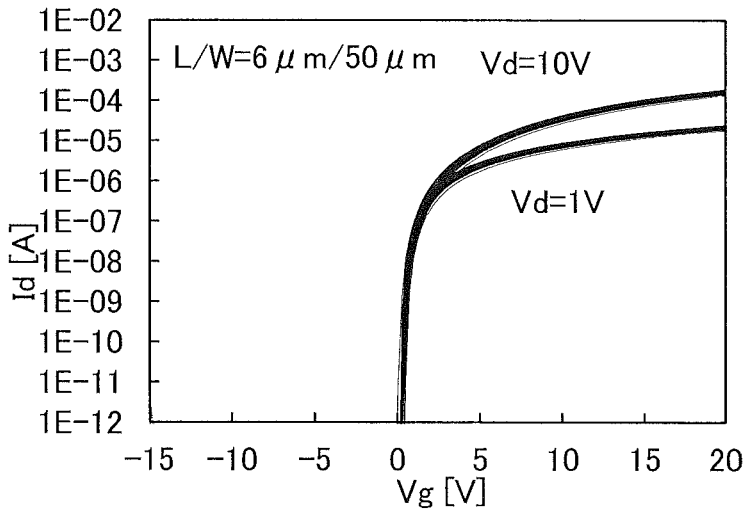

FIGS. 23A to 23C show measurement results of $I_d$-$V_g$ characteristics of Sample E1. FIGS. 24A to 24C show measurement results of $I_d$-$V_g$ characteristics of Sample E2. FIGS. 25A to 25C show measurement results of $I_d$-$V_g$ characteristics of Sample E3. FIGS. 23A, 24A, and 25A show measurement results of the transistors with L/W of 2 μm/50 μm. FIGS. 23B, 24B, and 25B show measurement results of the transistors with L/W of 3 μm/50 μm. FIGS. 23C, 24C, and 25C show measurement results of the transistors with L/W of 6 μm/50 μm.

Regardless of the channel length, a variation in $I_d$-$V_g$ characteristics shown in FIGS. 23A to 23C is smaller than variations in $I_d$-$V_g$ characteristics shown in FIGS. 24A to 24C and FIGS. 25A to 25C. That is, a variation in the electrical characteristics of the transistors in Sample E1 is smaller than variations in the electrical characteristics of the transistors in Samples E2 and E3.

Here, a threshold voltage and a shift value in this specification are described. Threshold voltage $V_{th}$ is defined as, in the $I_d$-$V_g$ curve where the horizontal axis indicates gate voltage $V_g$ [V] and the vertical axis indicates the square root of drain current $I_d$ ($I_d^{1/2}$) [$A^{1/2}$], gate voltage at the intersection point of the line of $I_d^{1/2}$=0 ($V_g$ axis) and the tangent to the curve at a point where the slope of the curve is the steepest. Note that here, the threshold voltage is calculated with a drain voltage $V_d$ of 10 V.

A shift value (Shift) in this specification is defined as, in an $I_d$-$V_g$ curve, a gate voltage at a drain current of $1 \times 10^{-12}$ A. The shift value is a parameter representing the rising of the $I_d$-$V_g$ curve.

Figure 26:
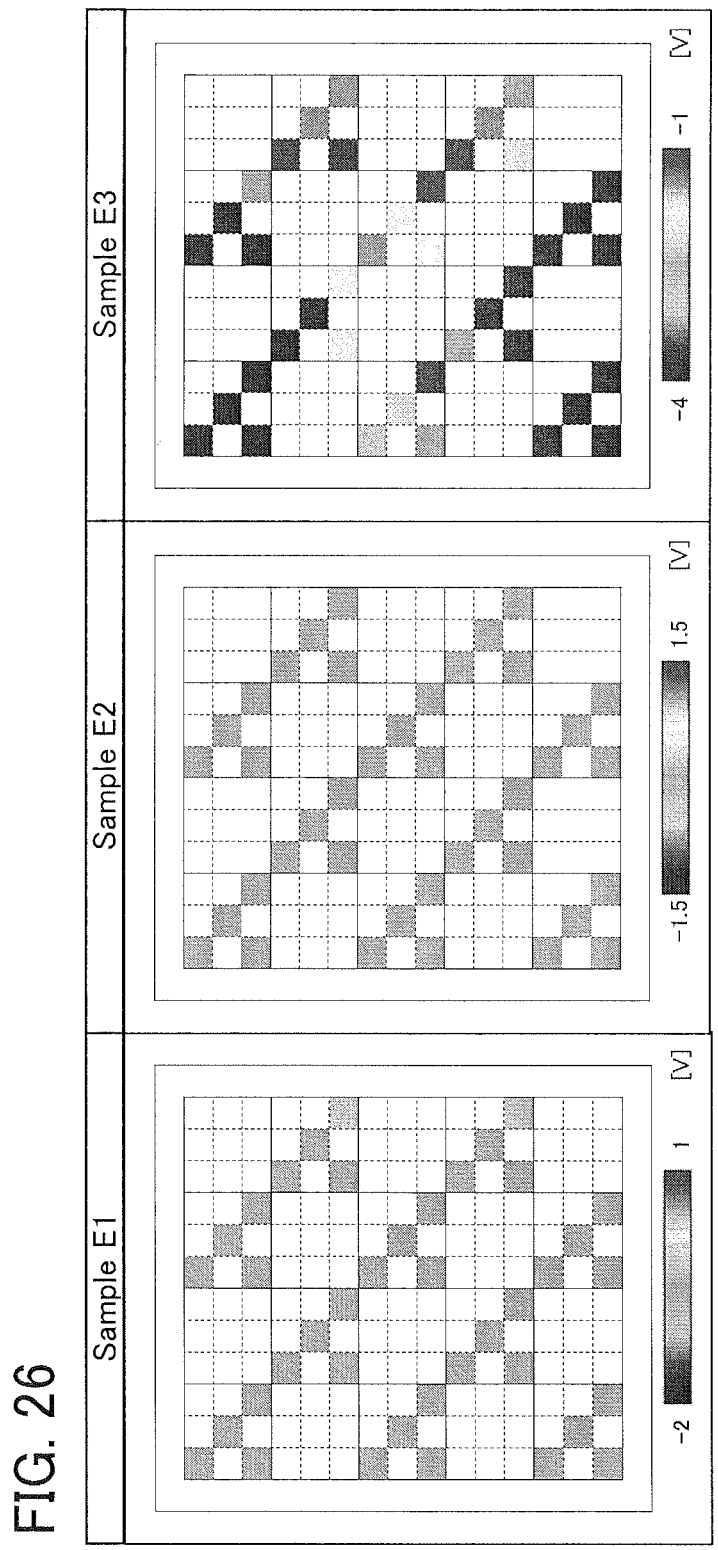
FIG. 26 shows variations in the shift values of transistors over a substrate.

Next, FIG. 26 shows distribution of the shift values of transistors over the substrate in Samples E1 to E3. FIG. 26 shows measurement results of Sample E1, Sample E2, and Sample E3, and shows the shift values of the transistors over the substrate in blocks. Note that in each sample, a substrate with a size of 720 mm long and 600 mm wide was used. In each sample, L/W of the transistor was 2 μm/50 μm.

In each sample, distribution of the shift values in a range of 3 V is shown by a color bar. The average of the shift values in the range is in the middle of the color bar. As the contrast of color is higher, the shift value is more deviated from the average.

A variation in shift values of sample E1 is smaller than a variation of sample E2. Furthermore, the shift values of sample E1 are closer to zero than the shift values of sample E3. Thus, in Sample E1, a variation in shift values over the substrate is small and the shift values are close to zero.

<Gate BT Stress Test>

Then, a gate BT stress test was performed on the transistors included in Samples E1 to E3.

A measurement method of the gate BT stress test is described. First, initial $V_g$-$I_d$ characteristics of the transistor were measured as described above.

Next, the substrate temperature was kept constant at a given temperature (hereinafter referred to as stress temperature), the pair of electrodes serving as a source electrode and a drain electrode of the transistor was set at the same potential, and the gate electrode was supplied with a potential different from that of the pair of electrodes for a certain period of time (hereinafter referred to as stress time). Next, the substrate temperature was set as appropriate, and the electrical characteristics of the transistor were measured. A difference in threshold voltage and a difference in shift value between before and after the gate BT stress test can be obtained as the amount of change in the electrical characteristics.

Note that a stress test where a negative voltage is applied to a gate electrode in a dark state is called a negative gate BT stress test (Negative GBT stress (Dark)), and a stress test where a positive voltage is applied to a gate electrode in a dark state is called a positive gate BT stress test (Positive GBT stress (Dark)). A stress test where a negative voltage is applied to a gate electrode while light irradiation is performed is called a negative gate BT photostress test (Negative GBT stress (Light irradiation)), and a stress test where a positive voltage is applied while light irradiation is performed is called a positive gate BT photostress test (Positive GBT stress (Light irradiation)).

Here, the gate BT stress conditions were as follows: stress temperature was 60° C., stress time was 3600 seconds, -30 V or +30 V was applied to the gate electrode, and 0 V was applied to the pair of electrodes serving as the source electrode and the drain electrode. The electric field intensity applied to the gate insulating film was 0.66 MV/cm.

Under the same conditions as those of the above gate BT stress test, the gate BT photostress test was performed where the transistor was irradiated with white light with 10000 lux using an LED.

Note that the $V_g$-$I_d$ characteristics of the transistor were measured at a temperature of 60° C. after each of the BT stress tests.

Figure 27:
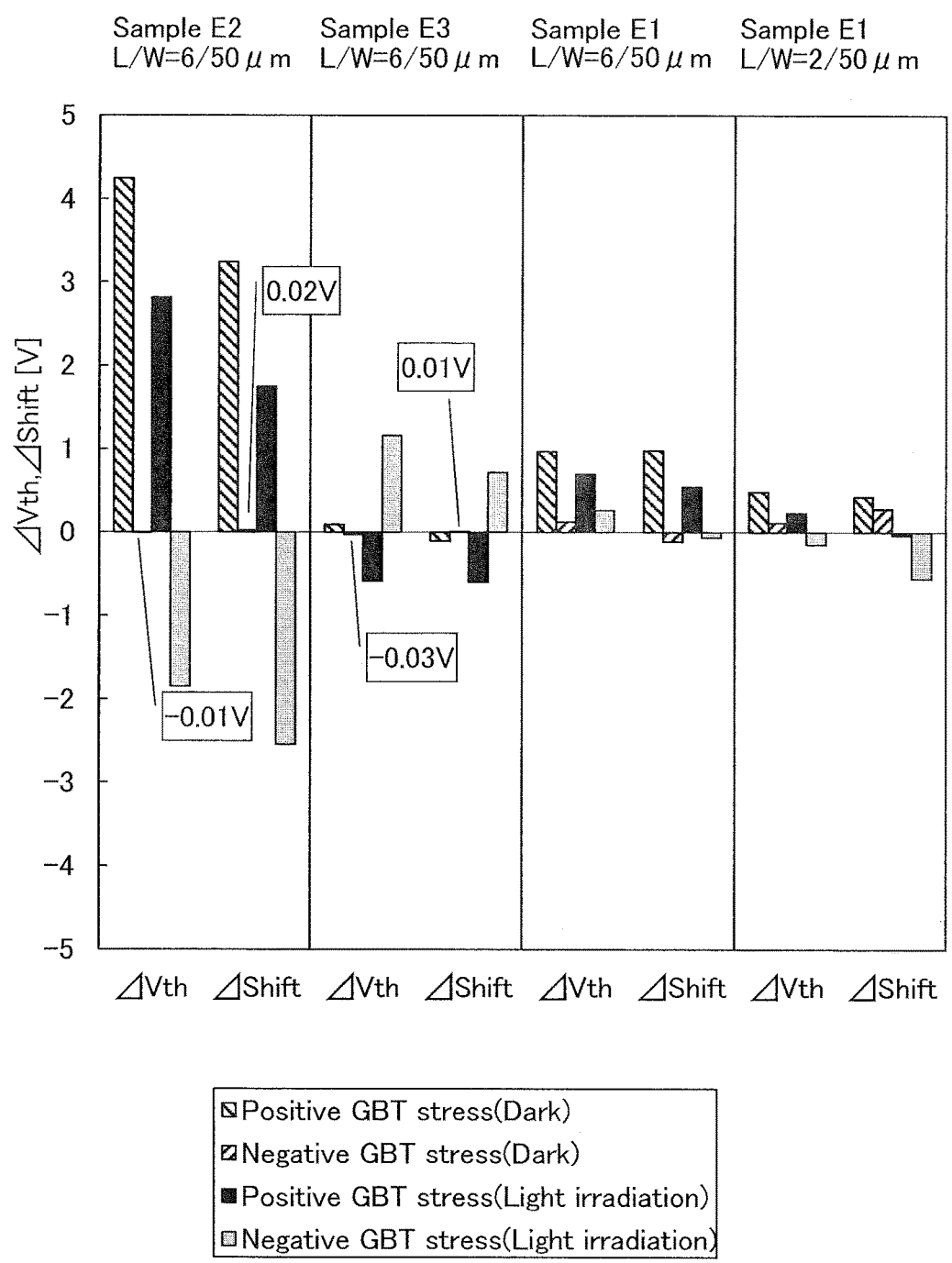
FIG. 27 shows the amount of change in the threshold voltages and the amount of change in the shift values of transistors after a gate BT stress test.

FIG. 27 shows a difference between threshold voltage in the initial characteristics and threshold voltage after the gate BT stress test (i.e., the amount of change in threshold voltage ($\Delta V_{th}$)) and a difference in shift value (i.e., the amount of change in the shift value ($\Delta$Shift)) of respective transistors included in Samples E1 to E3. Note that in Sample E1, $\Delta V_{th}$ and $\Delta$Shift of a transistor with L/W=6 µm/50 µm and a transistor with L/W=2 µm/50 µm were measured. In each of Samples E2 and E3, $\Delta V_{th}$ and $\Delta$Shift a transistor with L/W=6 µm/50 µm were measured.

Unlike in the cases of Samples E2 and E3, the amounts of change in threshold voltage and the amounts of change in shift value in Sample E1 subjected to the gate BT stress test with light irradiation and Sample E1 subjected to the gate BT stress test without light irradiation were each within 1 V.

Figure 28A:
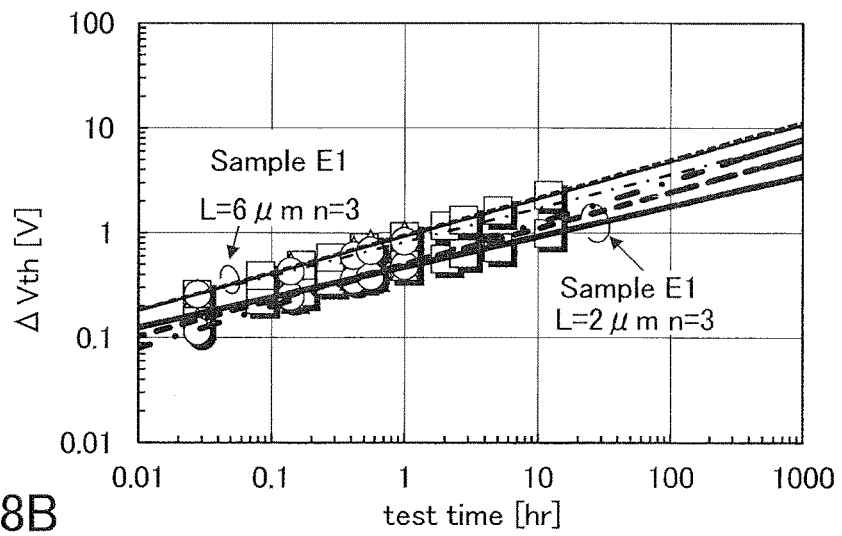
FIGS. 28A to 28C each show a test time of a positive gate BT stress test and the amount of change in the threshold voltages of transistors.
Figure 28B:
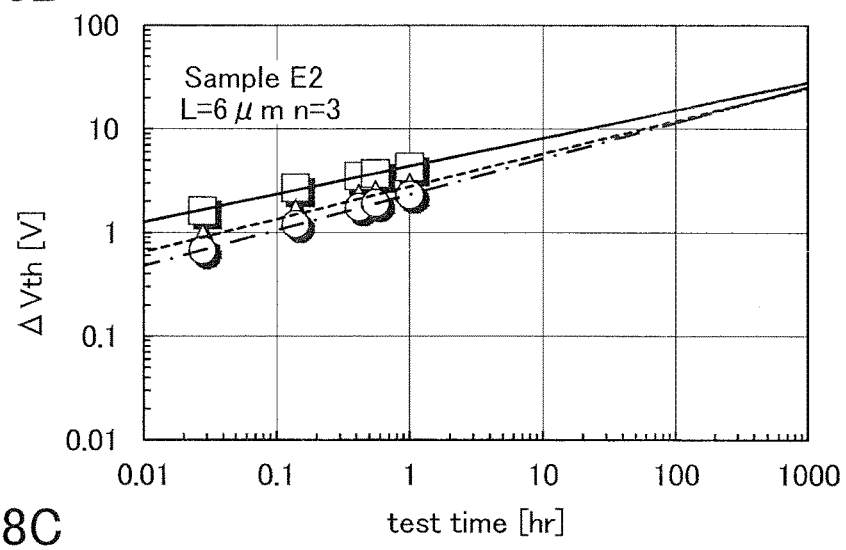
Figure 28C:
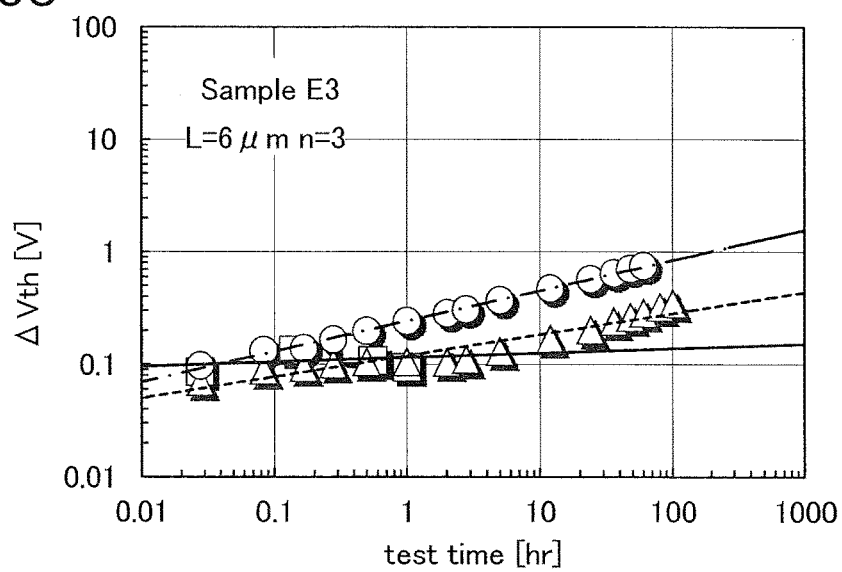

Next, in the positive gate BT stress test in a dark state, the amount of change in the threshold voltage with respect to stress time was measured. The measurement results are shown in FIGS. 28A to 28C. FIGS. 28A to 28C show the amounts of change in the threshold voltages of the transistors included in Samples E1 to E3, and approximate curves obtained from the amounts of change. Note that the horizontal axis indicates stress time and the vertical axis indicates the amount of change in threshold voltage ($\Delta V_{th}$). FIG. 28A shows the measurement results of Sample E1. In Sample E1, the amounts of change in the threshold voltages of a transistor with L/W=2 µm/50 µm and a transistor with L/W=6 µm/50 µm were measured. FIGS. 28B and 28C show measurement results of Sample E2 and Sample E3, respectively. In Samples E2 and E3, the amounts of change in the threshold voltages of transistors with L/W=6 µm/50 µm were measured. Note that in each measurement, the number of measurements (n) was three. Furthermore, each line is a power approximate line obtained from measurement data of Samples E1 to E3.

<Repeated ±Gate BT Stress Test>

Next, gate BT stress test was repeatedly performed on Samples E1 to E3 while a gate voltage was changed in a dark state.

Repeated ±gate BT stress test is described. First, the stress temperature of a sample is set at 60° C. and the $I_d$-$V_g$ characteristics of a transistor are measured. Subsequently, a positive gate BT stress test is performed. Here, +30 V is applied to a gate electrode for one hour. Then, the $I_d$-$V_g$ characteristics of the transistor are measured while the temperature is kept at 60° C. Next, a negative gate BT stress test is performed. Here, -30 V is applied to the gate electrode for one hour while the sample is kept at 60° C. Next, the $I_d$-$V_g$ characteristics of the transistor are measured while the temperature is kept at 60° C. Repeating the positive gate BT stress test and the negative gate BT stress test enables the change in threshold voltage to be measured.

Figure 29A:
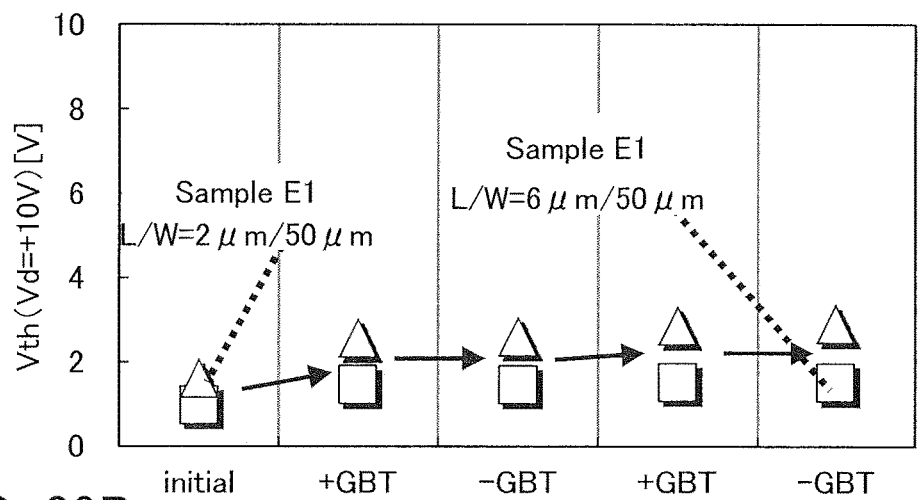
FIGS. 29A to 29C show the amount of change in the threshold voltages of transistors in repeated ±gateBT stress tests.
Figure 29B:
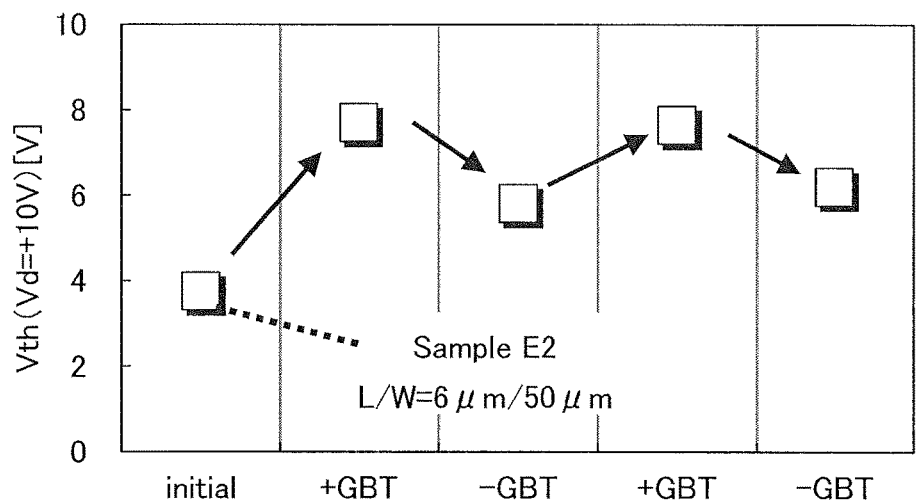
Figure 29C:
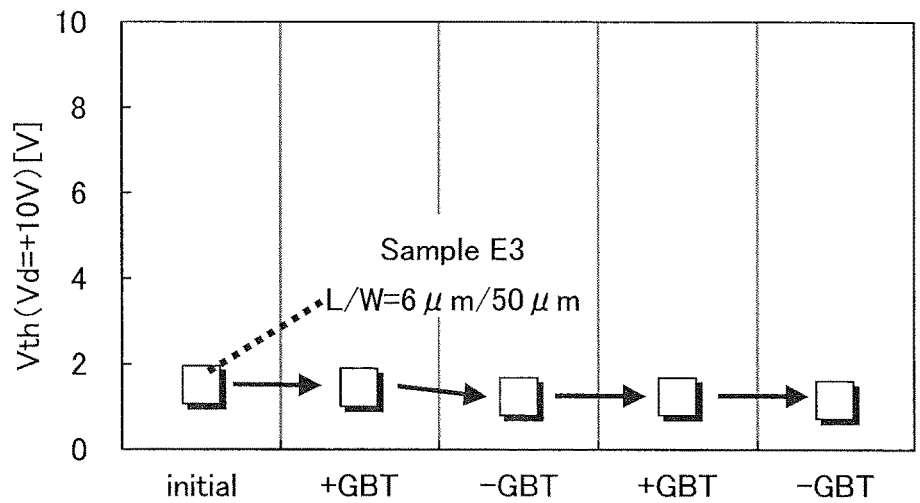

FIGS. 29A to 29C show the results of the repeated ±gate BT stress tests. The horizontal axis indicates stress tests and the vertical axis indicates the threshold voltage. FIGS. 29A, 29B, and 29C show measurement results of Sample E1, Sample E2, and Sample E3, respectively. In FIGS. 29A to 29C, squares indicate the measurement results of a transistor with L/W=6 µm/50 µm, and triangles indicate the measurement results of a transistor with L/W=2 µm/50 µm.

As shown in FIGS. 29A to 29C, the amount of change in threshold voltage is small and the threshold voltages are positive in each of Samples E1 and E3. FIGS. 29A to 29C indicate that the transistor included in each of Samples E1 and E3 has normally-off characteristics. Moreover, as shown in FIG. 29A, dependence of the amount of change in threshold voltage on the channel length is small in Sample E1.

Figure 30:
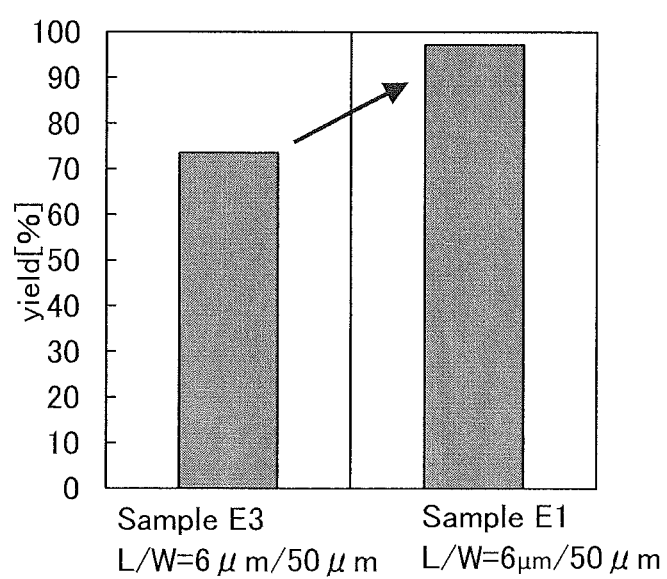
FIG. 30 shows yields of liquid crystal panels.

Next, a gate driver of a liquid crystal panel was fabricated using a transistor included in Sample E1 or Sample E3. Here, a plurality of liquid crystal panels were fabricated using a substrate having a size of 720 mm long and 600 mm wide. FIG. 30 shows the proportions of liquid crystal panels which operated normally (yields).

As shown in FIG. 30, using the transistor of Sample E1 increases the yield of liquid crystal panels.

The above results show that the transistor of one embodiment of the present invention is a highly reliable transistor with a small variation in threshold voltage. The above results also show that the transistor of one embodiment of the present invention is a highly reliable transistor with a small change in threshold voltage over time. The above results also show that the transistor of one embodiment of the present invention has normally-off characteristics. Therefore, a semiconductor device including the transistor of one embodiment of the present invention consumes low power. The above results also show that using the transistor of one embodiment of the present invention can increase the yield of semiconductor devices.

This application is based on Japanese Patent Application serial no. 2014-127430 filed with Japan Patent Office on Jun. 20, 2014 and Japanese Patent Application serial no. 2015-084409 filed with Japan Patent Office on Apr. 16, 2015, the entire contents of which are hereby incorporated by reference.

What is claimed is:

1. A method for manufacturing a semiconductor device comprising the steps of:
    forming a gate electrode;
    forming a first insulating film over the gate electrode;
    forming an oxide semiconductor film over the first insulating film;
    forming a second insulating film over the oxide semiconductor film; and
    adding oxygen into the second insulating film,
    wherein at least one of the first insulating film and the second insulating film has an etching rate of higher than 8 nm/min when etching is performed using a hydrofluoric acid.

2. The method for manufacturing a semiconductor device according to claim 1, further comprising the step of:
    adding oxygen into the first insulating film.

3. The method for manufacturing a semiconductor device according to claim 1, further comprising the steps of:
    forming a conductive film over the second insulating film; and
    adding oxygen into the second insulating film through the conductive film.

4. The method for manufacturing a semiconductor device according to claim 1, further comprising the step of:
    forming a metal oxide film over the first insulating film.

5. The method for manufacturing a semiconductor device according to claim 1, further comprising the step of:
    forming a metal oxide film over the second insulating film.

6. The method for manufacturing a semiconductor device according to claim 1, the oxygen is added by an ion implantation method.

7. The method for manufacturing a semiconductor device according to claim 1, wherein both of the first insulating film and the second insulating film has an etching rate of higher than 8 nm/min when etching is performed using the hydrofluoric acid.

8. The method for manufacturing a semiconductor device according to claim 1, wherein the at least one of the first insulating film and the second insulating film has an etching rate of higher than 10 nm/min when etching is performed using the hydrofluoric acid.

9. A method for manufacturing a semiconductor device comprising the steps of:
    forming a gate electrode;
    forming a first insulating film over the gate electrode;
    forming an oxide semiconductor film over the first insulating film;
    forming a second insulating film over the oxide semiconductor film; and
    adding oxygen into the second insulating film,
    wherein at least one of the first insulating film and the second insulating film has an etching rate of higher than 8 nm/min when the at least one of the first insulating film and the second insulating film is immersed in a 0.5 wt/vol % hydrofluoric acid at 24° C.

10. The method for manufacturing a semiconductor device according to claim 9, further comprising the step of:
    adding oxygen into the first insulating film.

11. The method for manufacturing a semiconductor device according to claim 9, further comprising the steps of:
    forming a conductive film over the second insulating film; and
    adding oxygen into the second insulating film through the conductive film.

12. The method for manufacturing a semiconductor device according to claim 9, further comprising the step of:
    forming a metal oxide film over the first insulating film.

13. The method for manufacturing a semiconductor device according to claim 9, further comprising the step of:
    forming a metal oxide film over the second insulating film.

14. The method for manufacturing a semiconductor device according to claim 9, the oxygen is added by an ion implantation method.

15. The method for manufacturing a semiconductor device according to claim 9, wherein both of the first insulating film and the second insulating film has an etching rate of higher than 8 nm/min when both of the first insulating film and the second insulating film are immersed in the 0.5 wt/vol % hydrofluoric acid at 24° C.

16. The method for manufacturing a semiconductor device according to claim 9, wherein the at least one of the first insulating film and the second insulating film has an etching rate of higher than 10 nm/min when the at least one of the first insulating film and the second insulating film is immersed in the 0.5 wt/vol % hydrofluoric acid at 24° C.

* * * * *